(12) United States Patent
Ward et al.

(10) Patent No.: US 12,253,715 B2
(45) Date of Patent: Mar. 18, 2025

(54) MEMS-DRIVEN OPTICAL PACKAGE WITH MICRO-LED ARRAY

(71) Applicant: Matthew E. Ward, Philadelphia, PA (US)

(72) Inventors: Matthew E. Ward, Philadelphia, PA (US); Jeremy Hochman, Walnut, CA (US)

(*) Notice: Subject to any disclaimer, the term of this patent is extended or adjusted under 35 U.S.C. 154(b) by 0 days.

(21) Appl. No.: 17/002,295

(22) Filed: Aug. 25, 2020

(65) Prior Publication Data

US 2021/0033790 A1 Feb. 4, 2021
US 2024/0061171 A9 Feb. 22, 2024

Related U.S. Application Data

(63) Continuation-in-part of application No. 16/451,099, filed on Jun. 25, 2019, now Pat. No. 10,754,092, (Continued)

(51) Int. Cl.
*B81B 7/04* (2006.01)
*B81B 3/00* (2006.01)
(Continued)

(52) U.S. Cl.
CPC ........ *G02B 6/12007* (2013.01); *B81B 3/0083* (2013.01); *H01L 27/156* (2013.01);
(Continued)

(58) Field of Classification Search
CPC ...... G02B 6/12007; G02B 2006/12102; G02B 2006/12109; G02B 2006/12164; G02B 30/10; G02B 30/28; G02B 19/0061; G02B 26/08; G02B 2027/0109; G02B 2027/0174; G02B 3/0006; G02B 7/02; G02B 26/12; B81B 3/0083; B81B 2203/0136; H01L 27/156; H01L 25/167; H01L 25/0753;
(Continued)

(56) References Cited

U.S. PATENT DOCUMENTS

| 4,575,207 A | 3/1986 | August |
| 4,671,632 A | 6/1987 | August |

(Continued)

FOREIGN PATENT DOCUMENTS

| JP | 2003248461 A | 9/2003 |
| JP | 2015521298 A | 7/2015 |

(Continued)

OTHER PUBLICATIONS

International Preliminary Report on Patentability Issued Sep. 16, 2021 and Written Opninon dated Feb. 27, 2020 issued in the International Patent Application No. PCT/US2019/037598, 7 pages.

(Continued)

*Primary Examiner* — Balram T Parbadia
(74) *Attorney, Agent, or Firm* — Schott, P.C.

(57) ABSTRACT

An optical light package includes an optical output lens, an optical filter located thereunder and between the output lens and LEDS, a tray of LEDs arrayed on a stage mounted on a linear comb based MEMS device that is distributed in such a way that the stage is movable, and a driver that controls movement of the stage.

14 Claims, 49 Drawing Sheets

Related U.S. Application Data which is a continuation-in-part of application No. PCT/US2019/037598, filed on Jun. 18, 2019.

(60) Provisional application No. 62/938,980, filed on Nov. 22, 2019, provisional application No. 62/821,256, filed on Mar. 20, 2019.

(51) Int. Cl.
*G02B 6/12* (2006.01)
*H01L 27/15* (2006.01)

(52) U.S. Cl.
CPC ............... *B81B 2203/0136* (2013.01); *G02B 2006/12102* (2013.01); *G02B 2006/12109* (2013.01); *G02B 2006/12164* (2013.01)

(58) Field of Classification Search
CPC .......... H01L 33/58; G09G 3/003; G09G 3/32; F21V 19/02; F21V 14/02; F21V 21/30; F21V 14/025; F21W 2131/406; F21Y 2115/10; F21Y 2113/00; F21Y 2107/70; G01J 1/04; G01J 1/0242; G01J 1/0403; G01J 1/0411; G01J 2005/106; G03B 35/00; G09F 19/18; G03H 1/0011; G03H 1/20; G03H 2001/226; G03H 2210/30; H05B 33/0803
See application file for complete search history.

(56) References Cited

U.S. PATENT DOCUMENTS

| | | | |
|---|---|---|---|
| 5,752,766 A | 5/1998 | Bailey | |
| 6,357,893 B1 | 3/2002 | Belliveau | |
| 7,978,407 B1 | 7/2011 | Connor | |
| 8,256,824 B2 | 9/2012 | Simon | |
| 8,449,148 B2 | 5/2013 | Ikeda | |
| 8,553,342 B2 | 10/2013 | Lee | |
| 8,648,888 B2 | 2/2014 | Natori et al. | |
| 8,854,724 B2 | 10/2014 | El-Ghoroury | |
| 9,013,711 B2 | 4/2015 | Keshavmurthy et al. | |
| 9,405,124 B2 | 8/2016 | Hirsch et al. | |
| 9,955,144 B2 | 4/2018 | Brown | |
| 10,326,983 B2 | 6/2019 | Hua | |
| 10,416,456 B2 | 9/2019 | Bouchier | |
| 10,437,012 B1* | 10/2019 | Gurin | G02B 13/001 |
| 2002/0008868 A1 | 1/2002 | Kubota | |
| 2002/0136010 A1 | 9/2002 | Luk | |
| 2002/0142504 A1 | 10/2002 | Feldman et al. | |
| 2004/0080807 A1 | 4/2004 | Chen et al. | |
| 2004/0252281 A1* | 12/2004 | Fischer | G03B 21/208 |
| | | | 353/53 |
| 2005/0265024 A1 | 12/2005 | Luk | |
| 2006/0227085 A1 | 10/2006 | Boldt et al. | |
| 2007/0058034 A1 | 3/2007 | Numazaki | |
| 2008/0049315 A1 | 2/2008 | Morikuni | |
| 2008/0192231 A1 | 8/2008 | Jureller | |
| 2008/0239419 A1 | 10/2008 | Tachibana | |
| 2009/0027566 A1 | 1/2009 | Wargon | |
| 2009/0033604 A1 | 2/2009 | Silzars | |
| 2010/0290099 A1 | 11/2010 | Padiyar et al. | |
| 2012/0162996 A1 | 6/2012 | Ikeda | |
| 2013/0063496 A1 | 3/2013 | Basier et al. | |
| 2013/0207964 A1 | 8/2013 | Fleck et al. | |
| 2013/0285885 A1 | 10/2013 | Nowatzyk | |
| 2014/0267896 A1 | 9/2014 | Cox et al. | |
| 2015/0276490 A1 | 10/2015 | Shikii | |
| 2016/0077338 A1 | 3/2016 | Robbins et al. | |
| 2016/0295178 A1 | 10/2016 | Damberg et al. | |
| 2017/0082263 A1 | 3/2017 | Bymes et al. | |
| 2019/0361222 A1* | 11/2019 | Gurin | B60R 1/00 |
| 2021/0240020 A1* | 8/2021 | Chang | G02F 1/133603 |

FOREIGN PATENT DOCUMENTS

| | | |
|---|---|---|
| JP | 2017515162 A | 6/2017 |
| JP | 2018528452 A | 9/2018 |
| JP | 2018213101 A | 11/2018 |

OTHER PUBLICATIONS

International Preliminary Report on Patentability dated May 17, 2022 and Written Opinion of the International Searching Authority dated Mar. 26, 2021 within the International Application No. PCT/US2020/058880, 7 pages.

International Search Report issued by the Patent Corporation Treaty in the International Patent Application No. PCT/US2020/058880 dated Mar. 26, 2021, 2 pages.

Nakajima, A. et al., "CMOS image sensor integrated w Micro-LED & multielectrode arrays for the patterned photo simulation and multichannel recording of neuronal tissue", Optics Express, vol. 20, No. 6, pp. 6097-6108.

"Translation of Reason for Refusal" issued in the corresponding Japanese Patent Application No. 2021-556920, mailed on Feb. 28, 2023, 8 pages.

* cited by examiner

MEMS-DRIVEN OPTICAL PACKAGE WITH MICRO-LED ARRAY

BACKGROUND

Any current vision of the future of immersive experience revolves around ambient imagery, ephemeral indicators, on-demand content built on a technology stack that includes a light-field-based system of pixels. For a menu to float off a wall or a billboard to float off the side of a building, the imagery must accommodate viewers from different angles. To make a holodeck or deliver on some other architecture of light, the user must have a display system that delivers content perceived as 3D and that provides real parallax, vergence, and accommodation to viewers across a range of different positions relative to the display. The system must do this regardless of whether that viewer wears glasses. The system must do this from any arbitrary point in the room without barrel rotation, a fault that causes each viewer to perceive an object in a slightly different location because of limits within legacy 3D systems.

There is no current screen that effectively manages light field display across an arbitrary surface in a way that is commercially scalable and that delivers effective extinction or ghosting of other viewing angles.

LCD derivatives used for small displays and displays are currently in the market and they use parallax barrier systems to deliver multiple angles of light with projected or direct view sources.

The Philips® 3D LCD system handles this by dicing the screen area up with a lenticular lens that divided the surface of the LCD into a defined number of slices so that a viewer could see a 3D image from a specific set of points of view but there was little opportunity for a shared experience without eye tracking and the experience will always be limited by the need to slice up the image area in vertical slices.

The Leia® display shares some characteristics with the display that Nintendo® delivered in the Nintendo 3DS®. The displays are optimized around a single user with a display right and left eye.

There are a variety of large modules being considered and there are complicated parallax barrier systems that treat existing displays in a manner that is not dissimilar to the Philips 3D system.

These monolithic systems will all have trouble scaling into room scale immersive environments. These systems also often have bezels that will figure in any final product marring the finished displays with seams that must be managed or tolerated. They are targeted at individual viewers and the market for smartphones is massive so this makes sense commercially.

But that means that none of these systems lends itself to use in large public display applications where a flexible modular approach will be required to jump start applications and to take advantage of existing mechanical systems.

One solution is to model the components on LED systems that have adopted the PLCC SMD package to allow for a wide variety of products. But there is an issue with using a large array of LEDs where the viewer is only intended to view a specific set of sub-pixels at a given time based on their location relative to the screen.

First, the relative surface area of each sub-pixel relative to the complete component would yield a very small active area. The light emitting elements in a 2 mm pixel pitch screen in the current LED market may be less than a few percentage points of the total surface area of a pixel. In a light field display packing hundreds of pixels into the same space the output power of that pixel required to maintain perceived screen brightness would jump substantially, and in some ways, unhelpfully.

Second, a mask is required to control the light output so that each viewer only sees the light field sub-pixel intended for them. This mask would create pixels with substantial off axis viewing issues and would likely create visual artifacts due to the incomplete extinction of neighboring light field sub-pixels.

Third, the duty cycle for each light field sub-pixel is small relative to the overall number of LED packages It would be possible to use multiplexing to use ⅓ the LED dies simplifying layout and reducing cost. It is also possible to use ⅕ or ⅛ the LED material depending on the goals of the system.

There are more problems, but the number of dies and the extinction issue are key. If a user cannot see just the image intended for them but also sees ghosting from the images intended for other people (the extinction ratio) then the technology will not succeed.

ADDITIONAL BACKGROUND

Current systems to create light field displays rely on LCD and OLED due to the high pixel density. Any emissive display with high pixel density lends itself to spatial multiplexing. You just need enough pixels that you can throw many away and still have appropriate resolution for any one individual view. The math here is not different from that used in stereoscopic displays fabricated with a lenticular lens where a single 1920×1080 display might be carved up into nine discrete views of "3D" content. Spatial multiplexing can be handled with parallax barriers or with optics. You are either blocking the light or bending the light. In either situation a ray of light emitted by the display is directed to a single viewing position and at the same time, and most critically, that beam of light is not visible from other positions. This is the essence of a light field display. That in order to display a digital representation of a three dimensional volume that the representation of the objects in the digital space must stay fixed in the volume as viewed from an area around the volume. This is represented in movies like Avatar where people stand around a table looking at a volumetric space. Each person sees the same thing digital experience in the same spot unless their view is occluded. The fixing of digital objects in a real space for augmented reality is handled very effectively by the Microsoft Hololens.

But there is a problem with barrier and optic based spatial multiplexing systems and that is that they are inefficient. In a standard LED screen a single LED die that is part of a display may be on for 12.5% of the time or 6.25% of the time or substantially less of the time. And the low duty cycle (% of time the LED is on) of the LED is used to manage heat and the reduce the cost of drivers. LED displays are based on time multiplexing at the driver because this is cost effective. You don't need the LED's on 100% of the time to hit reasonable brightness levels. So an LED display using an optic to create spatial multiplexing is building that on top of a display that typically uses time multiplexing. So you have an area that could be packed with LEDs where a viewer only sees less than 0.02% of the surface illuminated at any given time. But in a light field display where the pixel groups are 15 pixels wide×15 pixels tall or 25 pixels wide×25 pixels tall then the percentage could be much lower than that and the contrast and performance of the display will suffer.

Multiplexing is well understood in the display world and a well-known cause of problems. The orderly scanning of an electron beam over a CRT caused flickering until someone discovered a way of randomizing the scan in what became the Sony Trinitron. Active matrix LCD and OLED displays primarily use a column and row scanning architecture, a form of multiplexing that depends on column and row drivers. And this is fine because a single viewer sees the whole display and the scanning order is such that the viewer cannot see the scanning. The image area and the display area are the same.

Driver electronics in OLED and LCD are now moving into the pixel. This allows for better control of the display at very minimal cost but this alone does not solve the issue of optimizing the visible display area to both tightly pair the visible display area with the imaging components. OLED displays are getting to a point where the pixel size is competitive with MicroLED. A smart phone pixel could easily be in the 20-30 micron range. So small OLED modules could also be used to create light field displays with sufficient pixel density. But the light output is only just getting to an acceptable point and the duty cycle to achieve that light output is probably unacceptably high.

SUMMARY OF THE EMBODIMENTS

The proposed solution may use a number of LEDs (or what may be called light emitting elements LEEs, not limited to OLEDs or diodes) that is ⅓ to ¼ of the total light field sub-pixel space and effectively manage the output of the LEDs such that each light field sub-pixel is only visible from a desired angle by moving a platform upon which the LEDs are mounted, and movement of the platform in this way uses a system/method called optical multiplexing herein.

Optical multiplexing uses a smaller amount of LEDs but also controls the distribution of light in a manner driven through processing based on the content. Such a system could increase the refresh rate of movement in a scene or increase the color space where there is low color contrast and it would be possible to extend color possibilities by using additional LEDs at different wavelengths.

A large light field system could be used on camera in a movie production to show dimensional computer graphics elements to an actor while the actor is filmed against a green screen background. In fact, the image could be created so that only cameras see the green screen through camera tracking and integration with the media server.

And smaller versions of the technology could find their ways into indicators in houses and elevators and automobiles. In fact, indication from automobiles will clearly become much more critical as autonomous vehicles start to take the roads.

MEMS System for Microarrays

A MEMs system for micro arrays describes a system that acts more like a projection system in many ways and this is consistent with development in multi view projection systems that have been demonstrated by companies such as NHK and others. These arrays of projectors may sit behind a surface that would maintain the beam angle of the projector output so that a person in a specific position would see the output of multiple projectors creating their own 3D view of a scene. A person standing just to one side of this person might see the same projectors but they would be looking at a different selection of pixels. But this solution is limited by the very nature of projection surfaces. To light the surface for many people, you would need more and more projectors and every additional projector on the screen surface further elevates the black level because projectors do not currently make a pure black.

This can be corrected in theory if you just point a lot of projectors at people and this is to some degree what we are proposing but rather than using a direct laser scanning system, DLP, LCD, or LCOS projection system we are using a scanning microLED projection system. The system incorporates elements of a number of technologies to solve problems related to light field displays in large scale applications for the entertainment industry and in outdoor advertising.

Simply pointing projectors at people does not scale in many environments. If it is a theater then you are simply moving the elevated black level from the screen surface into the theater, where the ambient light level might reach that of a big box retail store without much effort. So what is required is a small efficient module that acts like a projector optically but is visually more like the high end LED and OLED screens we have now with well-defined pixels. And the best way to do that is to make an array of small components that incorporate a few hundred LED dies on a MEMs structure that scans the dies across the optical system.

DETAILED DESCRIPTION OF THE EMBODIMENTS

Hardware Considerations

Figure 1:
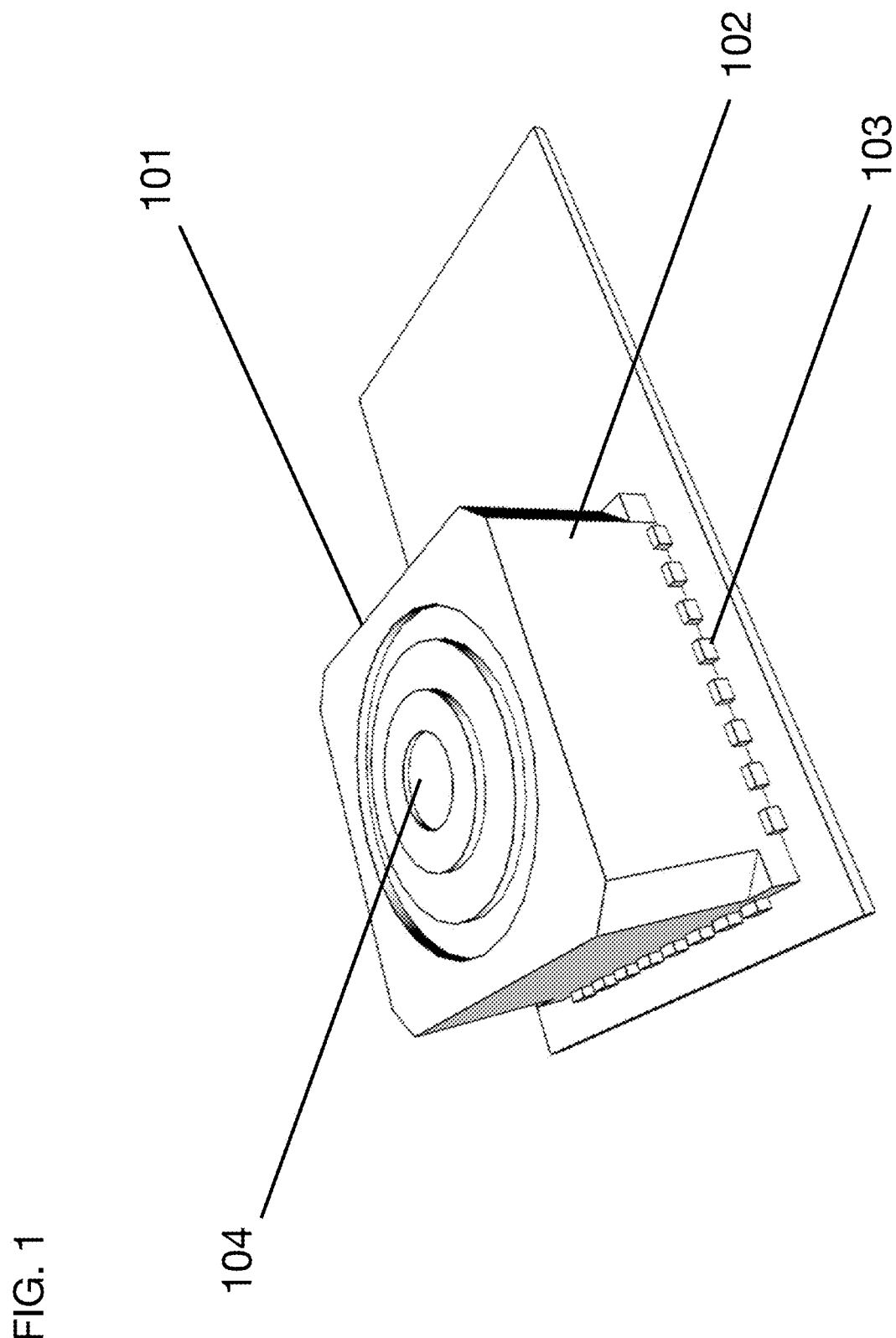
FIG. 1 shows a smartphone camera module.

Displays include packages comprising pixels that are made up of LEDs, as presented herein. The proposed application discussed herein uses a moving array/table/stage of alternately activatable LEDs, with each LED visible to different viewers, to create 3D images using a method called optical multiplexing.

The modular nature of the package component provides a precise image generation tool that can be used to provide a range of features and functionality from the consumption of entertainment to the creation of content in virtual sets to the physical world where the system can communicate to a pedestrian what an autonomous vehicle is about to do in a manner that is both clear and not invasive.

The modular nature of the system allows for the creation of these varied applications across a range of forms while integrating with existing surface mount production and PCB topologies.

A driver system may drive the video in a typical manner for an array of light emitting diodes while at the same time controlling the movement of the Micro-Electromechanical Systems (MEMS) system so that the position of the MEMS stage and the pattern of LED dies and the illumination of the light field LEDs is synchronized with the output of the video content. This can be thought of as a pattern move-blink-move-blink-move-blink-repeat.

The driver system may also require calibration to adjust for tolerances in the MEMS devices and the placement of the LED dies. This may be accomplished in a number of ways including placing one or more IR LEDs on the MEMS stage that can be used to position the stage relative to a zero point for the purposes of calibrating and aligning the system. This IR emitter could be read by a sensor located in a position that is referenced to the optical system. In this way, the differences in location between the IR LED and the array of microLEDs can be established and used in driving the system.

The transfer of the LED dies onto a substrate that may be placed on the MEMS stage may be a step in the manufacturing process worth considering in separate disclosures: The LED placement may require precision such that variations between light field pixel assemblies fall within reasonable tolerances.

Some driver silicon may also be placed on the MEMs stage to minimize the number of connections between the MEMs stage the driving system.

The MEMS section itself may be a comb drive, a magnetic or thermal actuator, a piezoelectric or another system. The choice of systems will be driven by the scale of the device and required speed and accuracy on the display application side as well as durability on the device side. A CMOS compatible system may allow for the integration of the MEMS, the MEMS stage, the substrate, and signal layout of the display system into a single component.

The microLED section of the display can be constructed in a number of ways. One way would include the structuring of the driver electronics in the MEMS platform itself. This could involve patterning a passive matrix backplane directly onto the MEMS stage as part of a CMOS fabrication process. This could allow for a TFT backplane where the gate and column drivers are placed directly on the microLED substrate.

Additionally there are a variety of options for production the display components including but not limited to microLED. OLED or other displays could be used. The display could be a very small micro-display driven by an active backlight.

For microLED the dominant approaches are the traditional red, green, blue approach and a color conversion approach using phosphor, quantum dots, or some other conversion material.

The MEMs stage may move back and forth in a linear fashion but it is quite possible that the scanning of the MEMs may not happen in the same way from light field pixel to light field pixel.

Pixel one may scan LEDS in a pattern of C,A,D,B,F,C, A,D,B,F,C,A,D,B . . . .

Pixel two may scan LEDS in a pattern of D,B,F,C,A,D, B,F,C,A,D,B,F,C . . . .

Pixel three may scan LEDS in a pattern of A,D,B,F,C,A, D,B,F,C,A,D,B,F . . . .

Varying the scan order may reduce the noise and cross talk between light field pixels. This could be accomplished through a pseudo-random patterning of the system that assures that the scan orders are distributed in a non-ordered way throughout the screen. It may also be necessary to varying the illumination of the LEDs within the scan order to eliminate perceptible scan order when a lower frequency of scan is employed.

The lens stack can also be used to tune the focus of the light source. An optical element directly above the light source that is tensioned in place by a spring much like the optics in a camera module. When required an actuator can move the optical layer relative to the light source defocusing the pixel momentarily. This may allow directors to introduce some more filmic elements into a Light field-based display. This lens stack could be either a traditional lens, a liquid crystal or other variable lens structure.

One possible implementation of the optical chain may display the content reversed and that the image is flipped in the optics of the display. This approach may help with reducing crosstalk.

A complete system may include an array of optical multiplexing packages (OMPs) mounted on a substrate that can be flexible or rigid. The substrate is attached to a physical surface and connected either to a preceding LF module or to a board that functions as a hub in the system taking a subset of the overall data and distributing it to a set of LF modules.

The need for real-time rendering means that there may be advantages to moving the rendering closer to the modules. A set of modules may incorporate one or several rendering devices capable of the real time rendering and display of millions of pixels. Such content would not be stored as a rendered file but would rather be rendered in real time by a game engine such as Unreal or Unity. While traditional camera capture could be part of such a system the files may be stored in such a way that the visual components of the scene are separated so that the model and the texture map and the illumination are all discrete real time elements in the signal chain and can be adjusted for the audience at that moment.

Elements of calibration both for the OMPs and specific environments may be necessary in a processing system designed to drive the displays. A system for local calibration including a stereo sensor system on the robotic arm may be necessary for certain environments.

Since the rendering is all real-time the data could be optimized completely for the single chair. In this way, the entire display can be driven dynamically delivering color, movement, gray scale, and other details in a manner more tuned to the process of human vision.

Component Background

FIG. 1, included here by way of introducing certain components that may be useful in context later, shows a camera module 101 in a modern smart phone, which includes a highly integrated component that may incorporate optics, MEMS actuators, and processing and driver circuitry. The system is accurate enough to track lens focus with 1 to 2 micron pixels. Externally the system includes a can 102 that contains the key components along with a means of attaching the components to a flexible printed circuit board (FPCB) 103 and the primary visible element of the system the optics 104.

Figure 2:
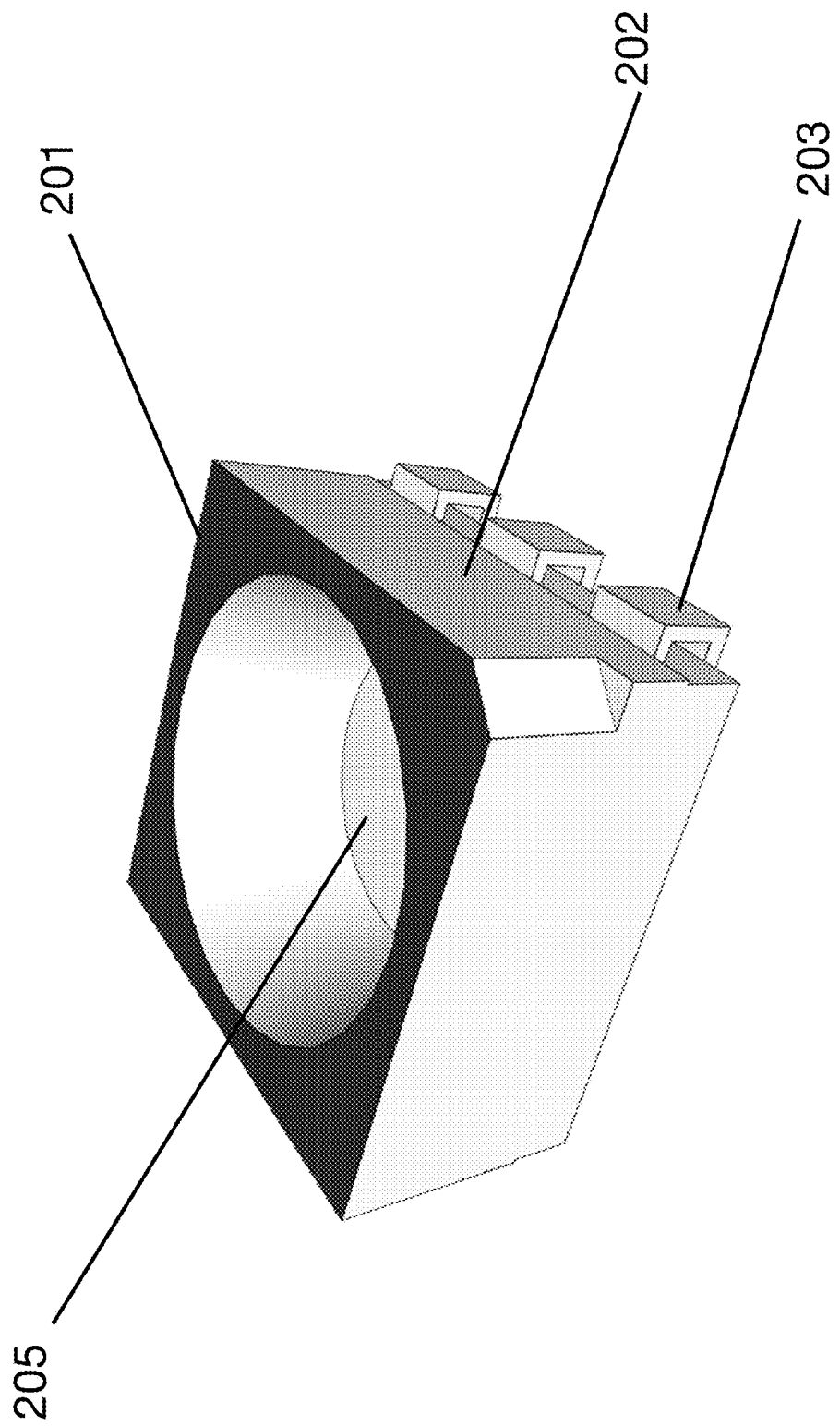
FIG. 2 shows a PLCC6 LED package.

FIG. 2 shows a PLCC6 LED package 201 that could be used by modern LED screens built around surface mount compatible packages. The package 201 features a housing 202 and points to attach to a PCB 203 and then a well 205 that houses the light emitting diodes (LED). The LED dies in the PLCC6 packages may be in the range of 200 to 500 microns. But new technology offers LEDs in the 30-50 micron range. These LEDs, which are the size of grains of pollen, open up the possibility of new designs and markets.

The PLCC package design 201 may be useful because screens may include varying board sizes in order to respond to different market needs and higher resolution screens need the LEDs packed more densely. Creative displays may need linear arrays of LEDs. This modular approach to building large screens of arbitrary dimensions is giving way to different designs using chip-on-board technology and/or incorporating microLED and miniLED. But the modular approach provides a lot of flexibility.

The reasons that the PLCC package is useful may also hold true for Light Field Displays. A large theater scale display could easily be composed of PLCC type packages featuring large arrays of LEDs defining 100s or even close to 1000 different views of a scene that are required in a light field display. And there is a tremendous amount of inefficiency in that layout including the crosstalk between adjacent light field LCDs that needs to be addressed.

For this reason we propose a hybrid solution that takes some elements of the camera module and grafts a microLED array into a MEMS driven optical package to create an Optical Multiplexing Package (OMP).

Description

Figure 3A:
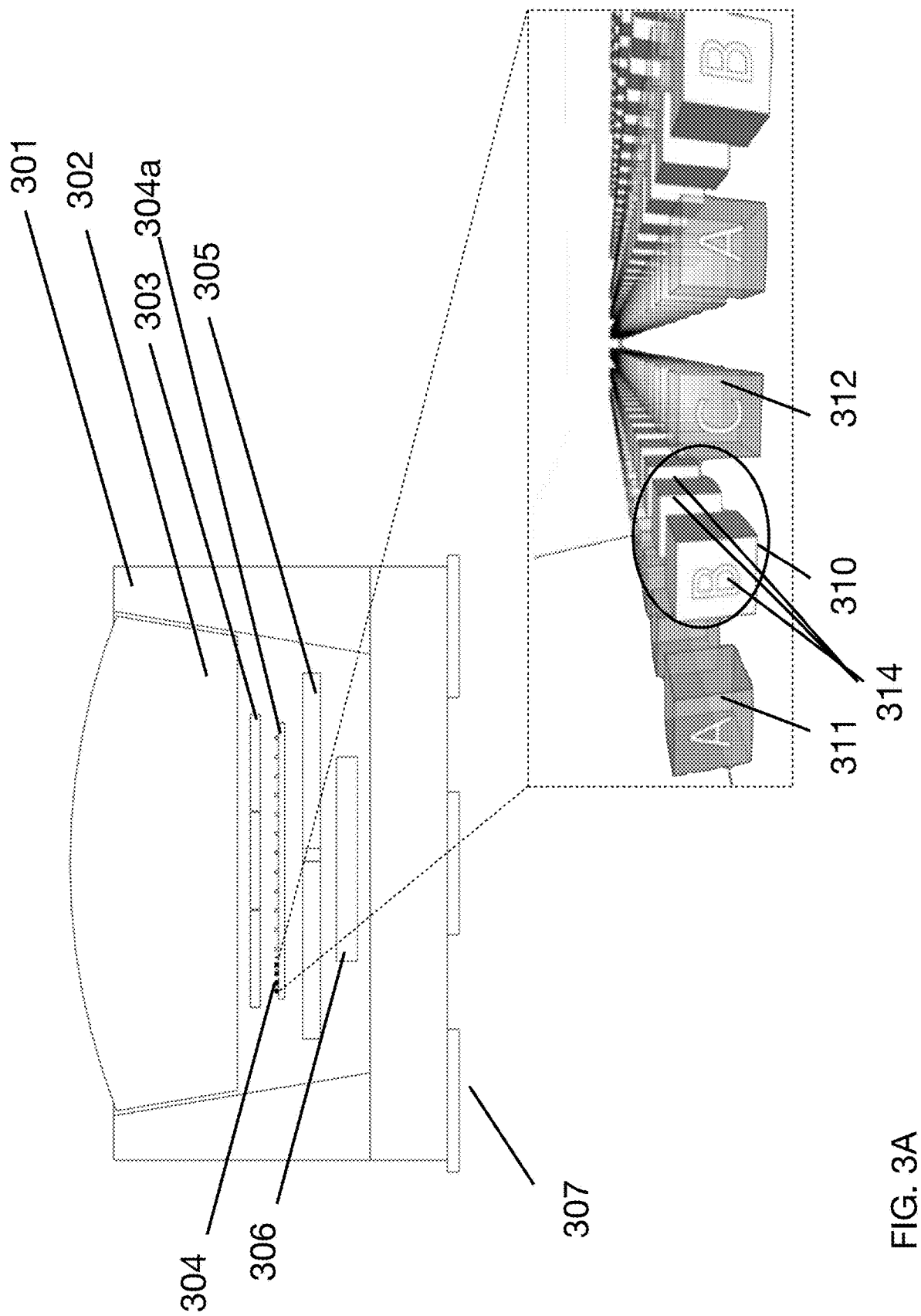
FIG. 3A shows a short travel light field package elevation view.

FIG. 3A shows an embodiment where the OMP 301 is a component that includes an optical output 302, optical filter 303, and an array of microLEDs 304 arrayed on a stage 304a mounted on a linear comb-based MEMS device 305 that is distributed in such a way that the stage 304a moves side to side and each corresponding single row of LEDs moves with the stage 304a in either direction such that from Column B 310, the system only needs to move under 60 microns in either direction (60 microns being one possible distance between each LED) to place Column A 311 and Column C 312 in the correct position for the optical system to output a different corresponding signal. It should also be appreciated that multiple of the LEDs (A, B, C) may comprise a pixel 314 thus combining to display different colors. This MEMS device 305 and stage 304a movement may be coordinated by a driver 306 built into the package 301.

The LED stage 304a may include the LED driver circuitry reducing the number of connections required from the primary driver to individual red, green, and blue LEDs. In theory the system could add white LEDs or additional LEDs that are not RGB to expand color spectrum by adding two more rows of travel to the MEMs stage.

The programming of the MEMs stage 304a could also control the duty cycle of each supplemental picture element such that white or cyan (as examples) could be used as needed leaving the primary drive to the RGB pixels.

The package 301 may integrate a driver 306 to control the movement of the stage 304a and any active optical elements in addition to maintaining a clock across the system and between the stage and the illumination of the LEDs 304.

Figure 3B:
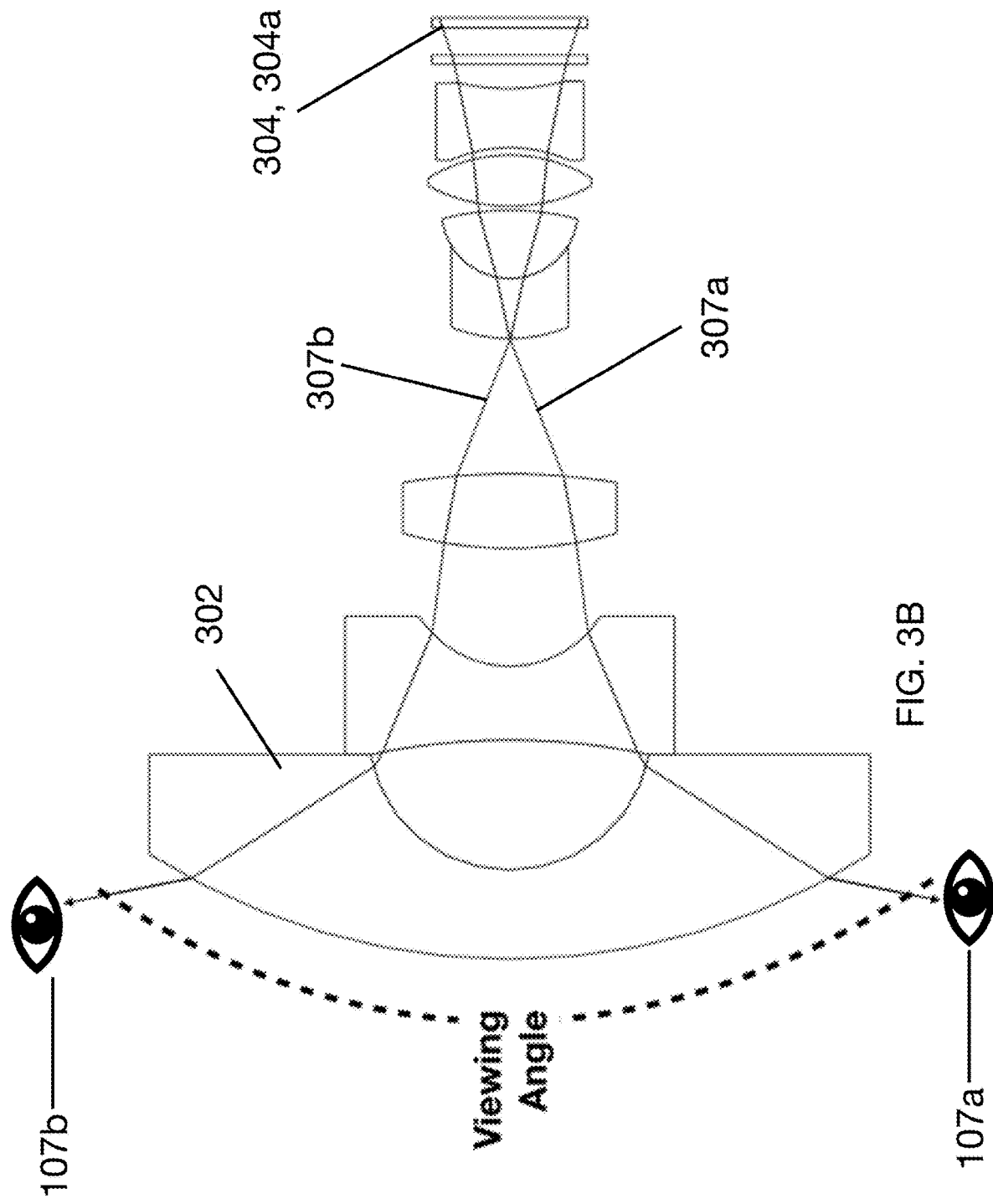
FIG. 3B shows an illustration of light paths through a lens that could be used with a package.

FIG. 3B shows a mockup of a stage/LED 304a, 304 projecting light 307a, 307b that on its way to viewers 107a, 107b is reversed (though this is not required). This inversion may be helpful because viewers may see different or limited portions of the stage/LED array and the cross over in the optical path may be useful in reducing any crosstalk between adjacent light field pixels contained within the package. What should be appreciated from this view is that the lens 302 acts to bend the light 307*a*, 307*b* and although viewers are shown at extreme viewing angles, a single viewer's two eyes could receive different light waves and in so doing, receive outputs from a package or array of packages that renders objects in 3 dimensions. Other parallax or lenticular lensing could achieve a similar effect. In some embodiments, the MEM could be similar to a series of wiper blades passing across the back of a curved input optic.

Figure 4:
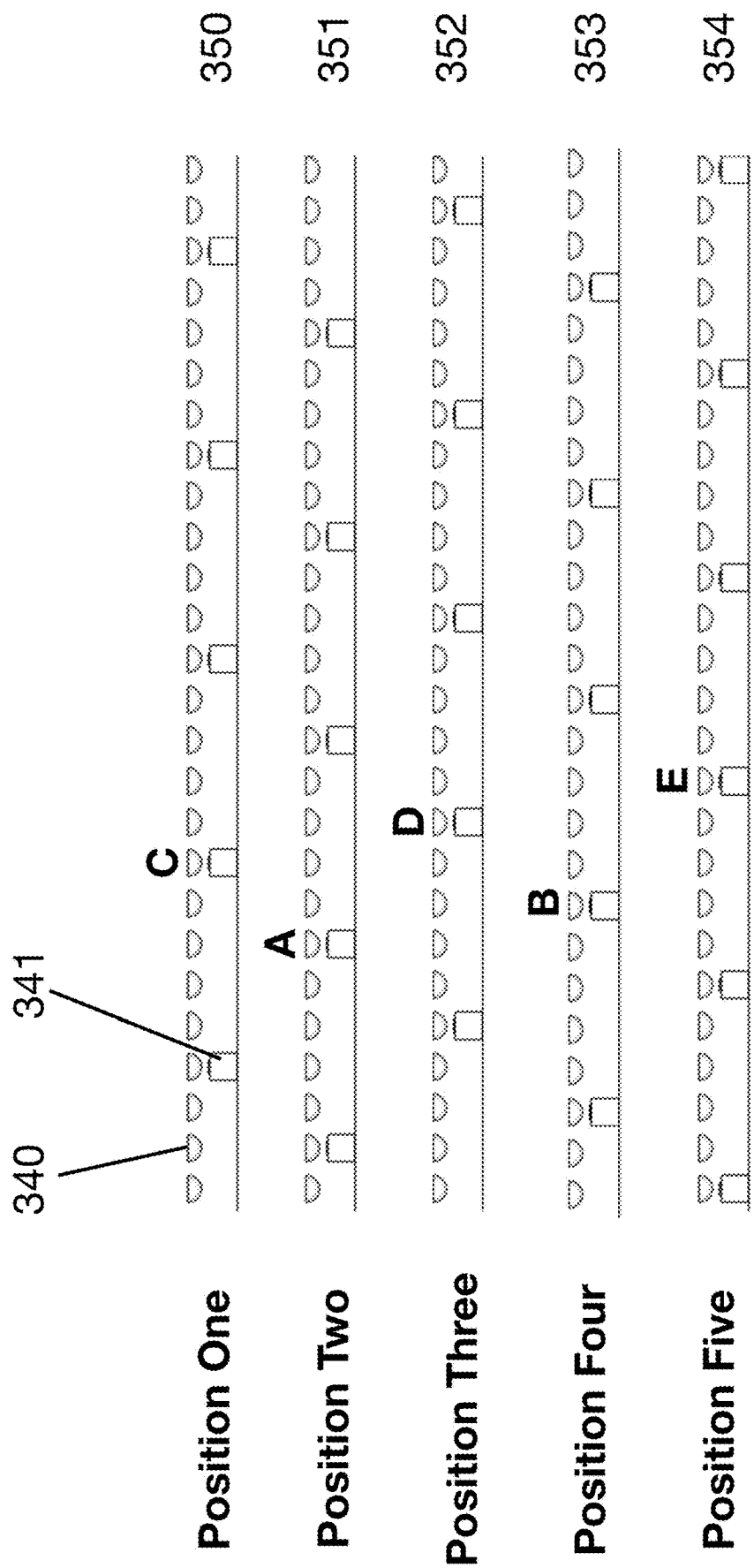
FIG. 4 is a figurative example of optical multiplexing.

FIG. 4 shows the lens array 340 and the miniLED array 341 at five points in time. Moving from a first position 350 through a fifth position 354. This is illustrated in such a way that the miniLED array never moves from one column of LEDs to an adjacent column. So we move from 350 in position C to 351 in position A to 352 in position D to 353 in position B to 354 in position E. Although the display could scan in a linear manner it is possible that this will product visual artifacts.

Figure 5:
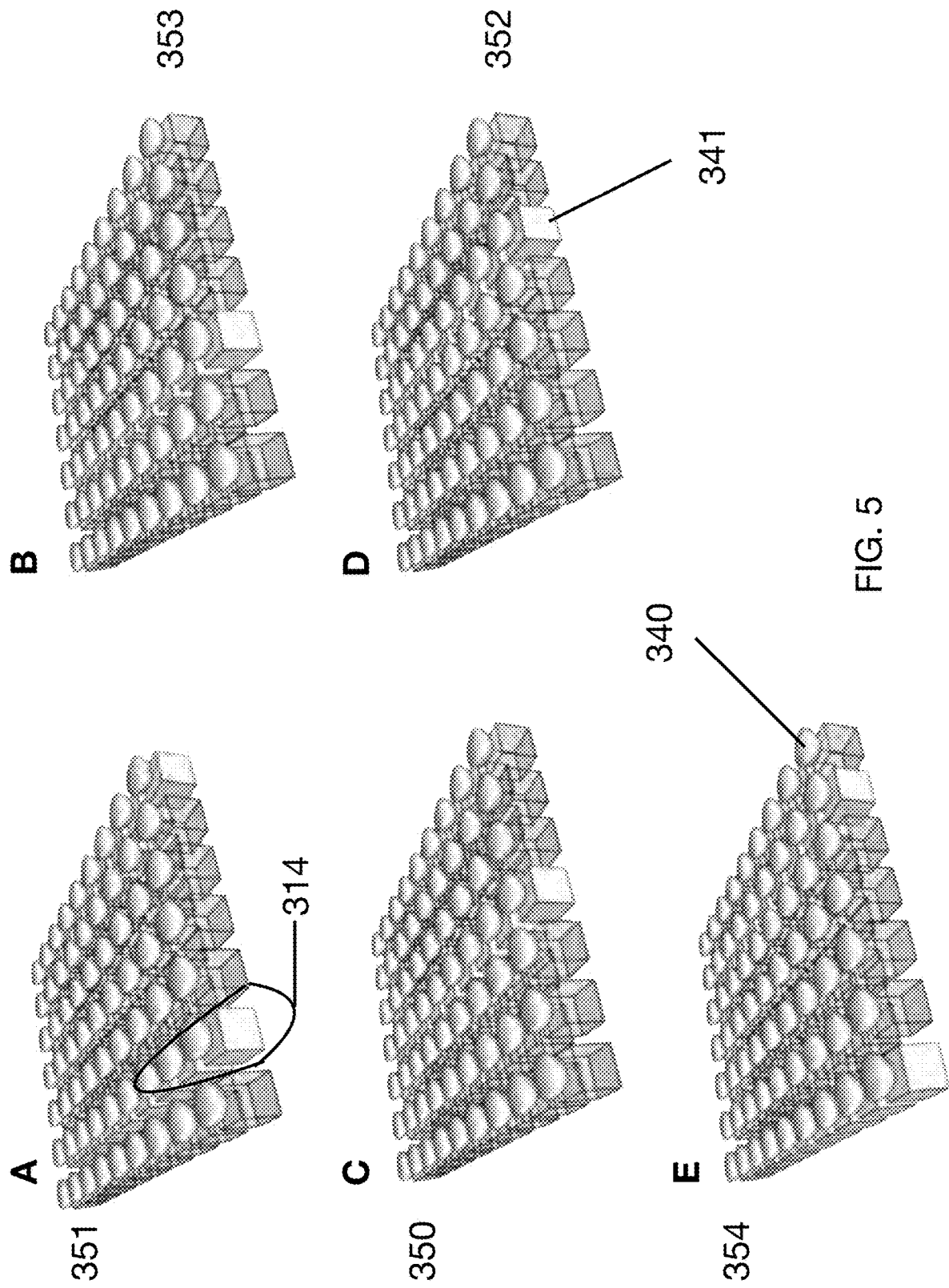
FIG. 5 is another figurative view of optical multiplexing.

FIG. 5 shows the lens array 340 and the miniLED array 341 illustrated showing the active LED and pixel 314 (where a pixel is again multiple LEDs 314) locations along with ghosted/lightened positions showing all the active locations in the system. You can see that position E 354 and position A 351 illustrate two active pixel columns since at this point the illustration contains two columns of pixels in those positions.

Figure 6:
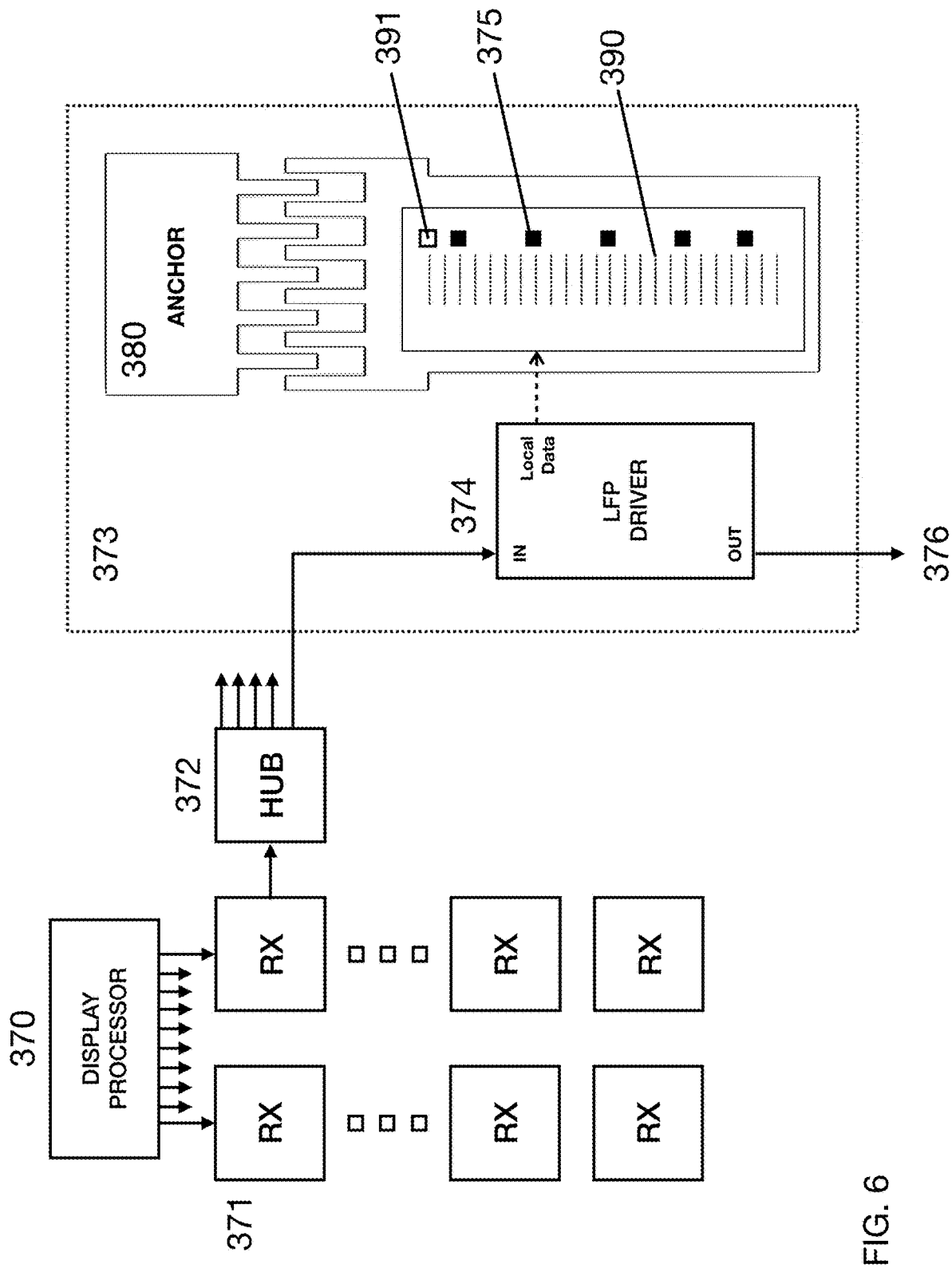
FIG. 6 shows signal flow through components.

FIG. 6 shows a single light field package 373 that is one small part of a larger system. The signal originates in a display processor 370 that contains a map of all the pixel and/or LED locations. This map outputs data and that data hits a receiver card 371 that extracts the local data for that section of screen. This data is output via a hub 372 that integrates the receiver card 371 with the LED panel. The output of the hub 372 will possibly hit many LED modules within a panel. In the panel the data often cascades from light field package to light field package. Each light field package 373 may contain a driver 374 that supplies local data to LED drivers 375 along with the MEMS stage 380 and the IR LED 391.

Figure 7:
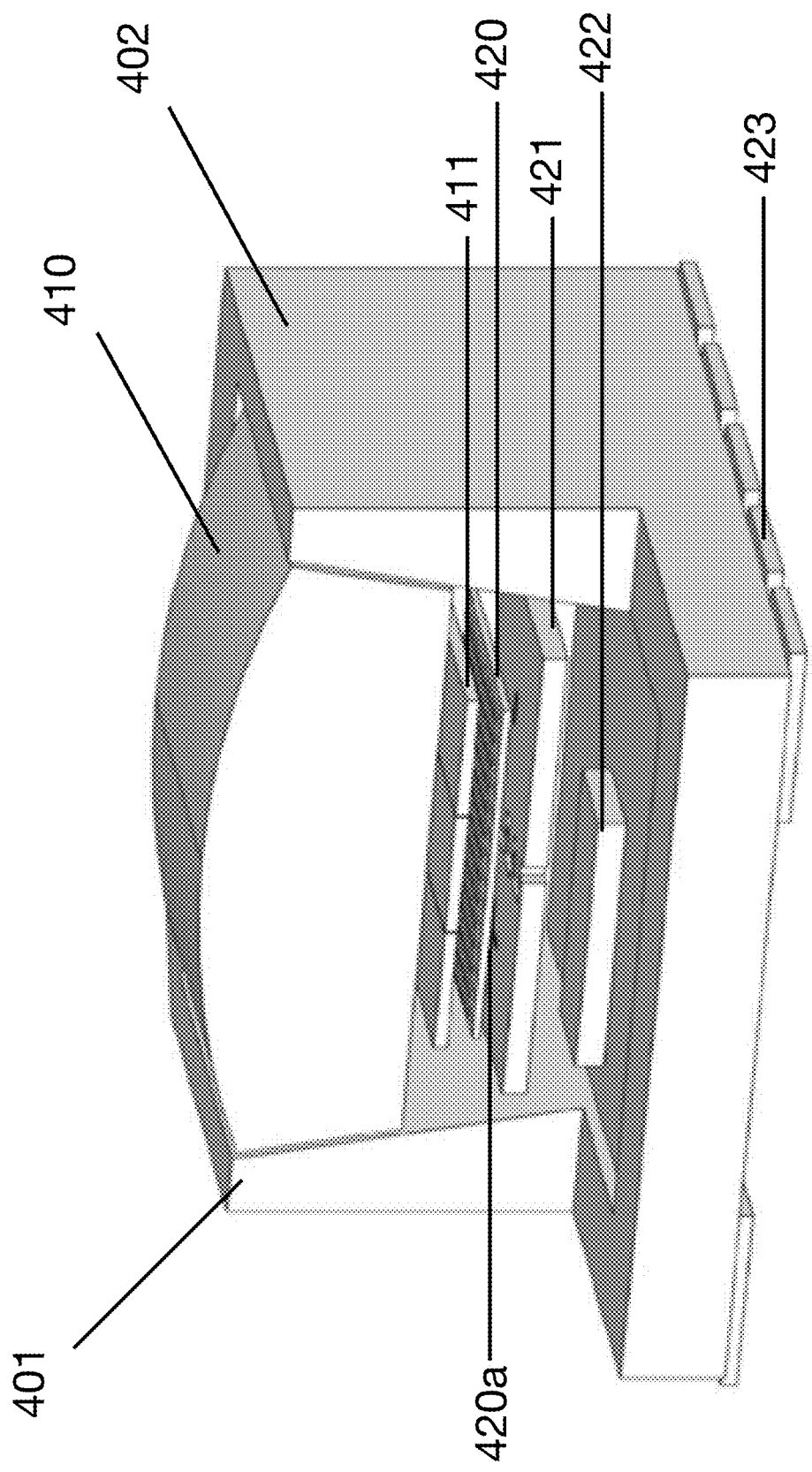
FIG. 7 shows a short travel light field package.

FIG. 7 shows a package 401 that shares many elements of the PLCC6 package 301 and could be used with standard pick and place equipment. The light field package 401 contains an optical system 410 designed to distribute the output in a roughly lambertian manner although this can be optimized for linear distribution since that may be desirable in many cases. There may be a secondary optic 411 that either collimates the output of the light sources or acts as a mask.

The electrical functions of the light field package 401 may be defined by the arrangement of the light emitters 420 on a stage 420*a* driven along a linear path by a MEMs actuator 421 controlled by an integrated driver 422. The light field package 401 may be connected using a surface mount compatible array of conductors.

Figure 8:
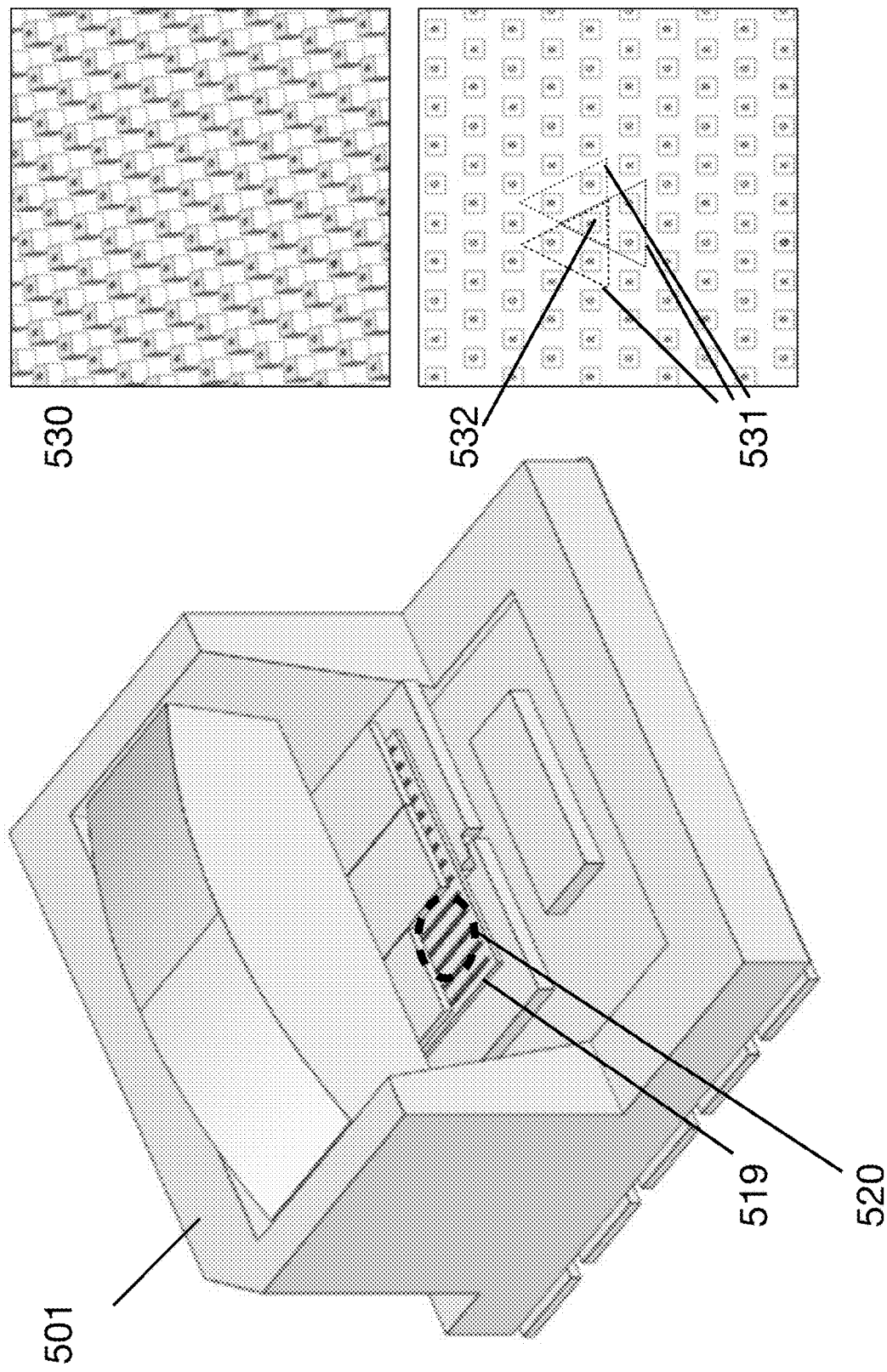
FIG. 8 shows a short travel light field pixel with a cutaway to expose a microLED array.

FIG. 8 shows a short travel light filed package with exposed microLED array 501 having a stage 519 holding the microLED array 520 is shown. The LED arrangement can be linear or the LEDs (labeled R, G, B to indicate possible colors) or another light source can be arranged in a triad arrangement 530 allowing a red LED 532 to be part of several adjacent pixels 531.

Figure 9:
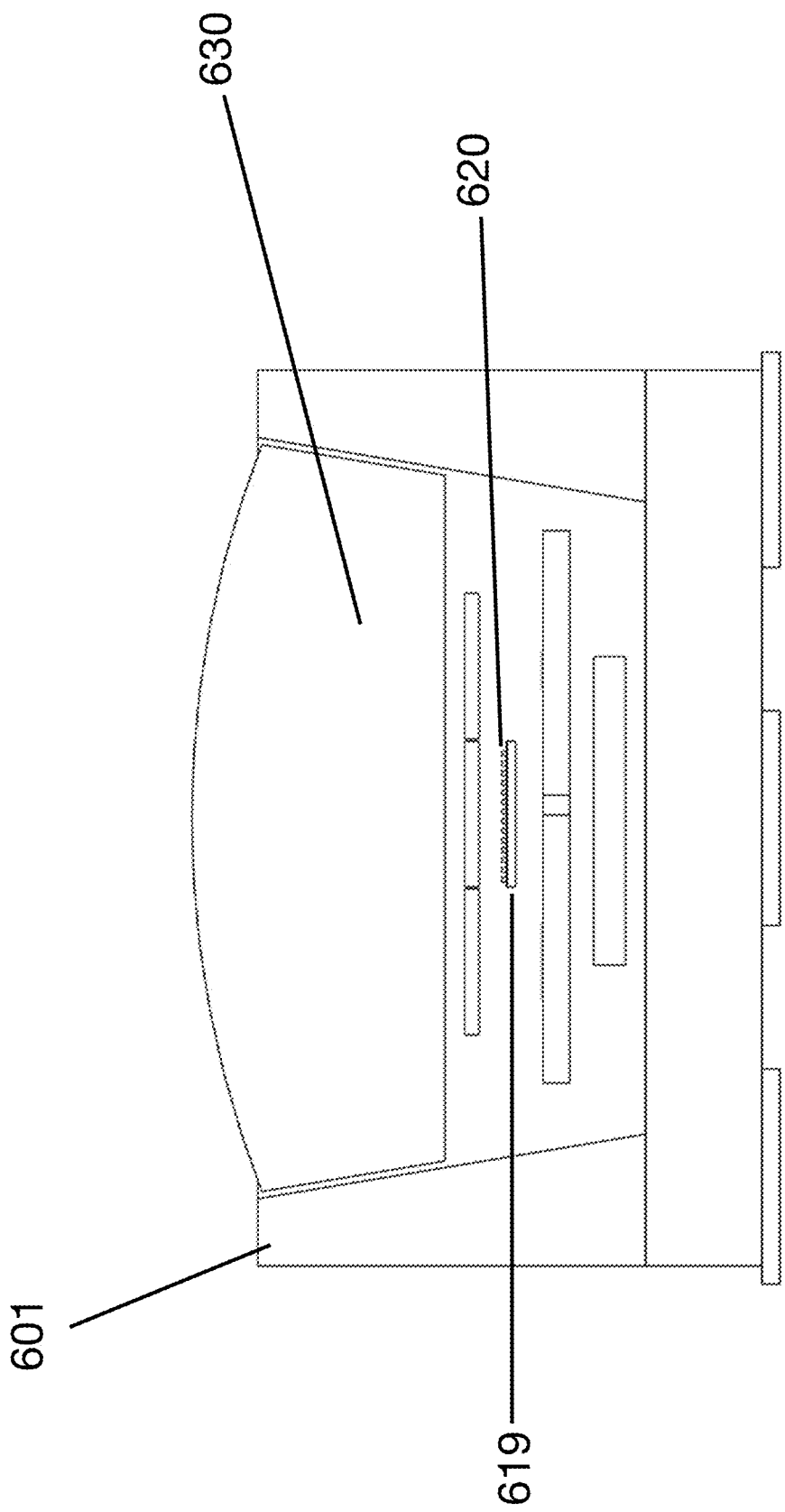
FIG. 9 shows an elevation of a long travel light field package with closeups of RGB LEDs and pixels.

FIG. 9 shows a long travel light field package elevation in which an alternative embodiment delivers a package 601 that uses a smaller stage 619 to move a more compact array of light sources 620 across the back of a static optical system 630. This may have advantages in production allowing for the use of a smaller substrate for the light emitting array and could be more desirable where more optical multiplexing is possible. Comparing this long travel package 601 to the short travel package 401, it should be appreciated that the stages are different sized, as is the LED spacing, which would require more or less travel of the respective stages respectively.

Figure 10:
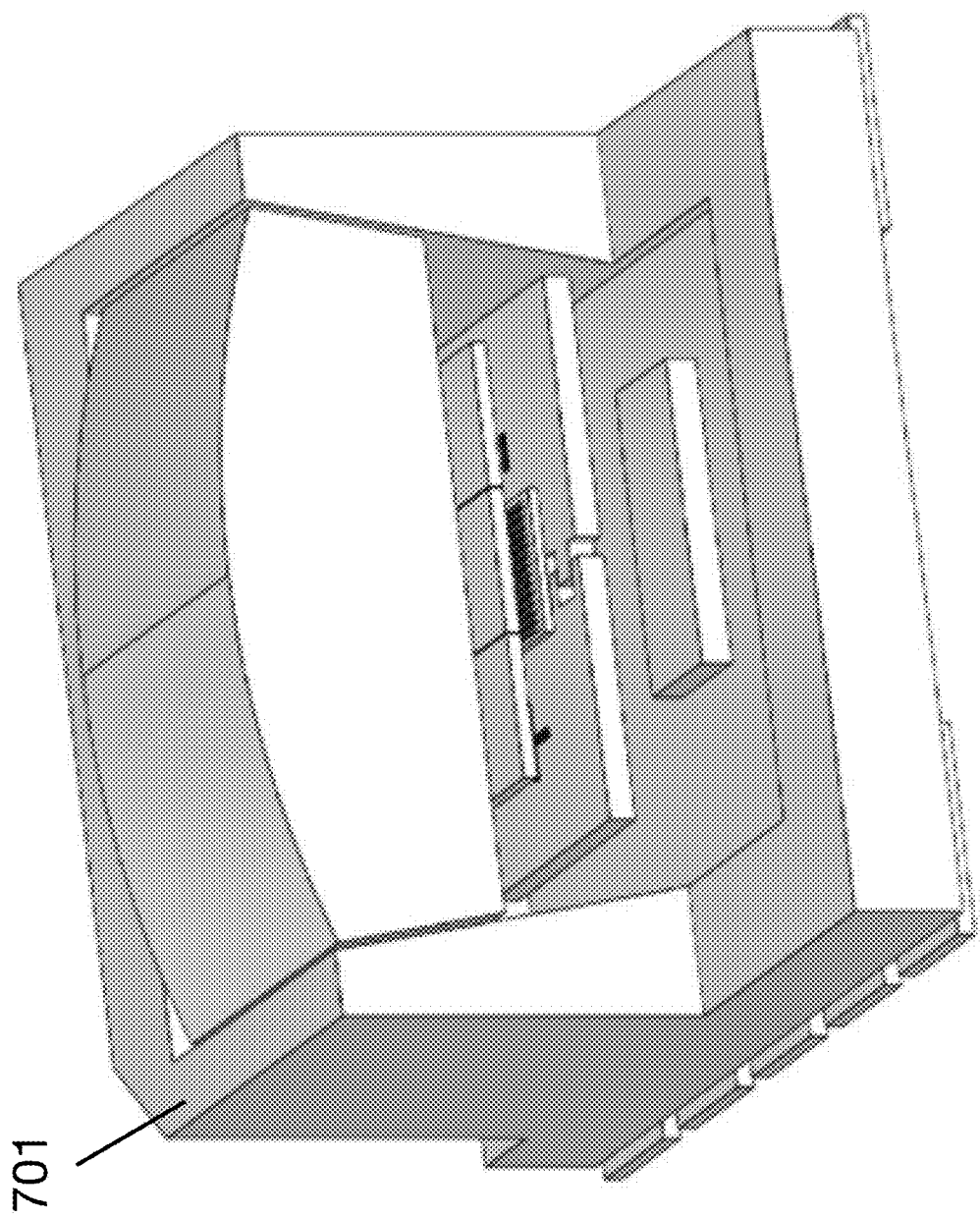
FIG. 10 shows an illustration of a long travel light field package.
Figure 11:
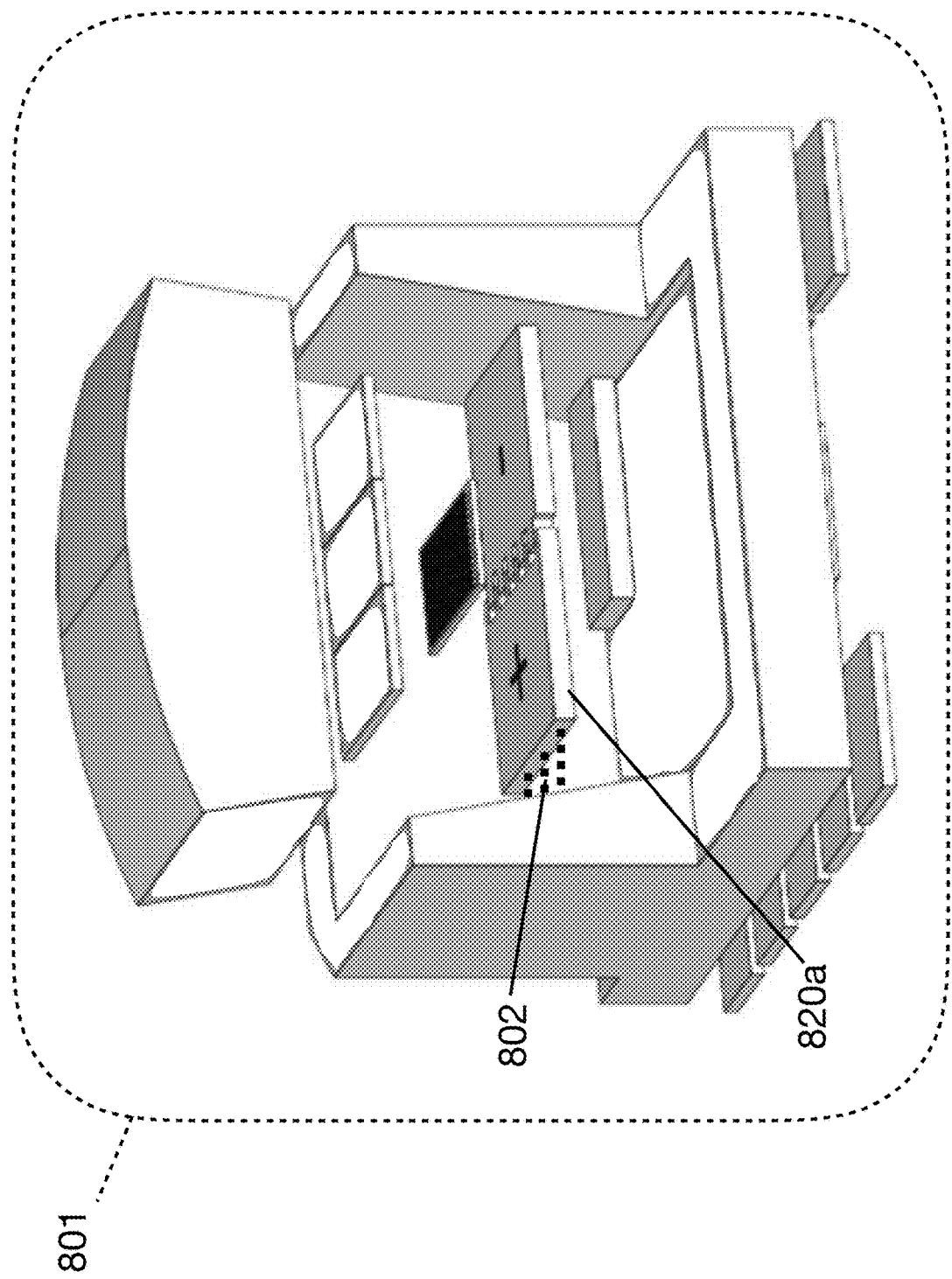
FIG. 11 shows an exploded view of a long travel light field package.
Figure 12:
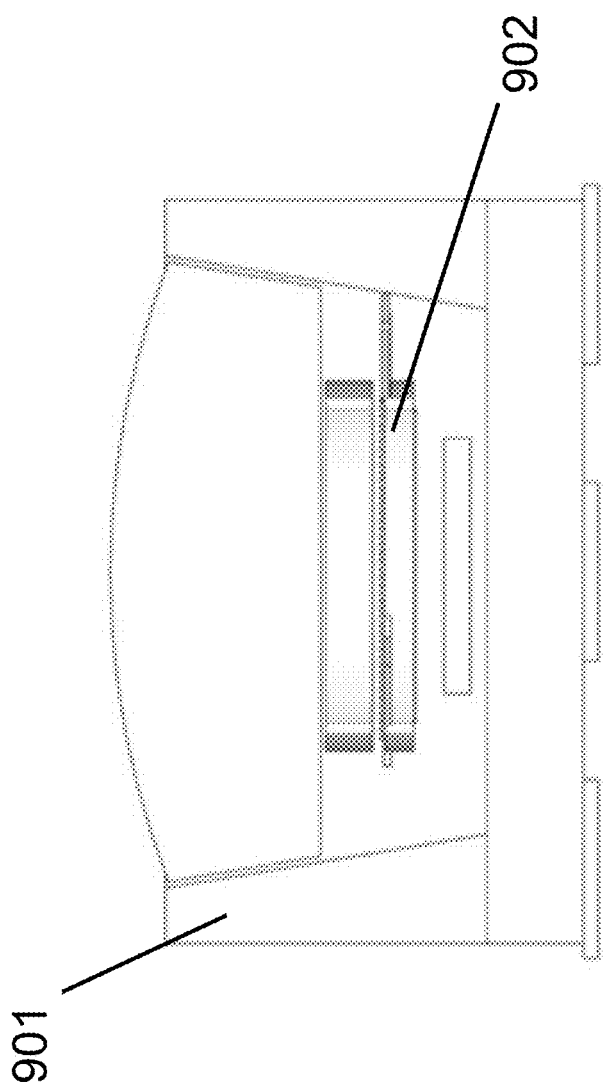
FIG. 12 shows an elevation of a twist light field package.

As shown in FIGS. 10 and 11, a system using a longer travel may be able to dynamically address pixels based on utilization much like a print head only applying ink where it is needed. In a system representing 54 pixels in the horizontal axis the MEMS stage would need to travel a little over two millimeters or a little over one millimeter either side of a center or default position.

As seen in FIG. 11, the long travel system 801 may rely more on the effect of a spring 802 or springs to rapidly shift the stage 820*a* back to the default position.

FIGS. 12-15 shows an alternative embodiment of a twist light pixel that uses a rotating stage 902 to move the LED packages around a central axis. This may be optically more complicated but the design may offer a variety of options to use discreet red, green, blue, cyan, orange, and white MicroLEDs to create virtual pixels with extended dynamic range.

Figure 13:
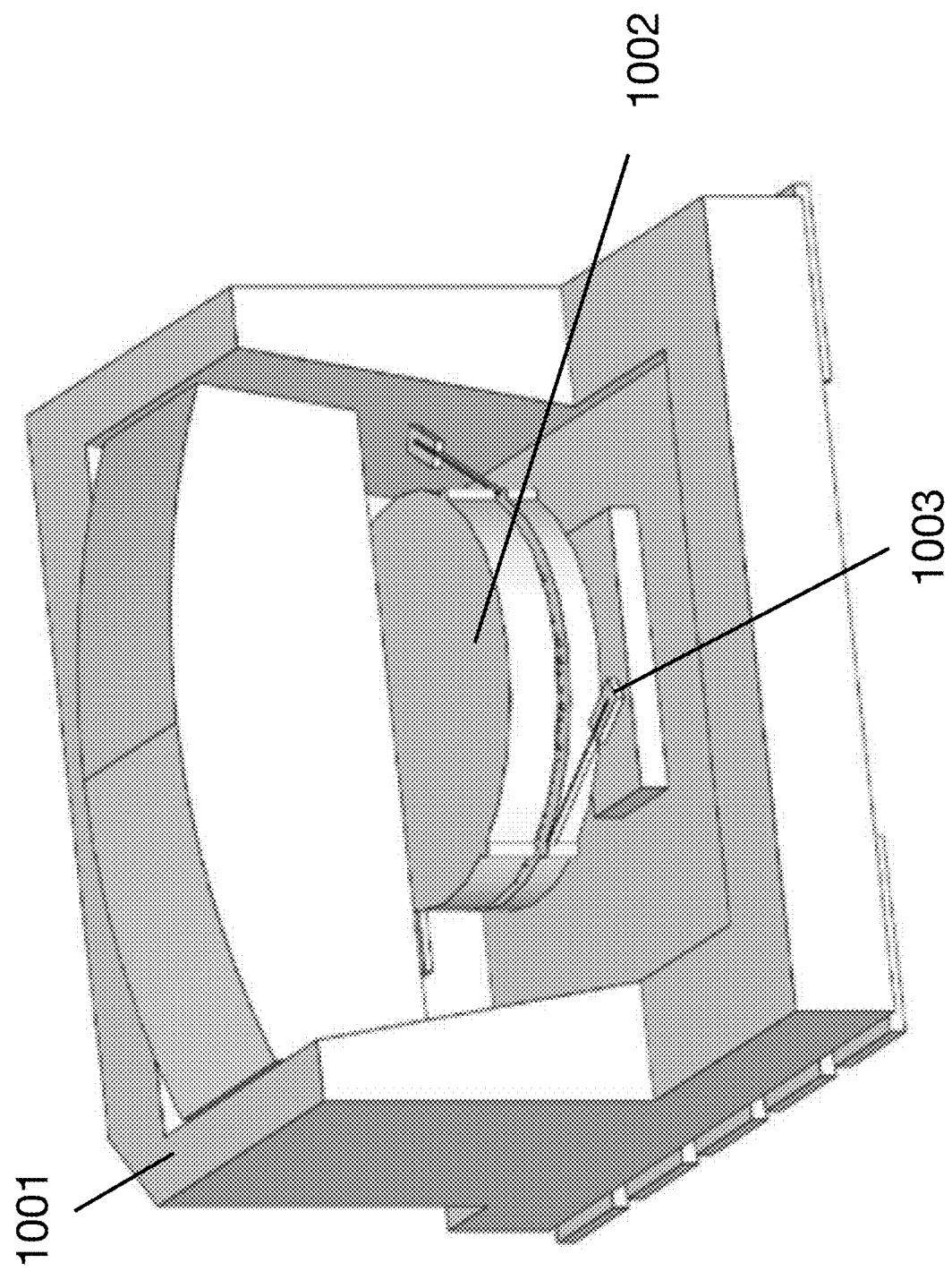
FIG. 13 shows a twist light field package.

As seen in FIG. 13, the MEMS stage 902 in the twist system 1002 is driven by three posts 1003 that shift on a hinge rotating the LED stage behind the optical system. One concern with a rotating stage is that the LEDs at the center of the stage would be covering a smaller display area than the LEDs at the outside of the stage meaning that they would operate at different duty cycles, but this could be compensated for by the driver.

Figure 14:
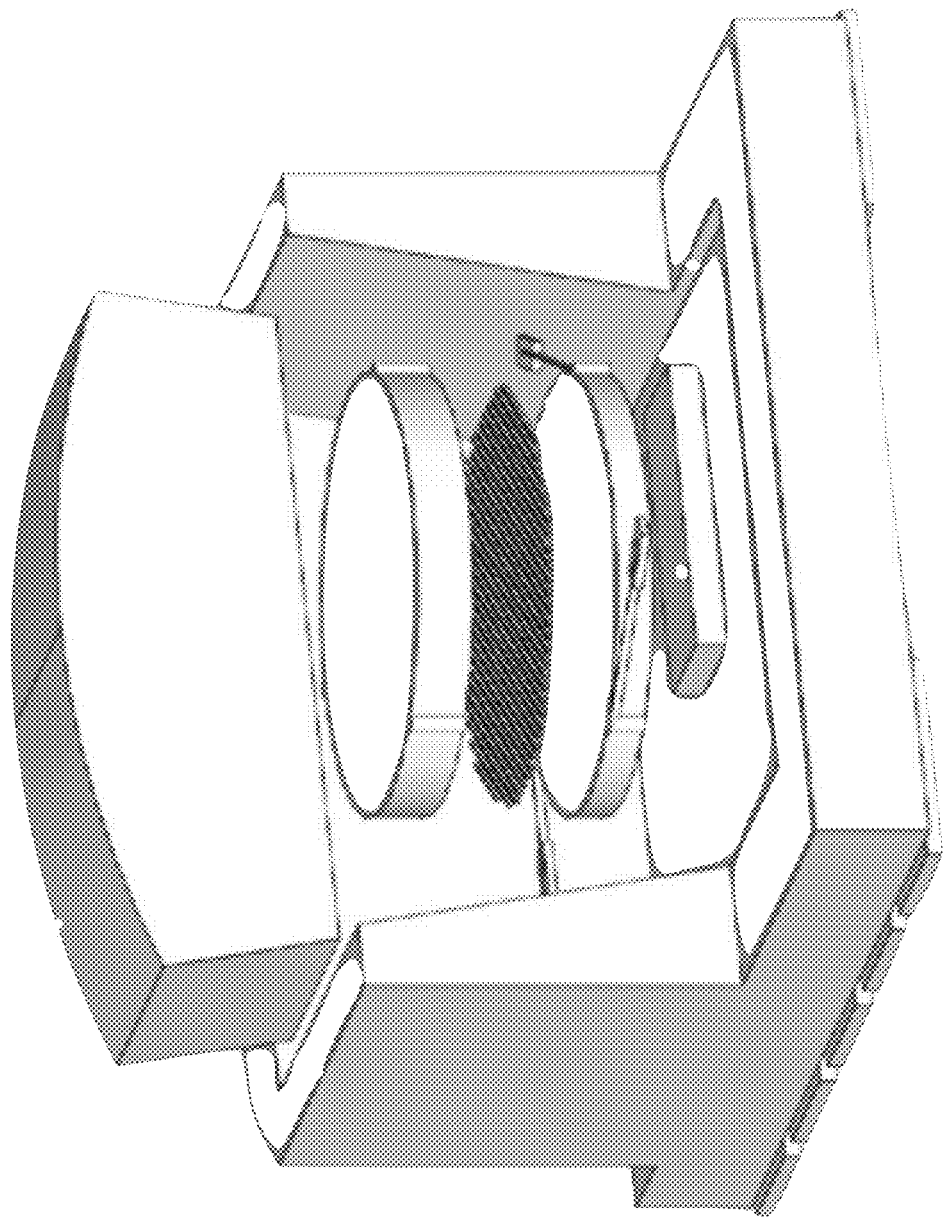
FIG. 14 shows an exploded view of the twist light field package.

FIG. 14 shows that the system could use groupings of red, green, and blue LEDs or a system of discreet LEDs of varying colors as illustrated in the dense LED array. This array could be configured in a variety of different positions so that red, green, blue LEDs pass a specific optic relating to one viewing angle. And additional LEDs could be added to expand color spectrum.

Figure 15:
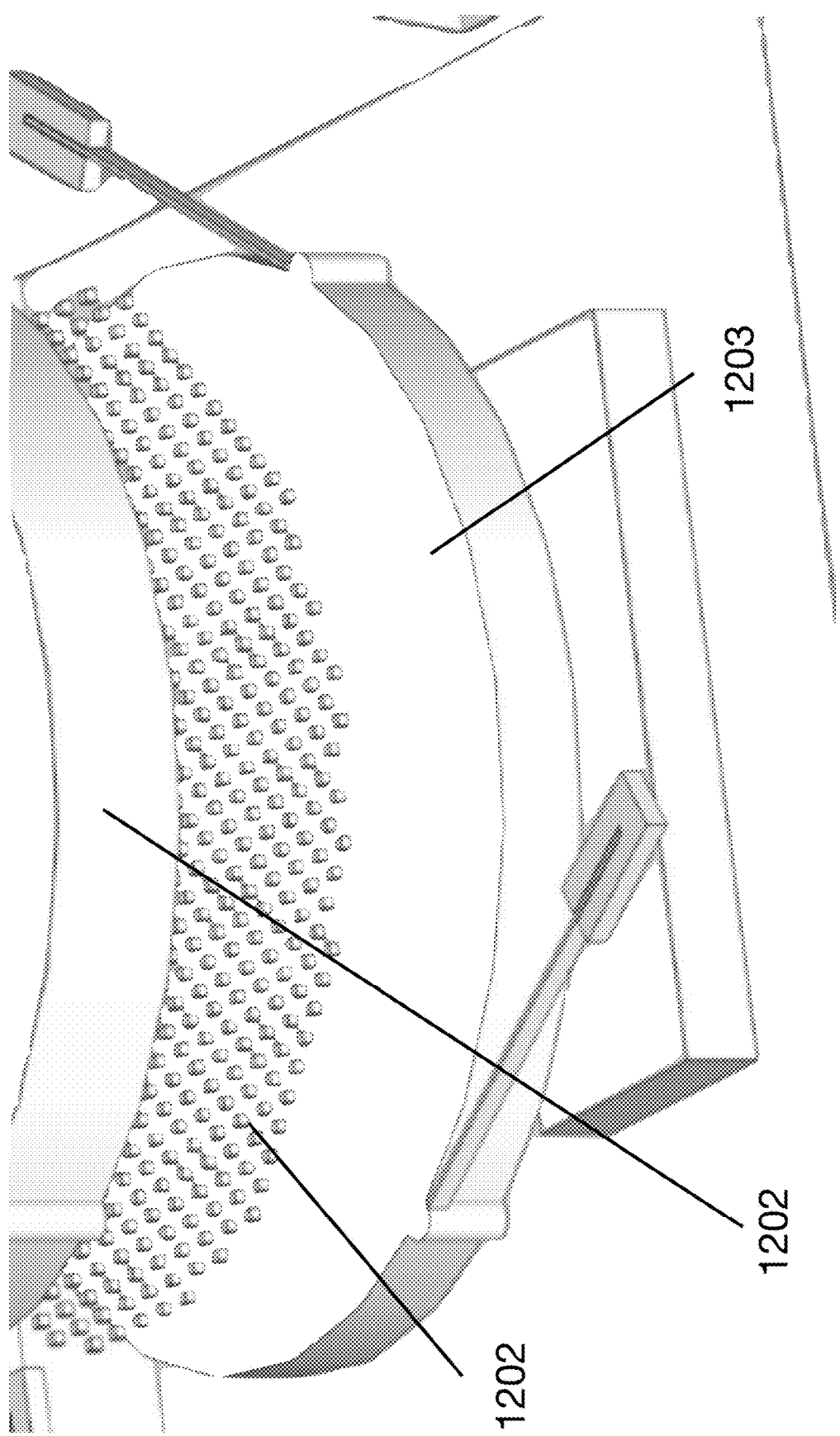
FIG. 15 is a detail view of the exploded view of the twist light field package LED array.

As seen in FIG. 15, the array of LEDs 1202 can be seen separated from the stage 1203 and the optic 1204.

Figure 16:
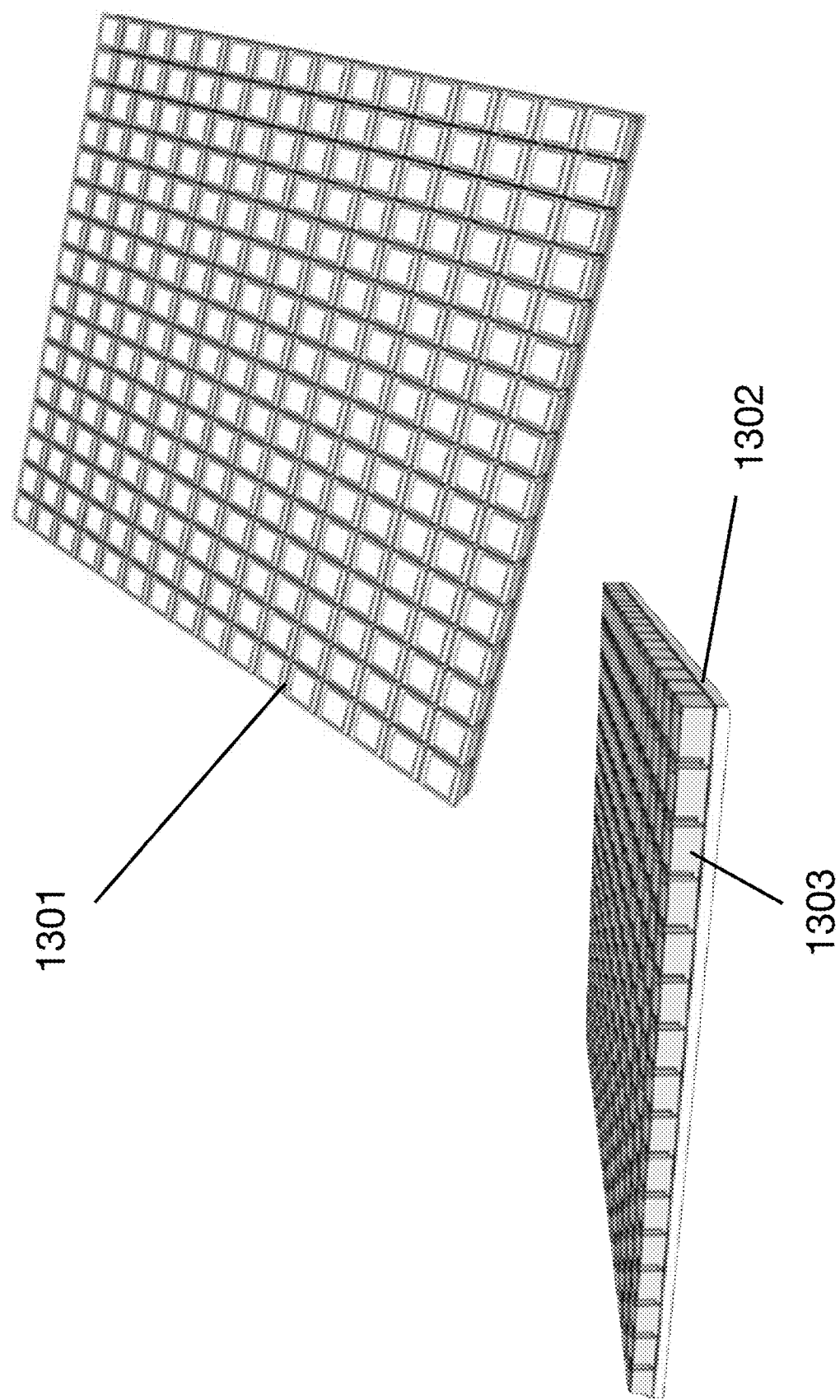
FIG. 16 shows a light field display module.

FIG. 16 shows a light field pixel display module, in which the assembly 1301 is built around a PCB 1302 that is populated with LED packages 1303. But in this design, the LED packages are light field display packages. The illustration shows a 16×16 array of pixels each representing 256 points of view or approximately 65,000 light field subpixels.

Figure 17:
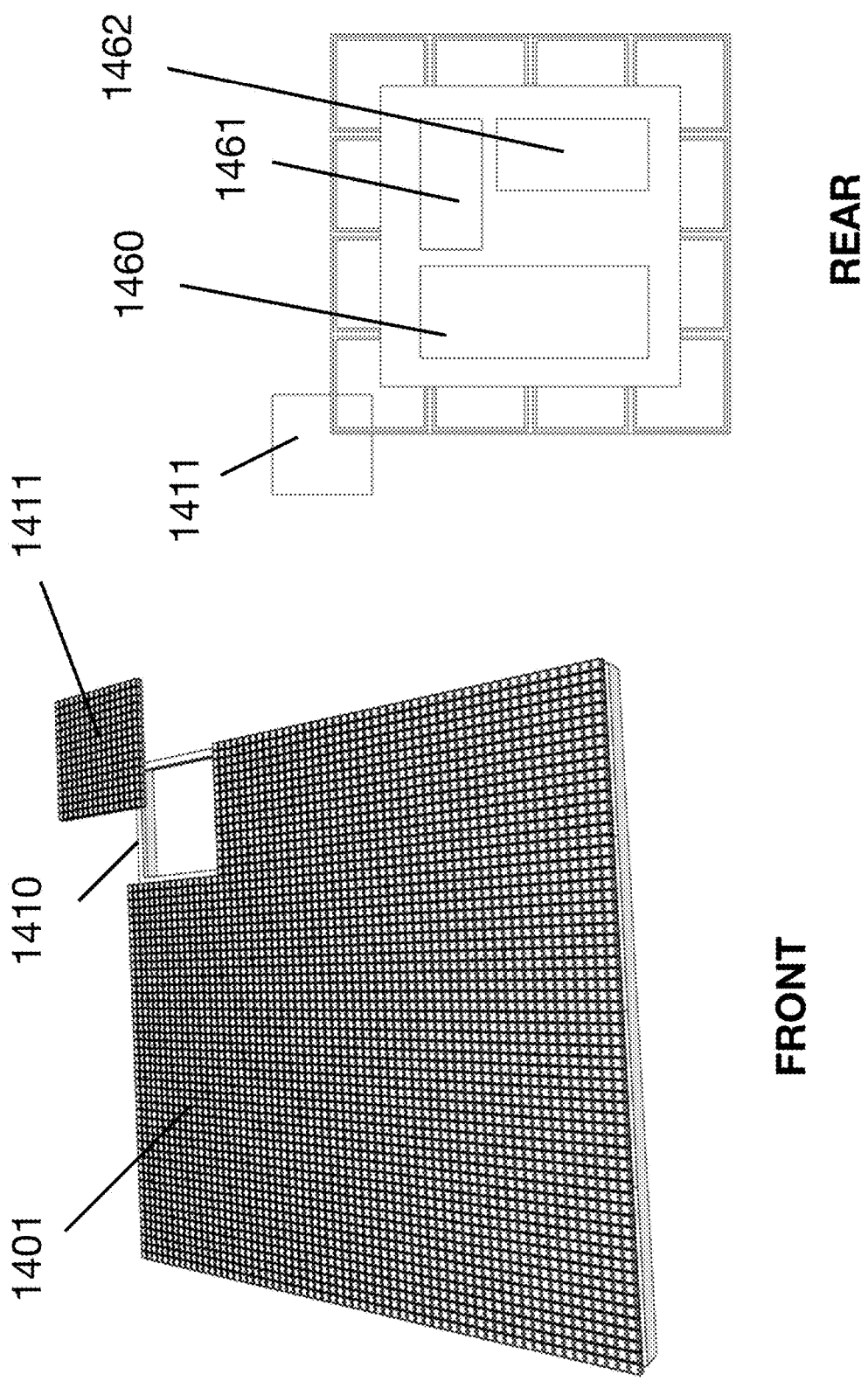
FIG. 17 shows a light field panel.

As shown in FIG. 17, the mechanical systems used in LED displays currently can be adapted easily for use in light field displays. Here a panel 1401 comprising sixteen light field display modules 1410 are mounted on a frame 1411 that houses the power 1462 and data distribution 1460 in addition to a small localized content server 1461 that may be used because this panel 1401 alone contains one million pixels.

Figure 18:
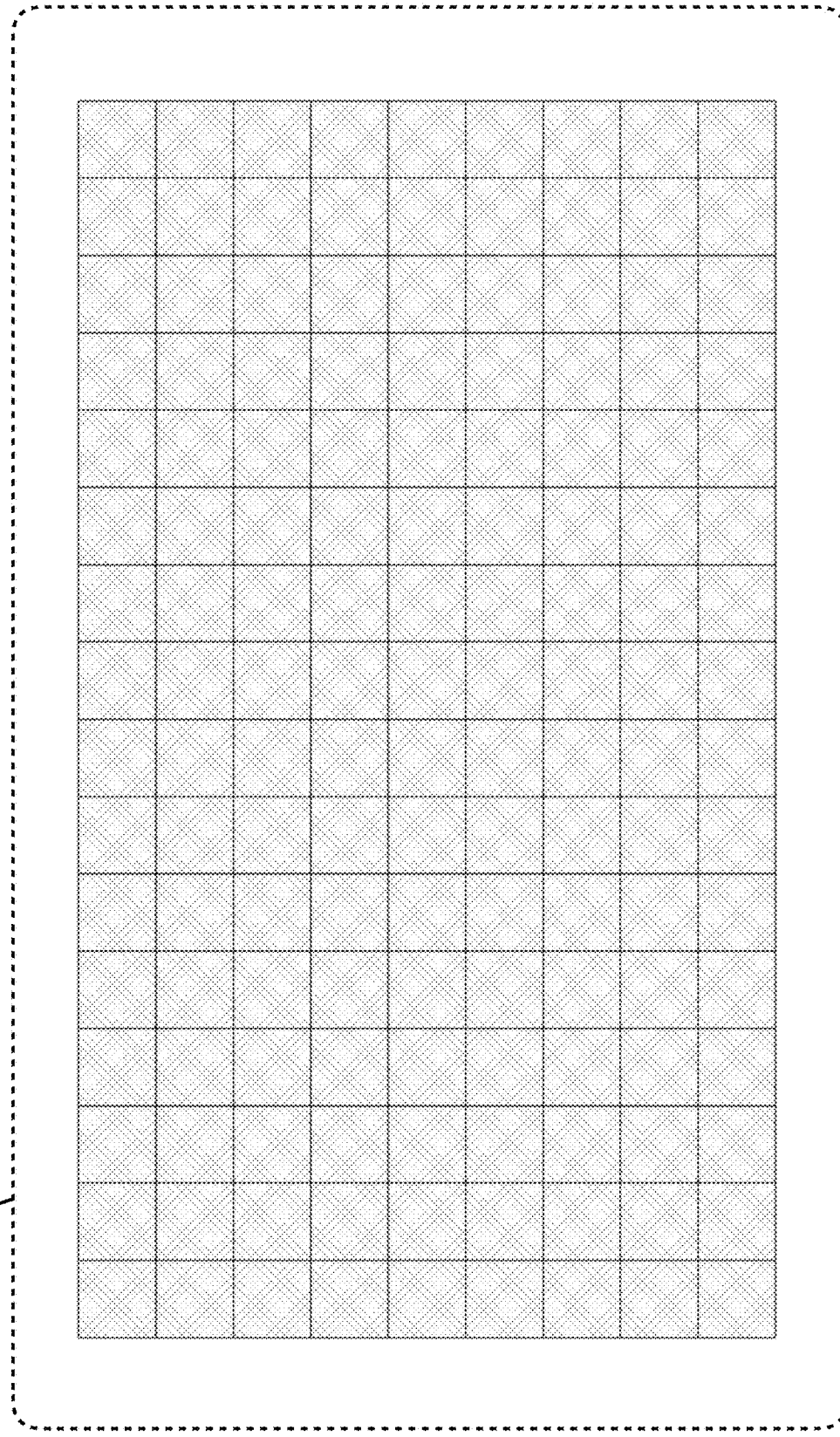
FIG. 18 shows a light field display wall.

FIG. 18 shows a light field pixel display wall in which the panels can then be arrayed so the wall 1501 delivers a single contiguous image. In current LED walls these are primarily 2D images. A light field display, in contrast, is capable of delivering three dimensional images from a variety of viewpoints without the use of glasses. The display system, whether it is used in a flat traditional screen application or used in a dome or sphere application, would be able to deliver a different experience to every viewer based on their location in the space.

Figure 19:
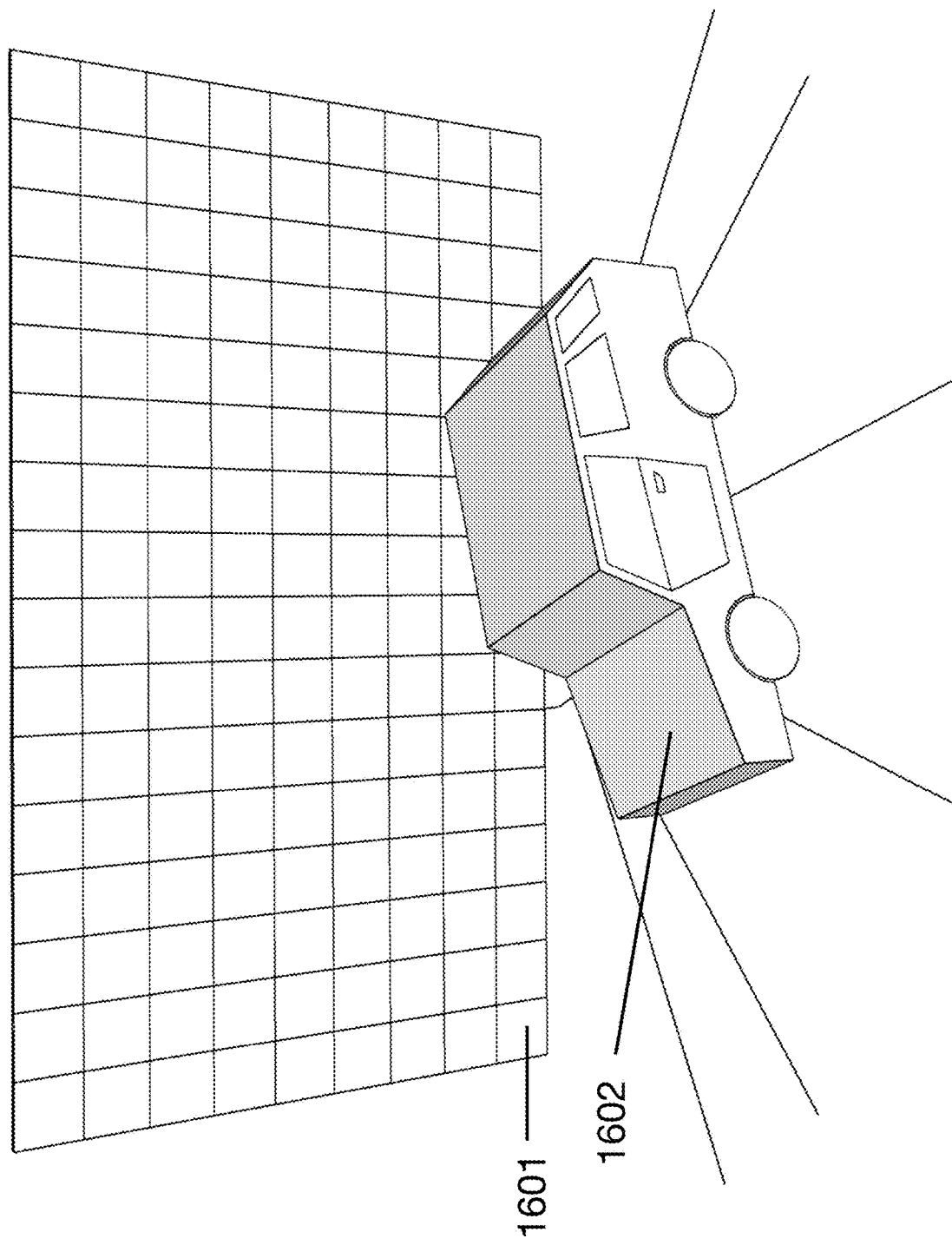
FIG. 19 shows an application of the light field display with a conceptual car.

FIG. 19 shows an application using the example of a car 1602 and a flat display 1601 that the car could be viewed from between 48 and 180 different views depending on the LED array used in the light field pixel. The number of views may be a function of engineering and cost but it can be appreciated that large screens featuring more than 180 discreet horizontal views are possible.

Figure 20:
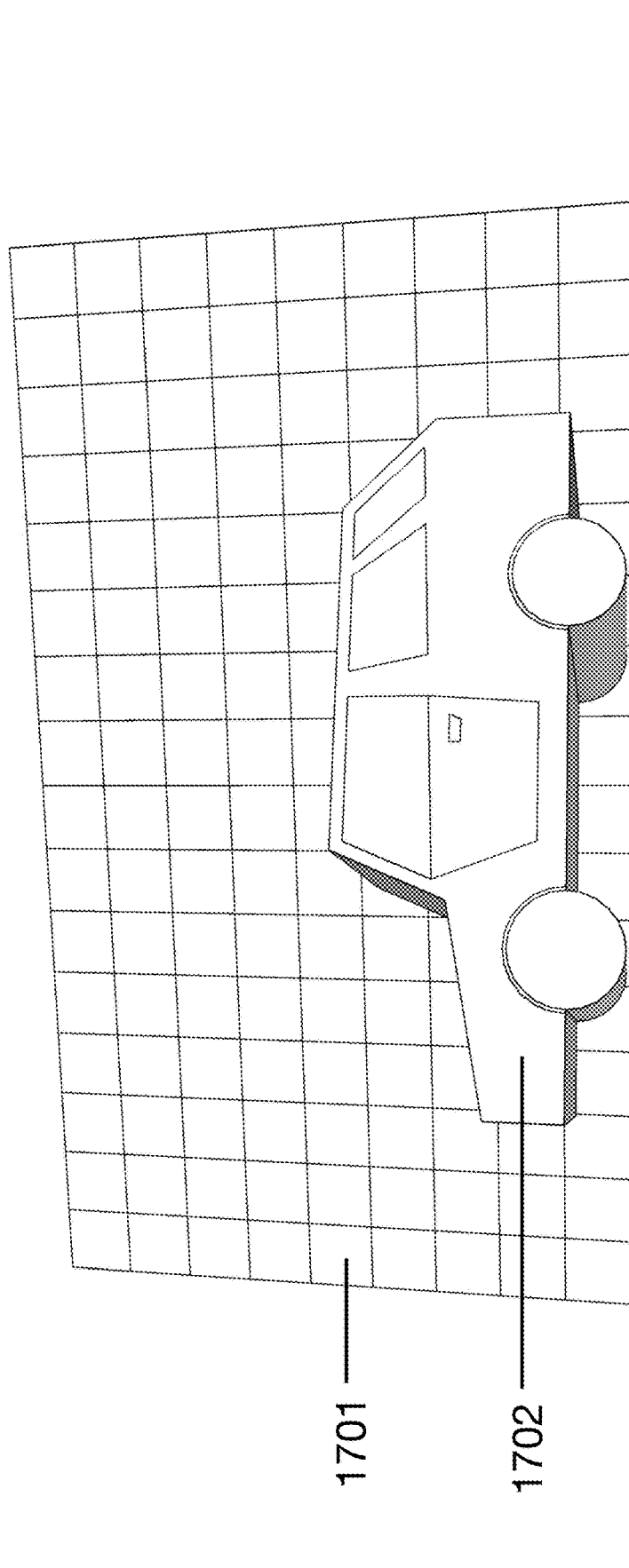
FIG. 20 shows an application of a light field display with a car in a first view.
Figure 21:
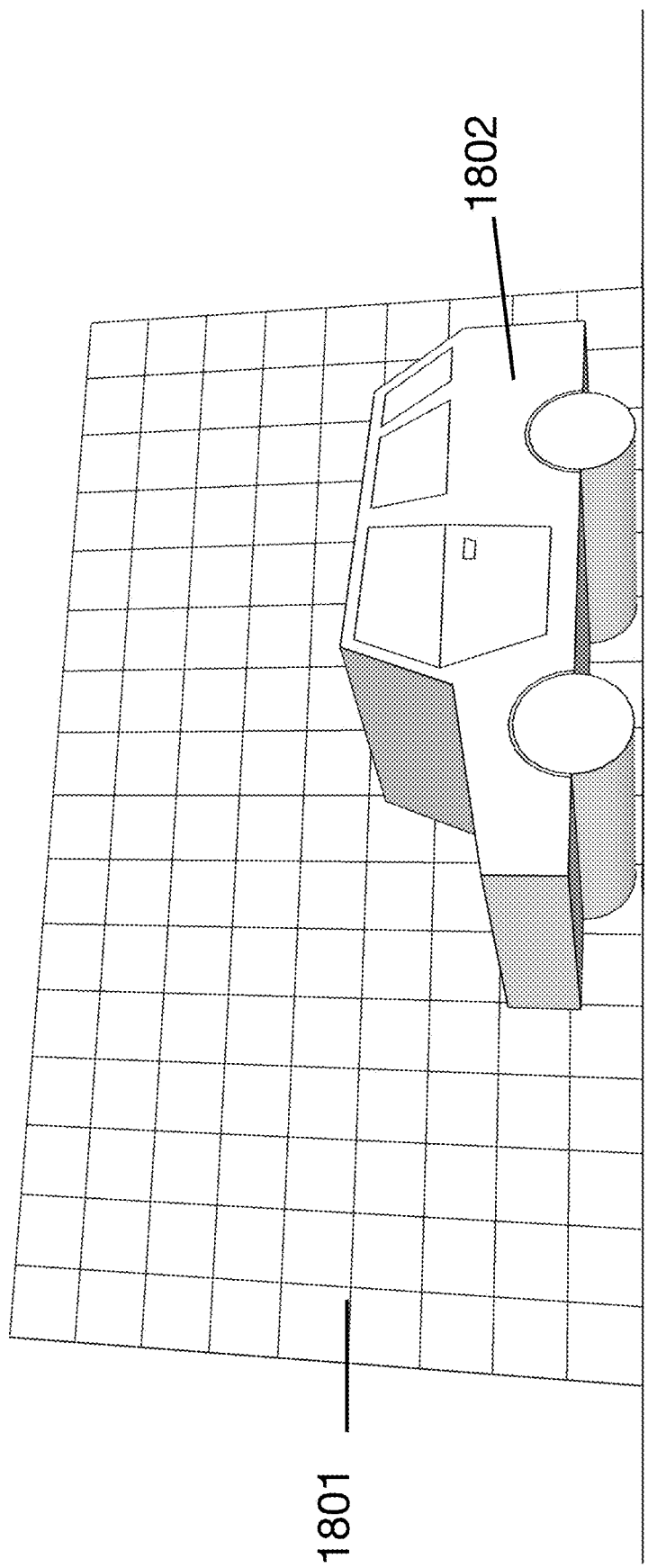
FIG. 21 shows an application of a light field display with a car in a second view.
Figure 22:
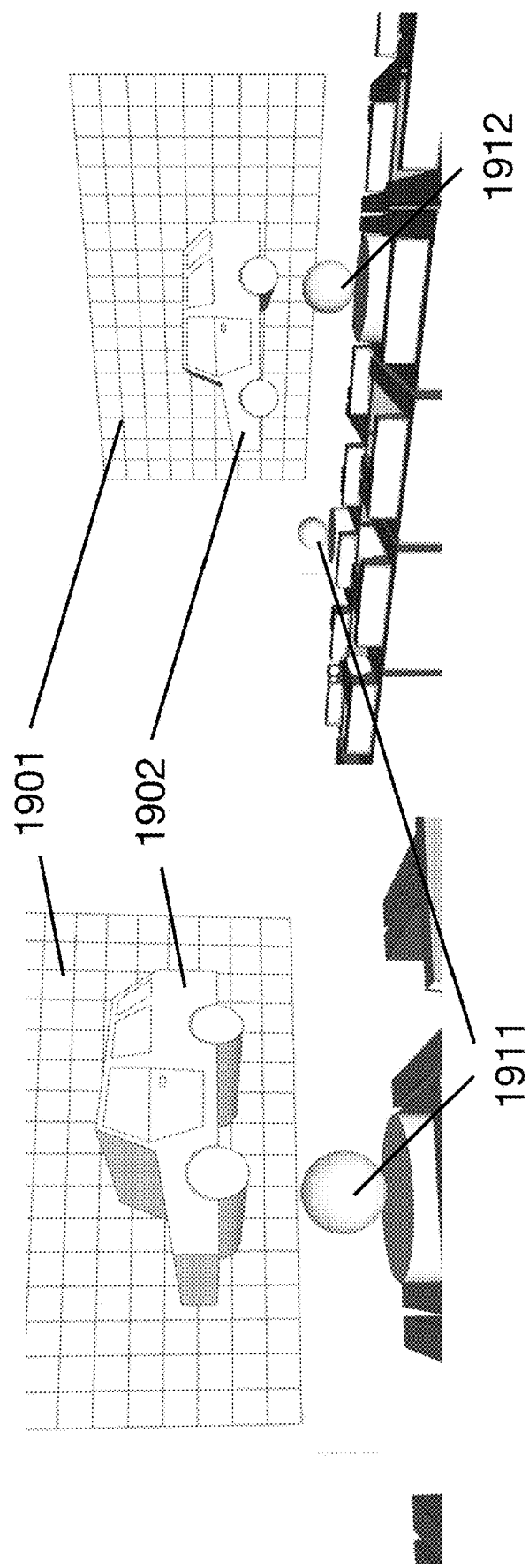
FIG. 22 shows an application of a light field display with a car in a third view.

FIGS. 20-22 show the application of light field display from different car views.

In FIG. 20, the viewer sees a three-dimensional representation of a car 1702 that is dependent on their point of view from the wall 1701. In FIG. 21, the viewer sees a three-dimensional representation of a car 1802 that is dependent on their point of view from the wall 1801. And in FIG. 22, viewers see a car 1902 on the screen 1901 from two different perspectives. One viewer 1911 is sitting closer and to the left and the other viewer is sitting further back and to the right 1912 so the image appears different to these two viewers as it would in any arbitrary location in the theater.

Figure 23:
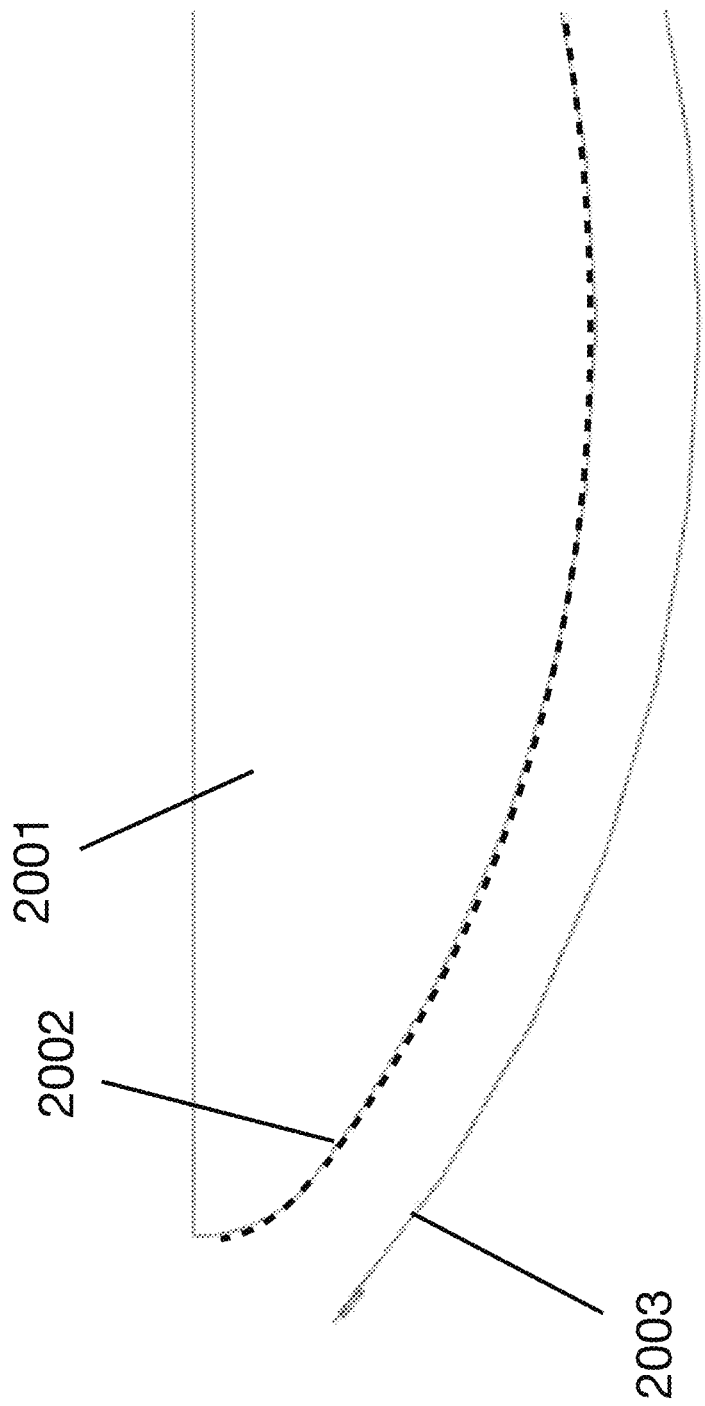
FIG. 23 shows an illustration of the application in the automotive industry.

FIG. 23 shows one possible use for the components in cars where indicators can be seen to float off the surface of a car. Here the tail of a car 2001 is shown with the light field modules 2002 integrated in such a way that the output appears to float behind the car 2003.

Figure 24:
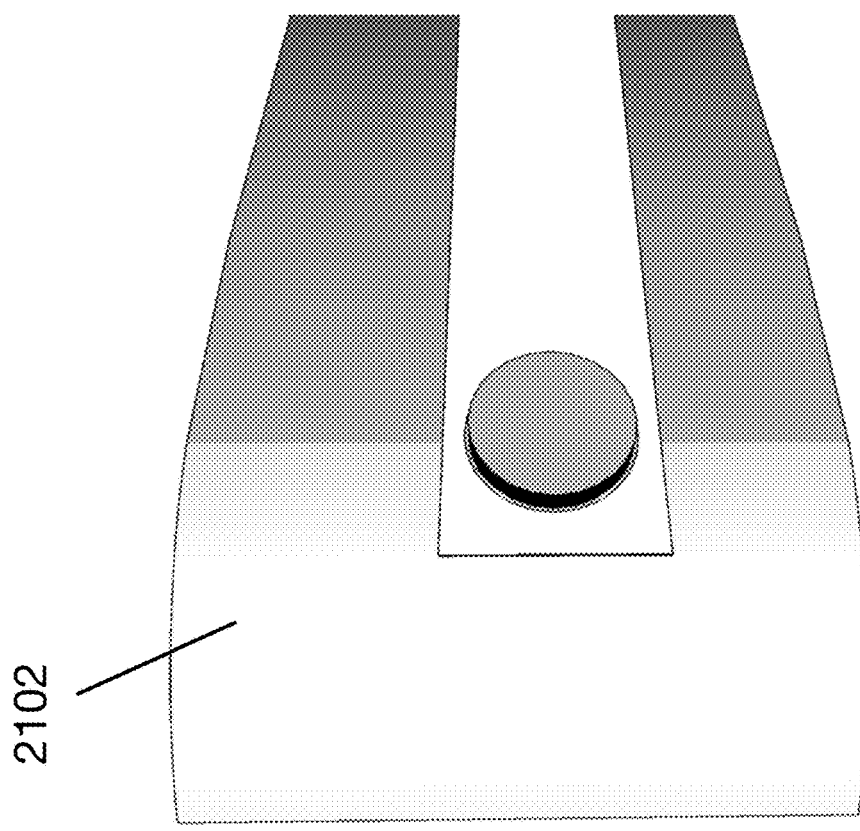
FIG. 24 shows an application in the automotive field showing two points of view.
Figure 24:
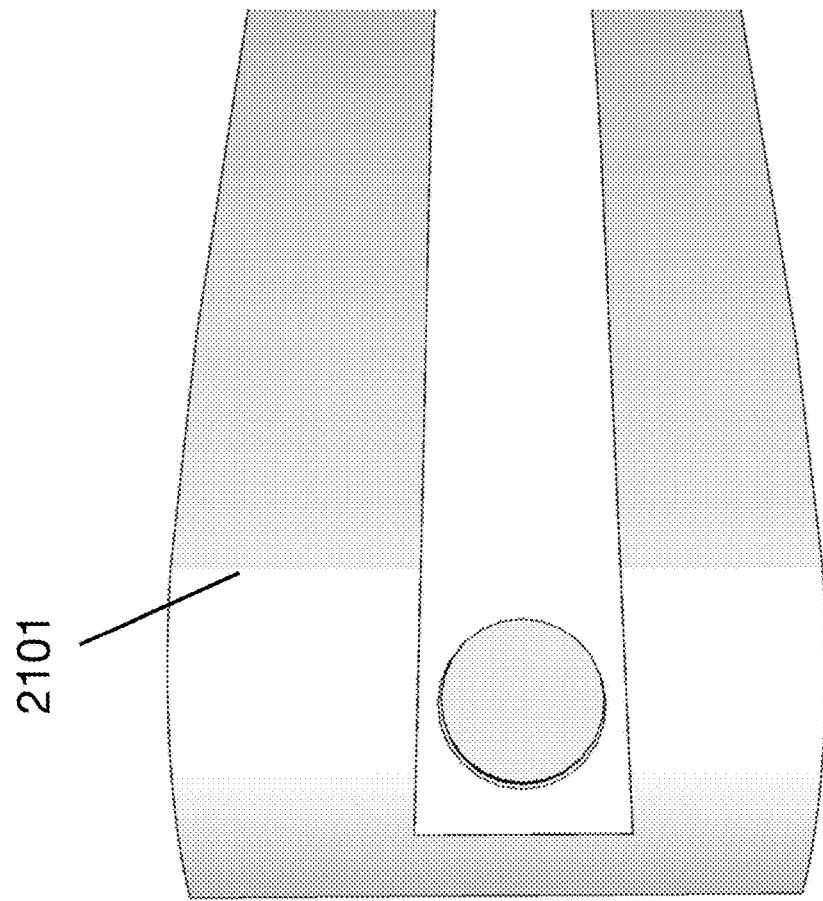
Figure 25:
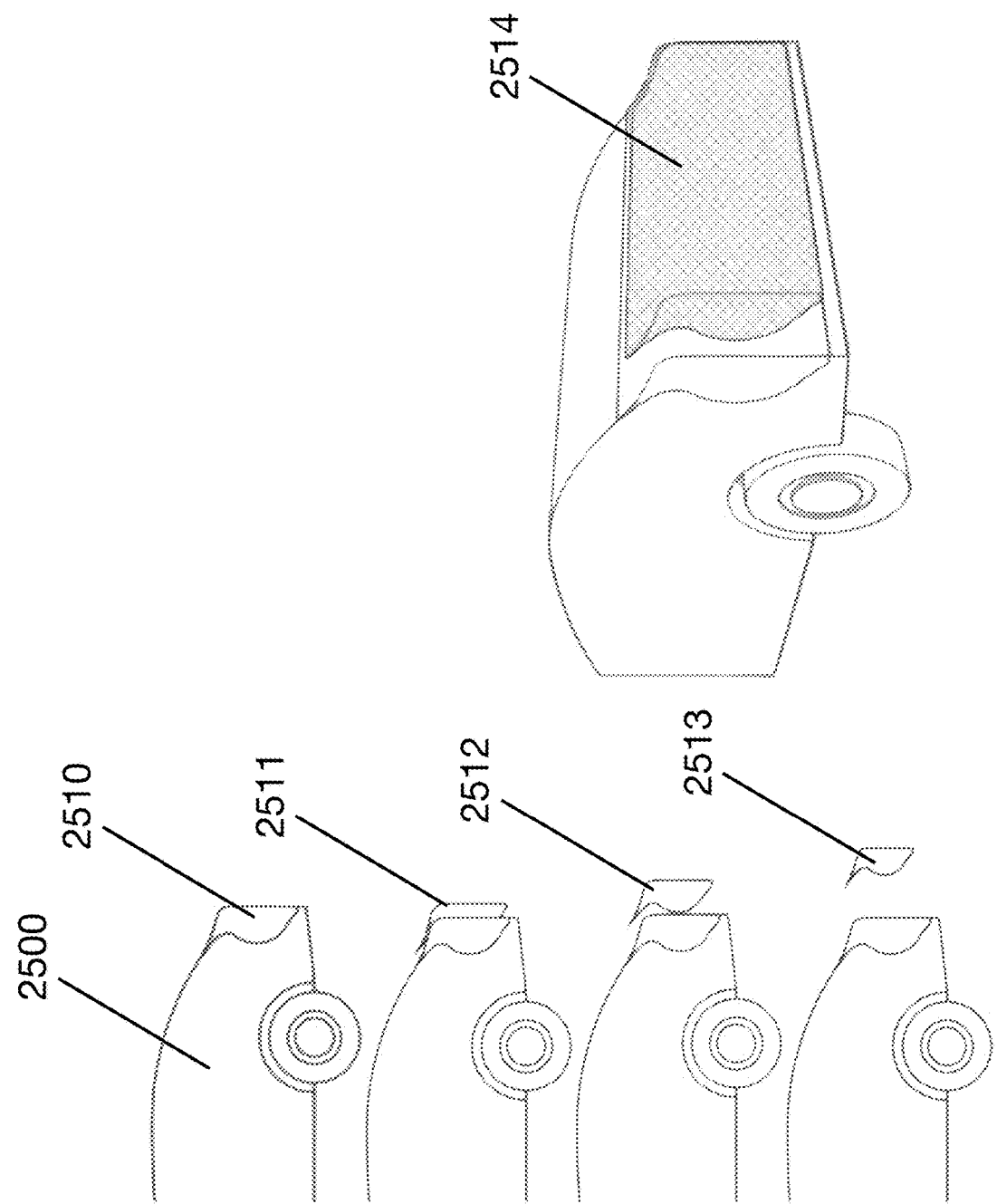
FIG. 25 shows an alternate illustration of a vehicle showing two points of view.

As shown in FIG. 24, the tail on the car is shown with the indicator image generated by the light field components in two different positions 2101 and 2102.

And in an alternative view showing two points of view, a car 2500 is shown with a light field array 2510 on the rear of the vehicle. This array could appear to be floating off the back of the vehicle 2511 and could extend further behind the vehicle 2512, 2513 as the car reaches traveling speed. This can be used as a design element or as an indicator to other vehicles and pedestrians.

Figure 26:
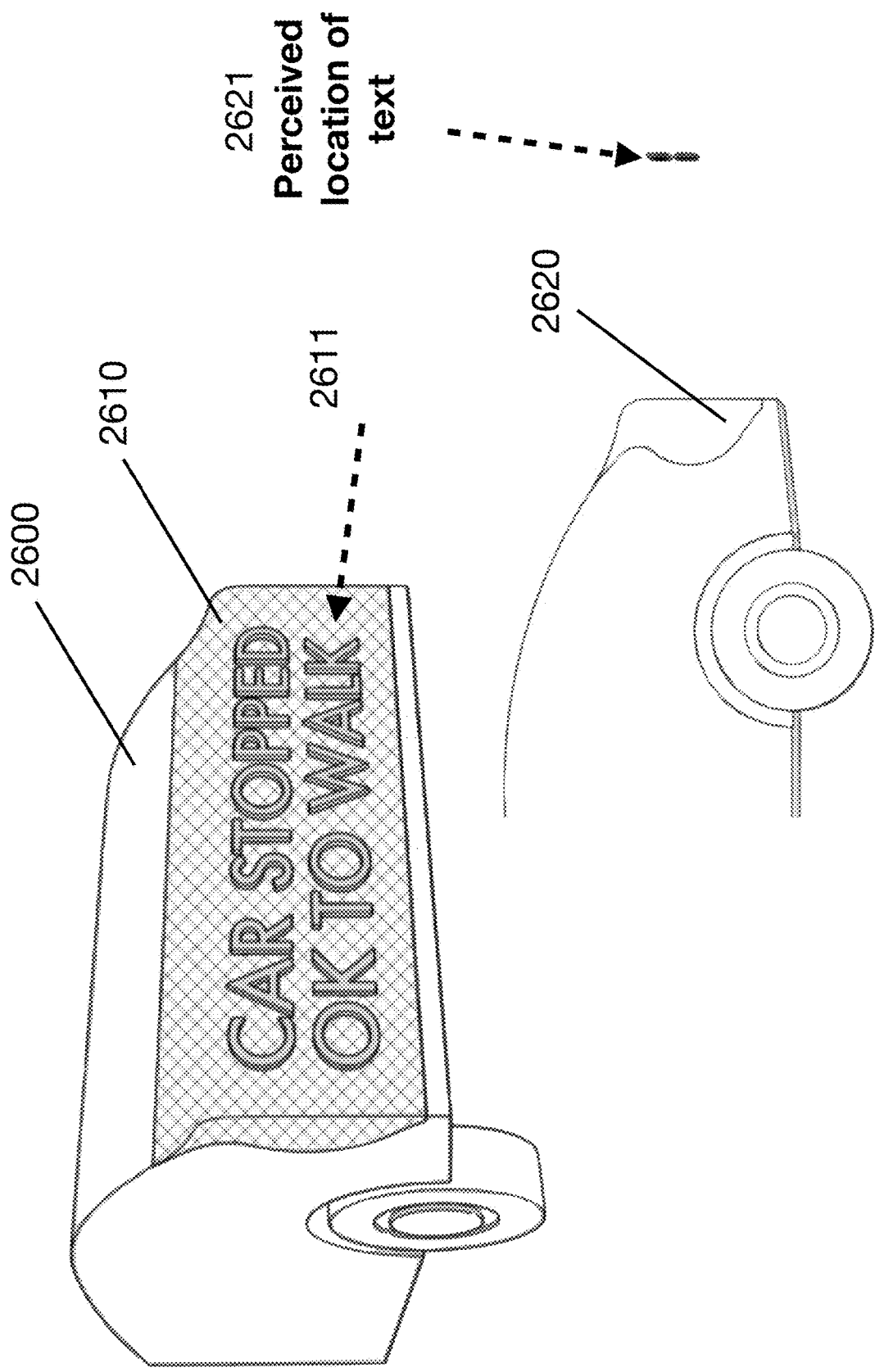
FIG. 26 shows notifications in an automotive application.

FIG. 26 shows notifications in an automotive context using the system herein. One way of delivering information from a car 2600 is text. A vehicle with a light field array 2610 on the rear of the car could display text 2611 so that a pedestrian would know that the autonomous driving system on the vehicle senses the presence of the pedestrian. A pedestrian might perceive the text 2621 as floating several feet behind the vehicle.

Figure 27:
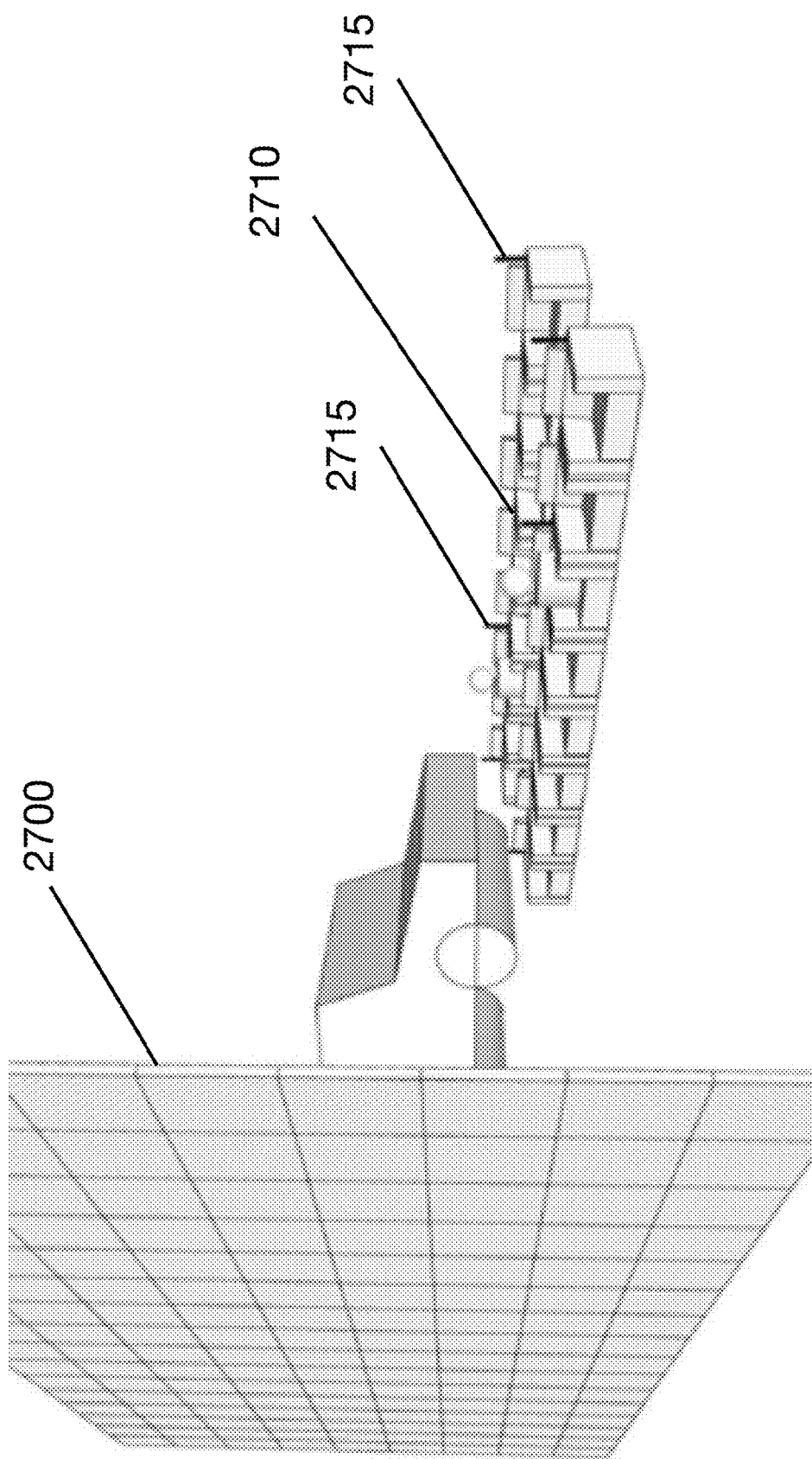
FIG. 27 shows a system calibration.
Figure 28:
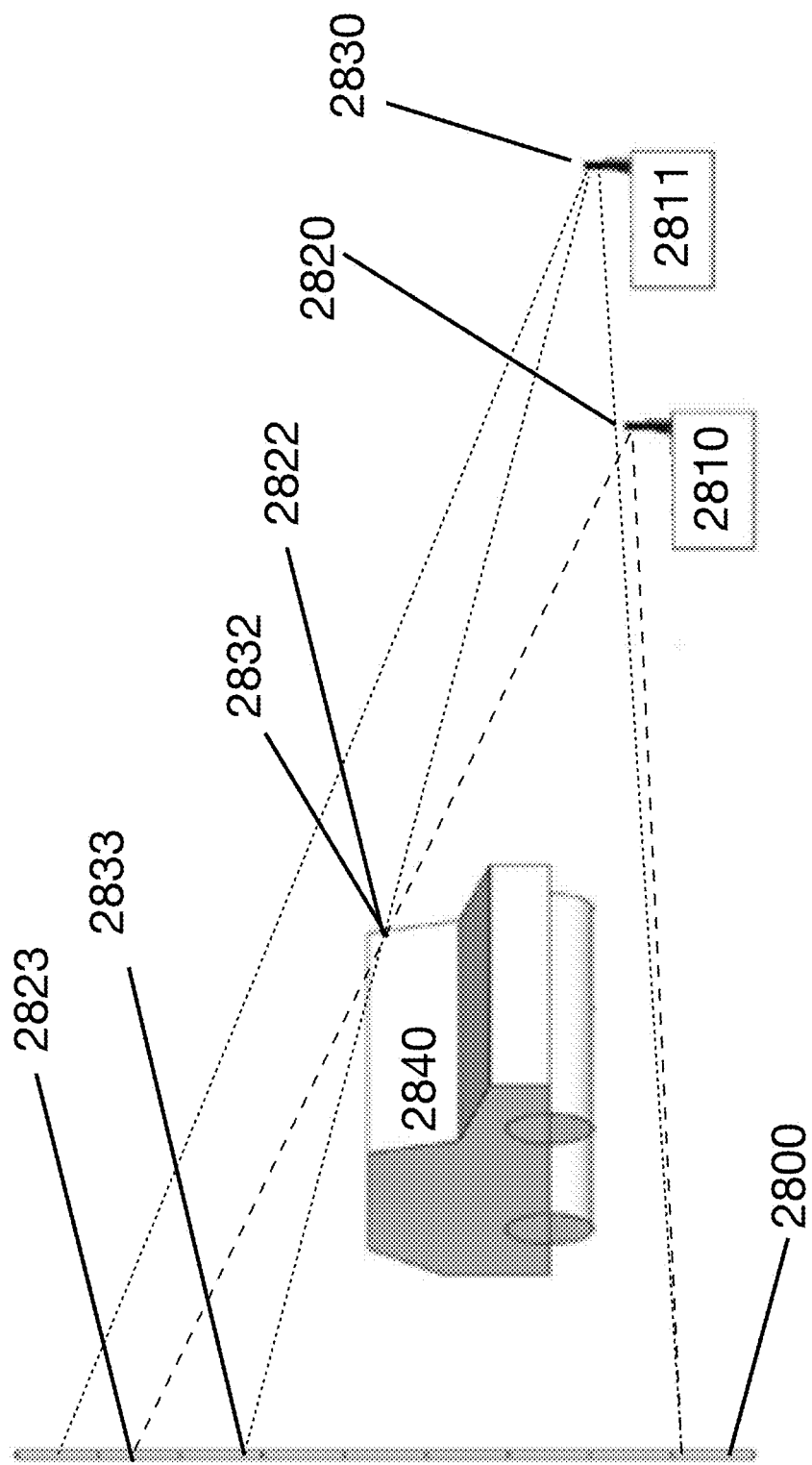
FIG. 28 shows calibration by seat.

FIGS. 27 and 28 show calibration techniques. As seen in FIG. 27, in addition to the internal calibration of the light field pixel, a system installed into a theater 2700 may also need to be calibrated so that the array aligns with the seating plan in the theater. This may be particularly important with theaters where the seating plan 2710 changes depending on the performance. In this case the seats could have sensors 2715 built in or added as needed in order to reference the display to the seating plan in the space.

As shown in FIG. 28, the calibration of the screen 2800 to the seats and the individuals in the seats 2810, 2811 may be critical. There are multiple possibilities to do this although a system including sensors in the seats 2820, 2830 is straight forward. In this system reference content 2840 is used to calibrate the system so that seat 2810 sees the correct part of the video 2822 as displayed by a pixel 2823. For seat 2811 the same point in the test content 2832 is displayed by pixel 2833. Sensor 2830 gathers this calibration data for seat 2811 and sends the data back to the processor where adjustments are made as needed. The processor contains a map of the space that merges the physical space and the digital test content into a single map. So adjustments made in this digital map immediately effect the rendering of the content. This becomes part of the installation processor for any system composed of light field pixels.

Application of the Technology

Theater—A light field could be used in both popular and artistic theatrical performances placing performers in realistic or abstract scenes enabling designers to mount plays where the physical sets may have been too challenging.

Film—in theory this could be a very effective virtual set because an actor would see everything as it will be in the rendered scene. And the fact that the actor and the camera or cameras could be getting different data means that you could simultaneously capture on green screen while capturing against a 2D virtual background while an actor sees the content they need to see for the scene. In order for this to work well the system may need to operate at the frequency of the cameras so the system must support 24 FPS playback.

Movie Theaters—Beyond the obvious benefit of enhancing the movie theater experience the system can be used to display subtitles to individuals so that two adjacent people may be seeing subtitles in different languages.

Live Entertainment—This could be a part of concert tours enhancing the already video heavy sets used now. A band that did an album in a famous national park could place themselves in the park while dynamically digitally relighting the environment.

Environments—A surface composed of light field pixels could sit behind a physical scenic element. When combined with supplemental lighting a localized physical space could be dropped in the middle of an island or a forest. The windows of a space could be composed of light field pixels given guests at a fondue restaurant in a basement in Cleveland the sense that they were looking out over the alps.

Automotive—As the surfaces of the cars are replaced by more functional materials and the experience of driving in autonomous vehicles becomes more common it will be necessary for the automated vehicles to effectively communicate with the world outside. Pedestrians will need to understand without being able to make eye contact with a driver. Dynamic light can replace that interaction by transforming the light field around a car. This also allows a car to adopt a design profile based on its function. A car used as a branded company transport during the day could become a glowing limousine at night.

Architecture—Hybrid mesh systems could integrate near field light generated by display along with projected light from spot and wash lights to create dynamic lines in buildings creating artificial illumination sources.

In all of these environments the light output could be controlled so that only necessary light field pixels are illuminated. This benefits each of these applications by reducing ambient light levels.

In an alternate embodiment, not shown, the OMP with white light field pixels may be used in an array to backlight an LCD.

MEMs Systems for Micro-Display

MicroLED displays have many potential uses in near field displays and micro projectors in addition to standard emissive displays. The process transferring LED material from a wafer and die stage to the display matrix is an evolving technology meaning that early production may have low yields and that systems may be designed to offset pixel and sub pixel level system failures. LED matrices structured directly on a semiconductor material may be opening up new options in this area but the cost of LED materials is still a factor in the viability.

In a display such as a watch or a phone the pixel density may be such that alternatives to a microLED matrix are limited. The pixel density may approach 10-20 microns meaning that a 2160×2160 display may easily exceed 40 mm×40 mm. Such a system may include some sub pixel level redundancy using 5 micron LEDs but this could be limited and there would be some additional cost in fabricating redundant driver paths.

In a head-mounted augmented reality applications and in variants of micro projection systems there are alternatives to microLED displays. And these alternatives might have a role in larger cinema and outdoor advertising displays.

Such a system could incorporate an array of microLEDs or some other emissive array fabricated on top of a MEMS array. Such a system built in a CMOS process could incorporate the driver architecture along with MEMS based sensor elements that provide feedback over the moment of the MEMS stage where the LED array is mounted. Such a system can incorporate new pixel topologies offering extended color gamut and levels of built in redundancy that will support a microLED display early in the roll out.

Such MEMS groups may be designed in a variety of ways:

1. As groups of individual full color pixels that constitute one section of a larger display viewed directly or through an array of optics.
2. As groups of individual pixels created by scanning a colors as done in a field sequential display
3. As a hybrid of field sequential and full color pixels integrating additional sub pixels to support extended color gamut and white sub pixels.
4. As display where the time domain of each display pixel is a variable.
5. As groups of full color pixels where the scanning overlaps to provide redundancy by scanning areas covered by other full color pixels or extended color pixels.

Addressing such a display may create problems for the display controller, the processing, and codecs. A system with extended color sub pixels may be able to create that color in multiple ways. And content requiring a certain luminance can be achieved in multiple ways in a scanning system.

Some LED display systems use multiplexing since an LED can produce the level of light required for video in a fraction of a second. A driver may control a group of LEDs scanning sequentially through the group and driving four, eight, or sixteen pixels (or more). This multiplexing is a standard function of large-scale LED displays used in advertising, on events, and occasionally in theaters. The MEMS based system described herein uses a time-based multiplexing. The group of microLEDs may scan a range of display pixels switching on and off at appropriate points. In this way it is possible to achieve four to one or eight to one multiplexing. This reduces the amount of LED materials required to fabricate the screen substantially. A screen with 200% redundancy may require only 40% of the LED material.

Figure 29:
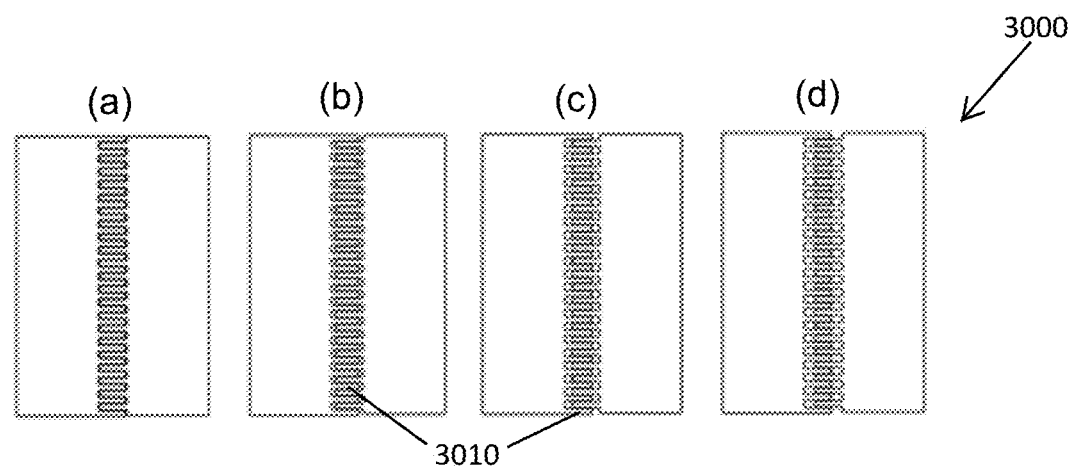
FIG. 29 shows a comb MEMS system at different engagement stages (a)-(d).

FIG. 29 shows a comb MEMS system 3000 at different engagement stages (a)-(d) moving from left to right as the teeth 3010 further disengage. Other MEMS systems may also lend themselves to applications using scanning emissive elements in displays. A MEMS system that rotates (discussed above) could be used or a multi-axis MEMS structure that changes the physical relationship between an array of emitters and an optical system may be used.

Figure 30:
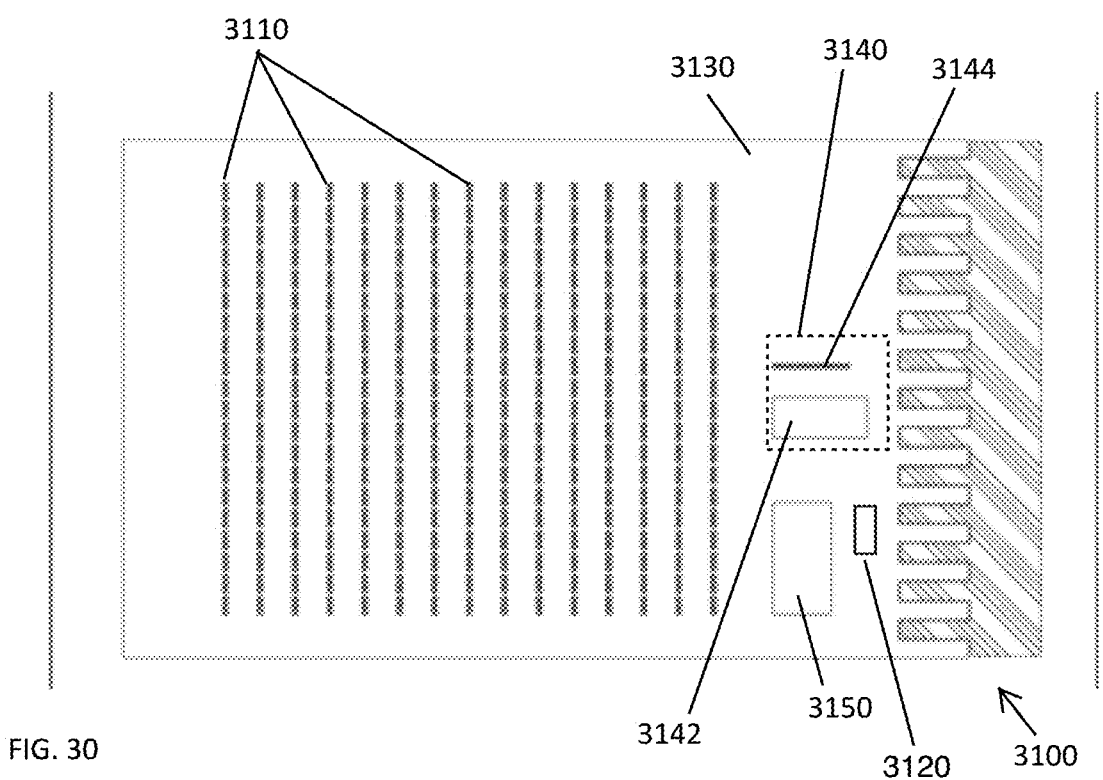
FIGS. 30 and 31 show a scanning array and illustration of components thereof.

FIG. 30 shows a simple scanning array 3100 with columns of RGB pixels groupings 3110, MEMS based sensor 3150, and IR feedback system 3140.

The system 3100 may be composed of a standard grid of light emitting elements in columns 3110 on a MEMS stage 3130 incorporating a CMOS motion sensor 3120 and a series of IR light source 3142 to provide closed loop data to a driver chip 3150 via an IR light source sensor 3142. The IR light source sensor 3142 and the IR light sources 3144 serve as closed loop feedback systems to provide data to control the location and the timing of the MEMS system 3100. Localizing the driver system responsible for this system in the package allows for calibration and timing to be updated in real time. This also allows for the timing to be continuously varied to optimize a display for different types of content.

Figure 31:
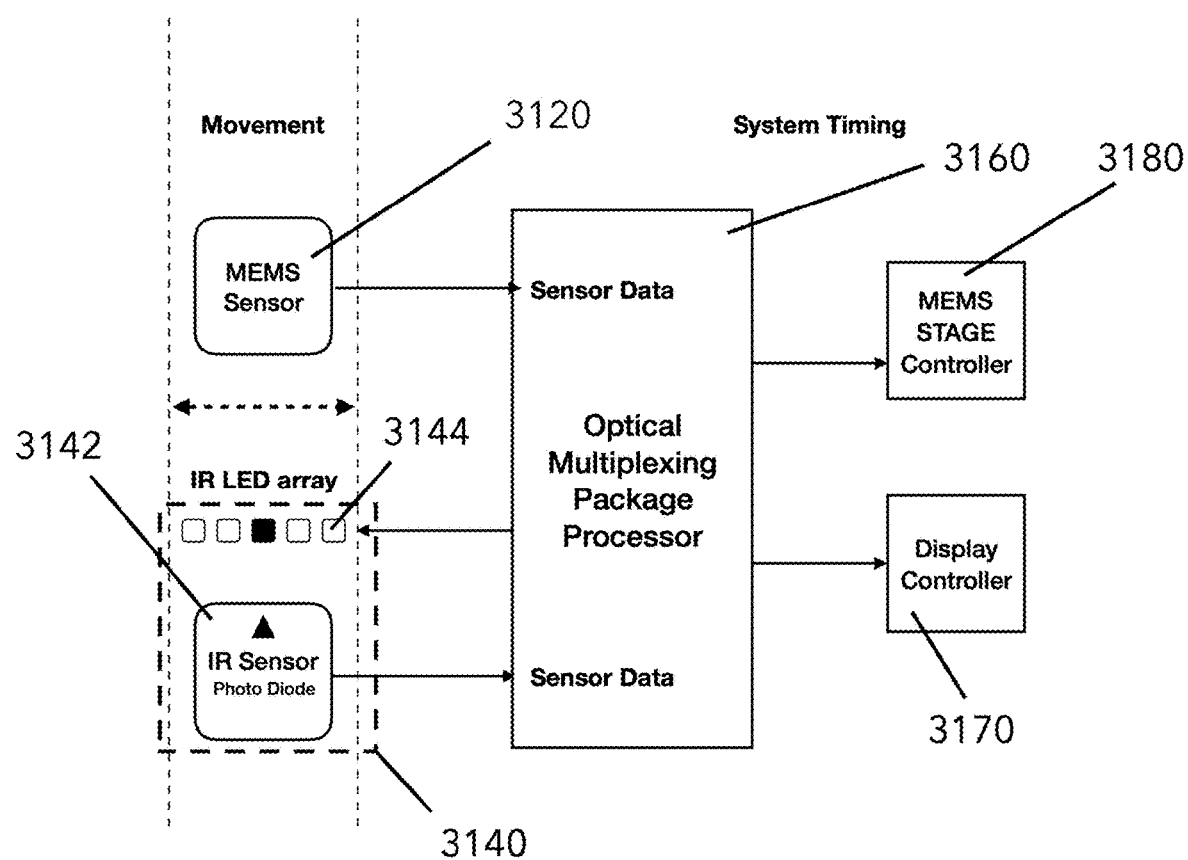

FIG. 31 shows a signal/functional illustration of the system in FIG. 30. Movement indicated by the dashed arrow is part of the function of the optical display package 3160. The movement may be controlled precisely so that the display elements are illuminated in the correct location in the optical system at the correct time. To do this the system may incorporate two sensor systems 3120, 3140. A MEMS based system 3120 built into the CMOS structure itself and a small array of IR LEDs 3144 that face a sensor 3142 on the side of the package.

The sensor data from the MEMS sensor and the IR system are inputs to the processor.

The IR system is controlled by the processor allowing for a closed loop system where the results of the IR sensors can be compared with the results of the MEMS sensor and externally validated calibration data to determine the precise location of the MEMS package during every step of the display process.

The outputs of the processor then drive the MEMS stage 3130 itself and the display controller 3170 as well as the MEMS stage controller 3180. This closed loop system is critical to the timing of the display.

Figure 32:
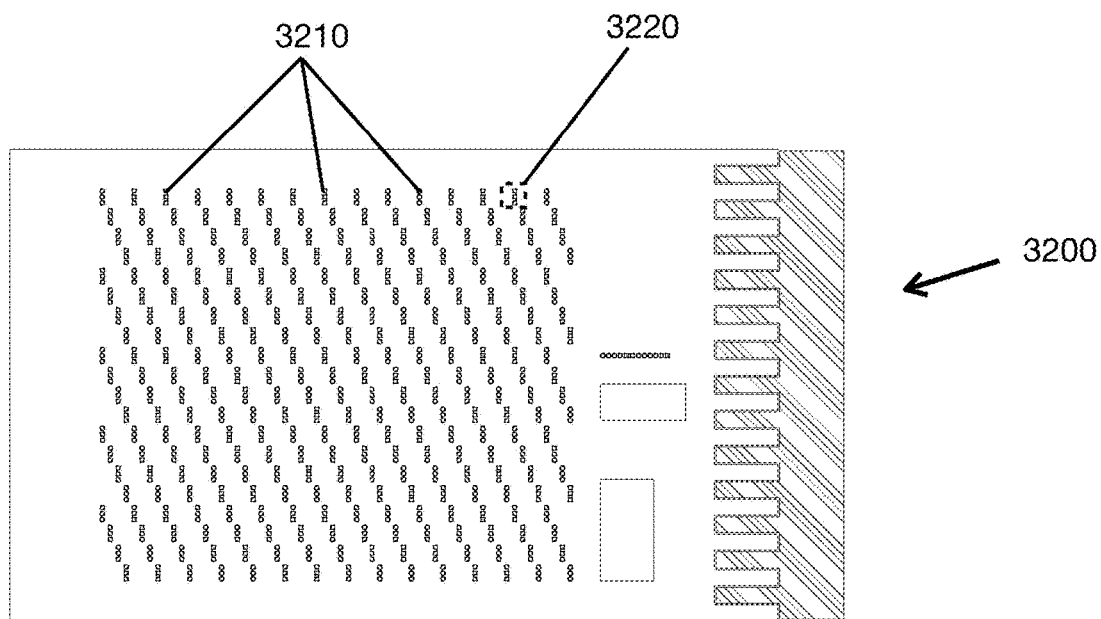
FIG. 32 shows an alternate embodiment of the scanning array of FIG. 30.

FIG. 32 shows a similar array 3200 as that shown in FIG. 30, except that the system 3200's light emitting elements 3210 are offset in an approximately 21 degree grid. In this system array 3200, a single pixel 3220 may not illuminate directly adjacent to another pixel thereby reducing potential optical crosstalk.

Figure 33:
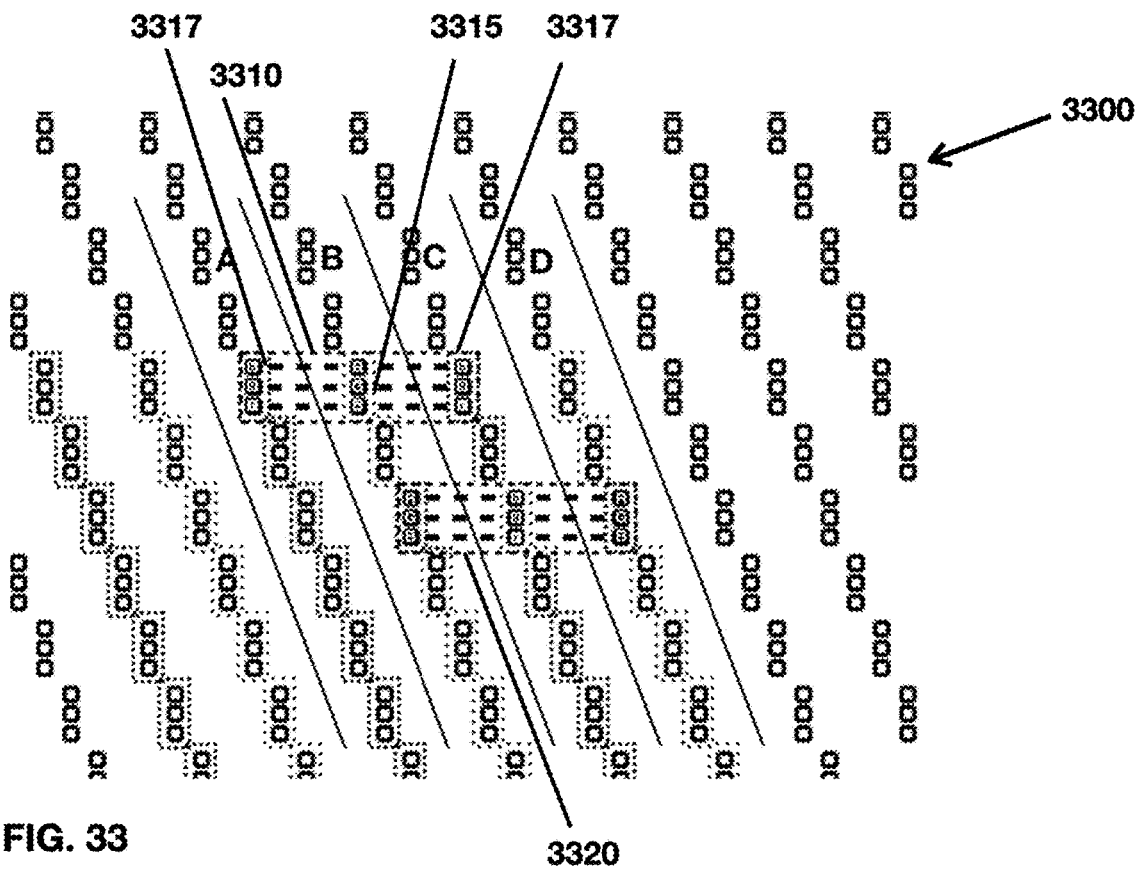
FIG. 33 shows a distributed array with groups of RGB and extended color gamut sub pixel groups, MEMS based sensors, IR feedback system.

FIG. 33 shows a distributed array 3300 with image groups 3310 of RGB 3315 and extended color gamut 3317 sub pixel groups, and may include the MEMS based sensors and IR feedback system mentioned already. This system 3300 is like the system in FIG. 32 except that the light emitting elements are interleaved so that a standard red, green, and blue pixel group 3315 (with individual lighting elements labeled RGB) may scan across the same display pixel area 3310 as two adjacent deep red, deep green, and deep blue pixel groups (labelled bar) 3317. The same would be true of a deep red, deep green, and deep blue pixel with two adjacent red, green, blue pixels 3320. This introduces an element of redundancy while also allowing a system designer to shift the standard blue towards cyan. In this system the colors may also be rotated so that a pixel with a blue top LED is pairs with pixels that have a bottom blue LED. This may help minimize color shift. FIG. 33 also shows a pixel group 3315 in Column B scanning to the left (Column A) and the right (Column C). The pixels groups in Column C would similarly scan covering Column B and Column D. This combination of redundancy with extended color gamut may be attractive.

Figure 34:
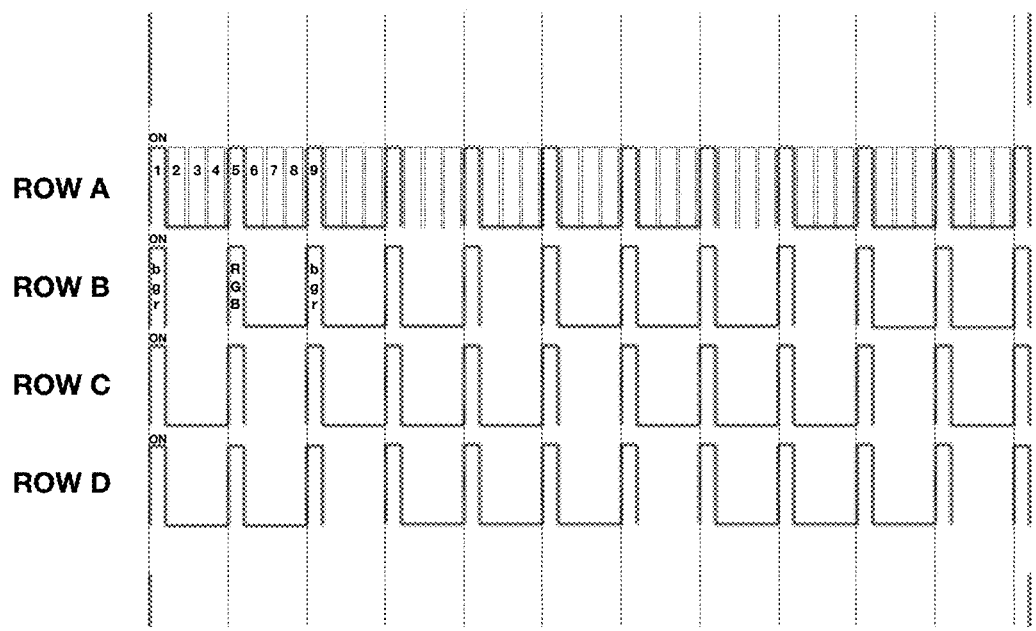
FIG. 34 shows a time domain refresh diagram based on the movement of objects.

FIG. 34 shows a time domain refresh diagram based on the movement of objects. In the system described herein, the LED packages have a high duty cycle and this each LED die may be used to a high degree, depending on the content. So if a normal LED is only on for 1/16th of the time in a typical LED display system the LED package is 15/16th not used. An LED die in a MEMS-based optical multiplexing system may be, by comparison, used 70-80% of the time. In Row B, the bgr and RGB pixel groups are on at the first moment. As shown in Row,A the MEMS system then moves and is on again and again and again covering three additional display pixel locations with the bgr pixel group before getting to the display pixel locating that was initially covered by the RGB pixel group.

Figure 35:
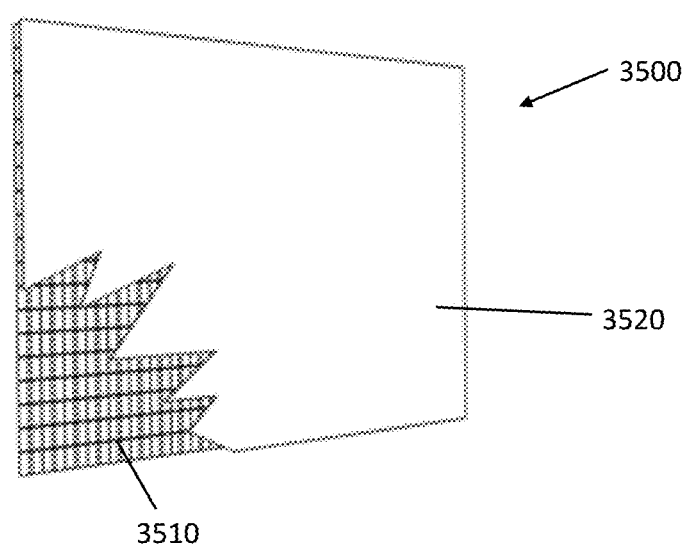
FIG. 35 shows a display including MEMS single pixel array as backlight for LCD.

FIG. 35 shows a display 3500 including a MEMS single pixel array as backlight for LCD. A scanning MEMS array 3510 behind an LCD panel 3520 can be used to create more dynamic range and in the case of a panel with a white sub-pixel, the extended gamut possible in a scanning MEMS based array would allow for increased color gamut and effects, which is possible also in other embodiments herein of course.

Figure 36:
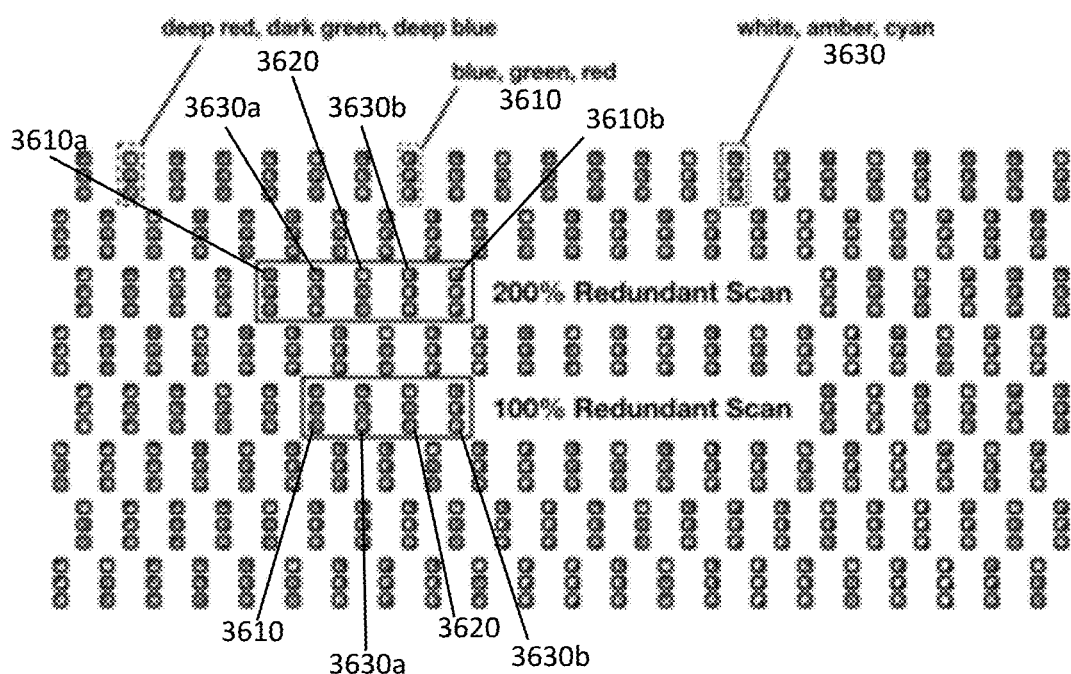
FIG. 36 shows an illustration showing MEMS and microLED xG scanning redundancy.
Figure 37:
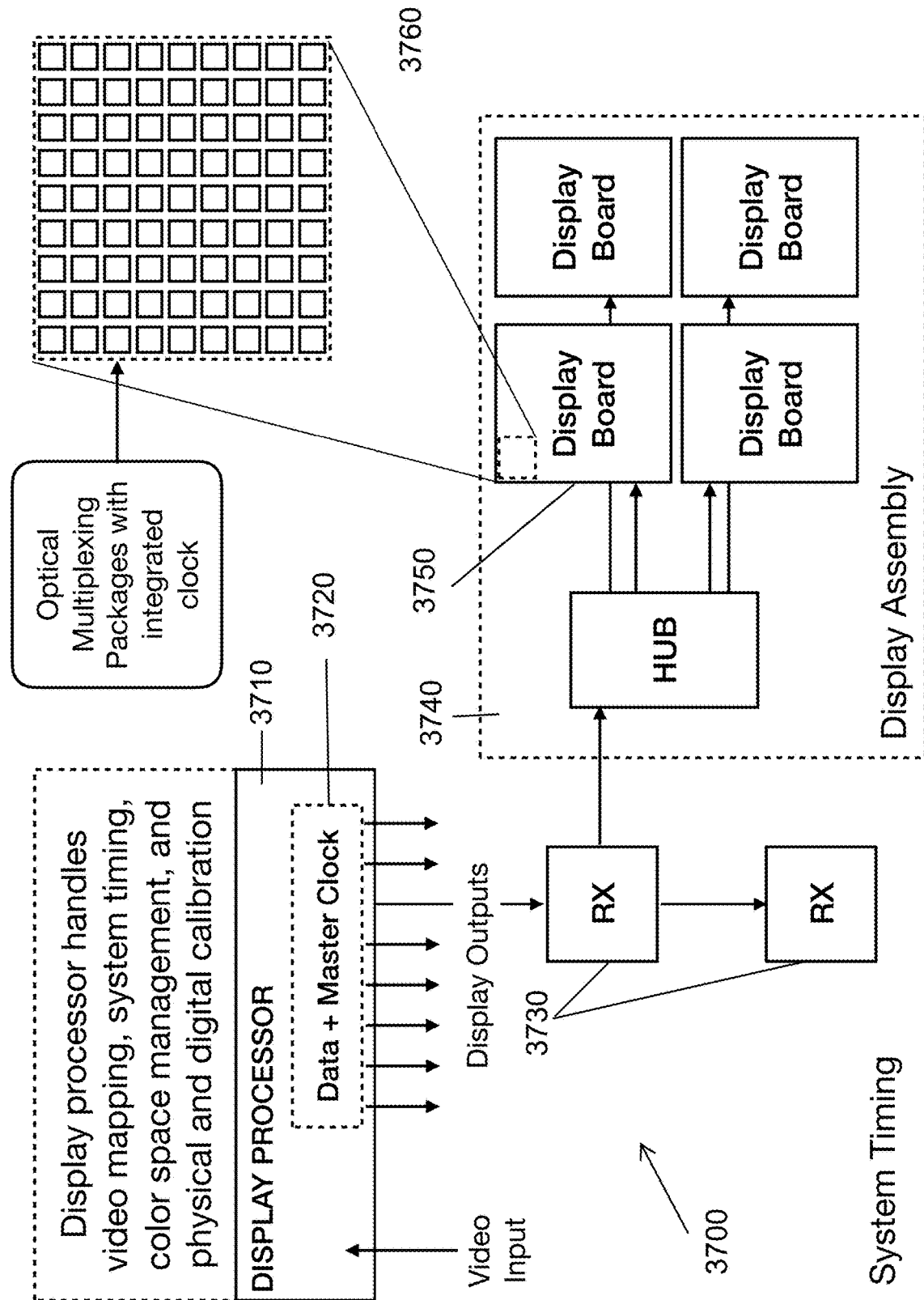
FIG. 37 shows a system illustration with timing details.

FIG. 36 shows an illustration showing MEMS and microLED xG scanning redundancy. This illustration includes three different pixel groups A. a standard red, green, and blue pixel 3610, 3610a, 3610b B. a pixel incorporating deep green, dark blue, and dark red 3620

C. a pixel using white, amber, and cyan—or alternately warm white, white, and cool white 3630, 3630a, 3630b.

The box shown may be thought of as representing the range of movement relative to a single visible pixel group. So that box is scanning back and forth behind that visible pixel.

It should be understood that the scanning MEMS creates the possibility for redundant pixels, that is, a system where an LED on a MEMS is scanned across more than one region of the optical system such that a die in one area is overlapping the same color die in another area thereby providing redundancy. This allows for a choice to be made to support either high frequency refresh or expanded color gamut or redundancy since the scan of the MEMS can be controlled independent of the video refresh rate.

Almost no video display commercially available today is capable of making the color cyan. One example of how a person can see cyan using an RGB based display is to sit in a very dark room staring at a red square on a screen for an extended period of time. After doing this for an extended period of time and turning off the red so the person is left sitting in darkness seeing cyan although the display is now black. RGB based systems attempt to cover some aspects of CMY (cyan magenta yellow) color space but cyan sits outside of a color space that can be hit with typical red, green, and blue light sources.

Figure 41:
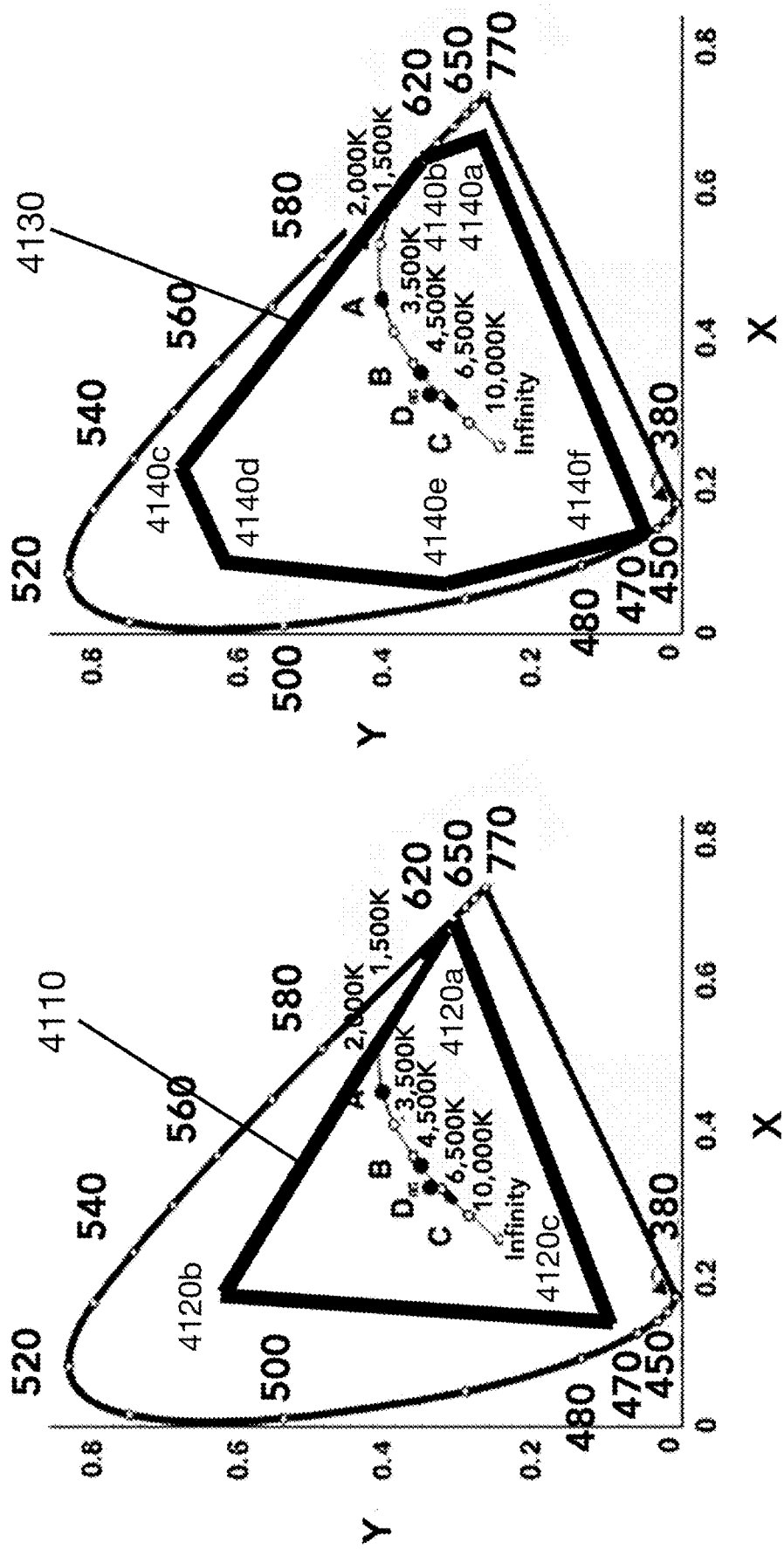
FIG. 41 shows how a standard color gamut may be compared to an expanded one.

As shown in FIG. 41, a standard color gamut may be compared to an expanded one that is available using the system described herein. In an RGB color system the color space available within the display can be described as a triangle 4110 on a CIE chart where the positions of the specific red, green and blue sources 4120a, 4120b, 4120c define the corners of a triangle. If you add a fourth color outside that triangle you expand the color space. If you add a fifth color outside the color space you may expand it further, and so on, until the color space may be bounded by a polygon 4130 as shown on the right bounded by sources 4140a, 4140b, 4140c, 4140d, 4140e, and 4140f. There are advantages to expanded color as noted in the example using cyan.

By using a pair of red, green, blue triads with different X,Y coordinates in the CIE chart we can expand the color gamut while providing some level of redundancy. Using a phosphor converted white 10,000 kelvin LED may also add more power efficiency to the overall system.

The proposed system combines the ability to extend color space with cyan, amber, deep green, dark blue or royal blue, or a cool 10,000 kelvin white with the ability to provide redundancy across individual microLED pixel groups. This solves several problems and creates some new ones. For example a screen with extended gamut may be able to create a source color in multiple ways and this will need to be addressed in a consistent manner across the screen.

The redundancy may be tied to the refresh rate of the screen. It is possible that a screen running at 60 Hz may only be able to offer 200% redundancy, as shown with the repeating duplicated first and second white, amber, cyan pixels 3630a, 3630b, and the repeating duplicated blue, green, red pixels 3610a, 3610b. Similarly a screen running at 120 Hz may be able to offer 100% redundancy with repeating duplicated first and second white, amber, cyan pixels 3630a, 3630b. This is because the movement of the MEMS stage is defining the refresh rate of the display. This may also mean that processing in the OMP may allow the package to refresh different parts of the image at a different rate.

The optical multiplexing system may maintain timing of at least 300 Hz to 600 Hz to maintain high frame rates in a screen spanning thirty meters built out of components smaller than 10 mm×10 mm. A screen this large may have over 4 million individual display modules to be synchronized and the technology that will evolve to allow ever smaller components creating larger with higher densities of optical multiplexing packages.

Such a system 3700 may include a display processor 3710 that itself includes a master clock 3720 that can be maintained across a large network through display outputs that are received by receiver cards 3730, each of which may be in communication with display assemblies 3740. An optical multiplexing package (OMP) display assembly may contain a primary processor but also a secondary display processor and a series of sensors that provide immediate feedback on the status and position of the MEMS stage, in addition to individual display boards 3750 that include lighting elements 3760.

LED displays systems often use a clock in the driver architecture to determine at what point the system displays a frame of video allowing the system to load the frame across a large quantity of discreet components and then display the frame as a single screen in a synchronized manner.

A MEMS based system may include a number of features that can be achieved by managing the scanning of the MEMS along with the illumination system. In addition to providing redundancy and increased color gamut, the system can also scan at different rates to optimize around the video content so the system can shift between 30 Hz, 60 Hz, and 120 Hz or 25 Hz, 50 Hz, and 100 Hz. The system can be optimized around power efficiency, high refresh rates, dynamic visual range, and other factors.

Figure 38:
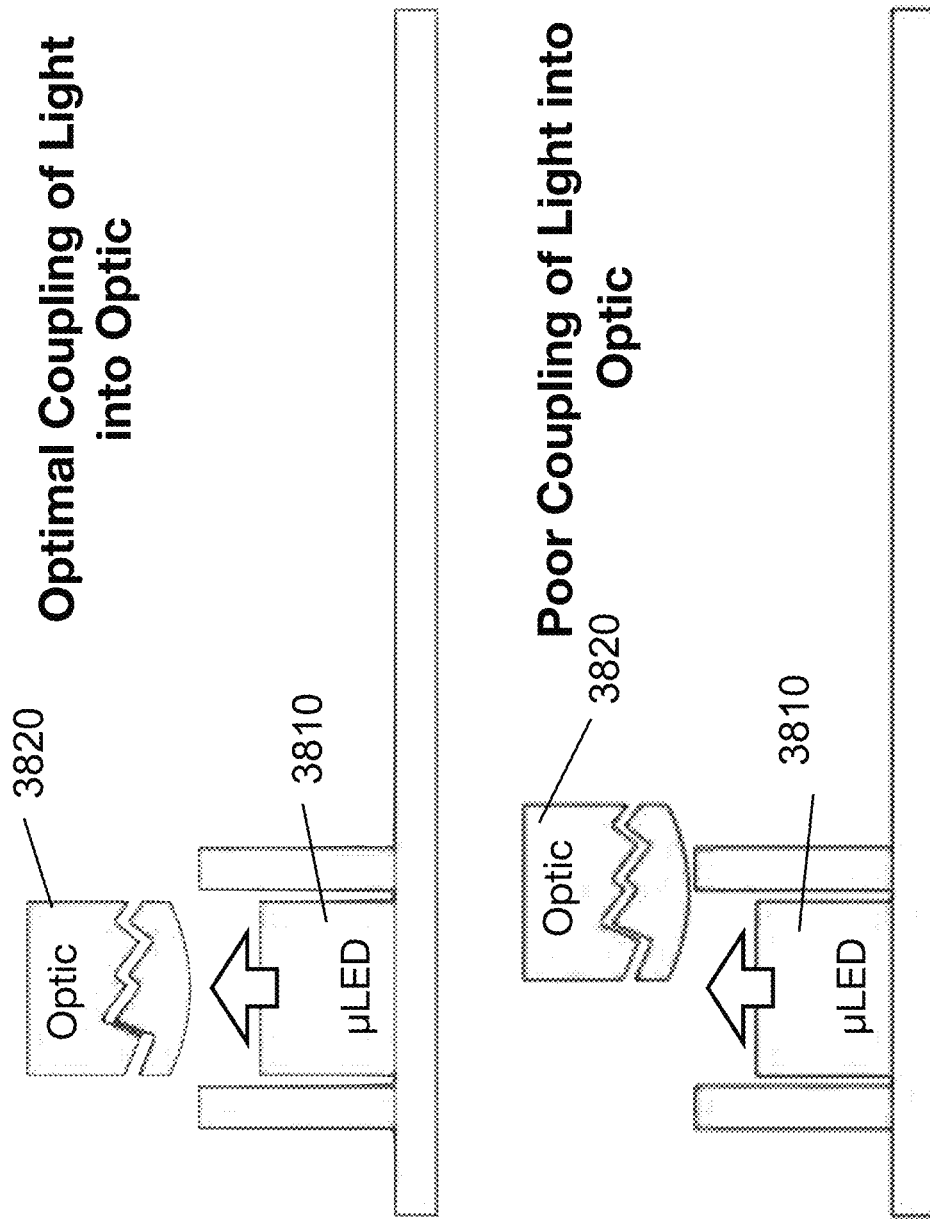
FIG. 38 shows an illustration comparing a non-aligned and aligned optic.

FIG. 38 shows an illustration comparing a non-aligned (bottom) and aligned (top) optic. Another benefit of the scanning system is that the emissive components in the display may only be on when the display elements are optimally aligned with the optics or when the elements are poorly aligned with the optics allowing for the creation of different effects relating to focus. For example a microLED 3810 centered in the optic 3820 will be crisply in focus (top)

but light entering at the edge of the optic from a poorly centered microLED will not be focus (bottom).

Color Shifting

Figure 39:
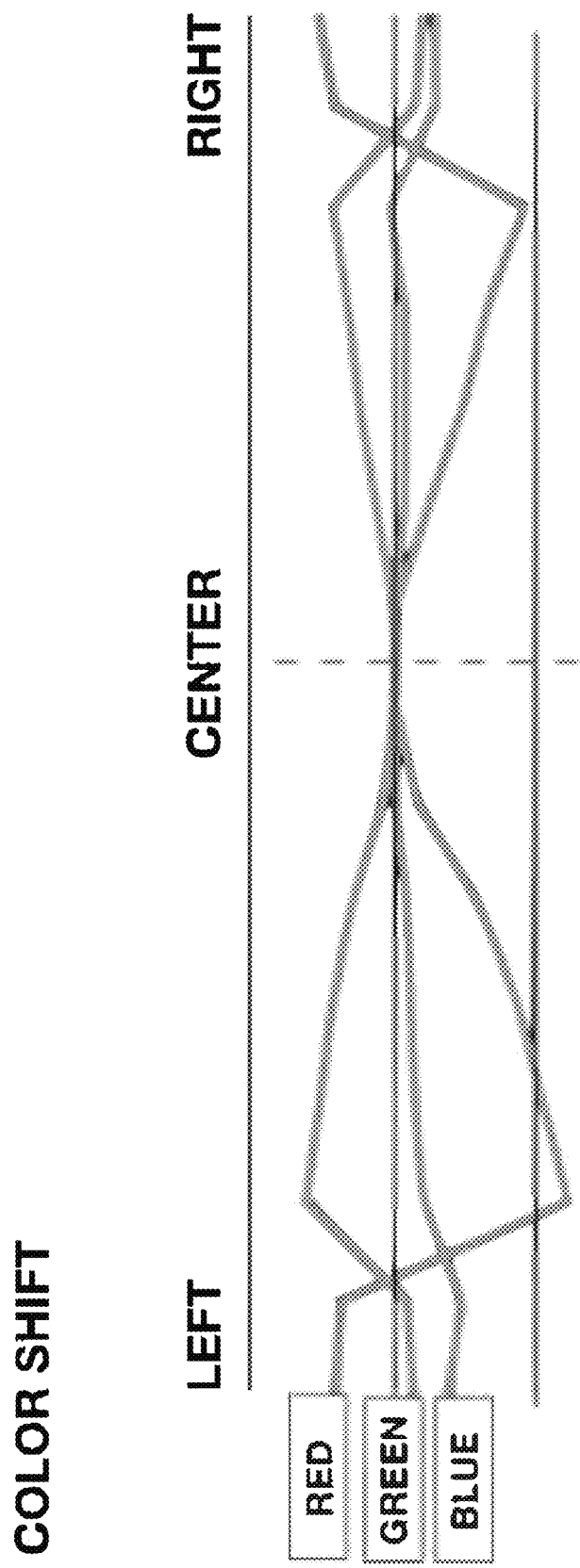
FIG. 39 shows relative luminance per color of a typical RGB LED package as a viewer deviates from the center viewing position.

FIG. 39 shows relative luminance per color of a typical RGB LED package as a viewer deviates from the center viewing position. From a straight on viewing angle (CENTER), the red/green/blue components are equal to each other, thus making a white pixel. However, from the LEFT or RIGHT, the luminance fall-off of each color component is radically different from one another. This is due to physical wire bonding, die size of the actual light emitter component, and/or physical limitations of the LED mechanical package itself. While this off-axis color performance is normal in the LED industry, it is something that can be dramatically improved upon based on the system described herein.

Color Shift by Angle

Figure 40:
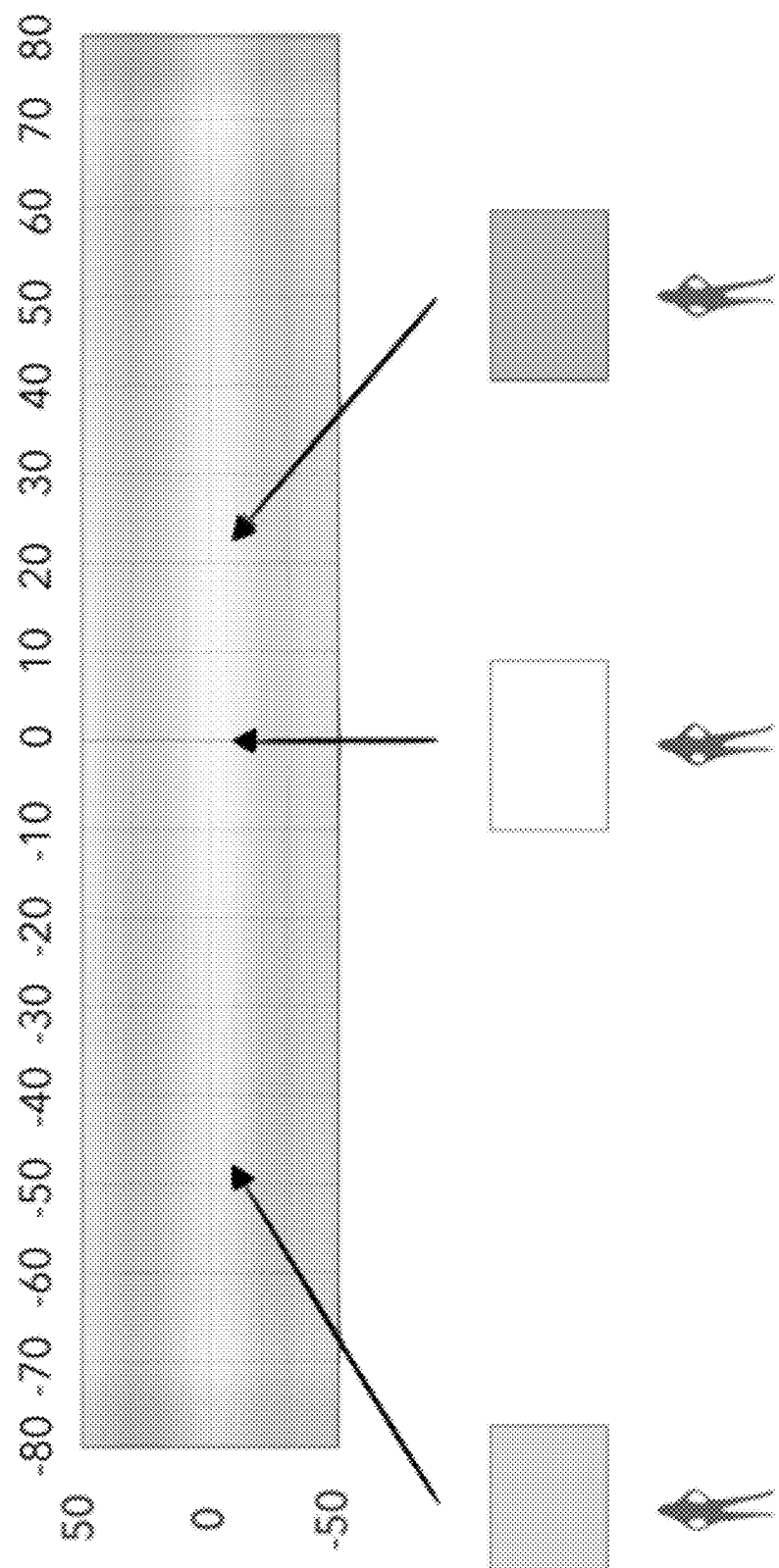
FIG. 40 shows how any viewing angle other than 0 degrees will not be representative of uniform white.

FIG. 40 shows how any viewing angle other than 0 degrees will not be representative of uniform white. This means that for a large format display with more than a straight-on viewing angle, it is not possible for current LED technology to yield a uniform flat field color that is predictable. This can be especially difficult for branding in which company logos are not the correct color from different viewpoints. As shown with three viewers in the figure, in one case, a center viewer could see an accurate color. In another case from the left, or a lower position, a viewer may see a cyan tinted variant. In yet another case from the right or an even more extreme angle, a viewer may see a blue or green hue instead of white. In a time when most savvy content consumers are used to a very high quality display in a mobile device such as a smart phone or tablet, which yield a very uniform flat field white, a large format LED display may be undesirable or unacceptable for consumption if it is not improved upon.

FIG. 41 shows a CIE chart commonly used to illustrate the color space of a given display. This color space is represented as the area within an area defined by the locations of the three primary colors used in the display. Small movements in the display can extend or limit the color that can be produced in the display. One method of expanding the color space is to create a multi-primary system. This is done in some laser phosphor-based video projectors creating the opportunity for expanded color gamut or the creation of a stereoscopic image using two discrete filters to create left and right eye images. The other CIE chart displays an expanded color gamut system possible in the described optical multiplexing package. Each primary region (red, green, and blue) has two sources separated to optimize the color rendering of the finished display.

Figure 42:
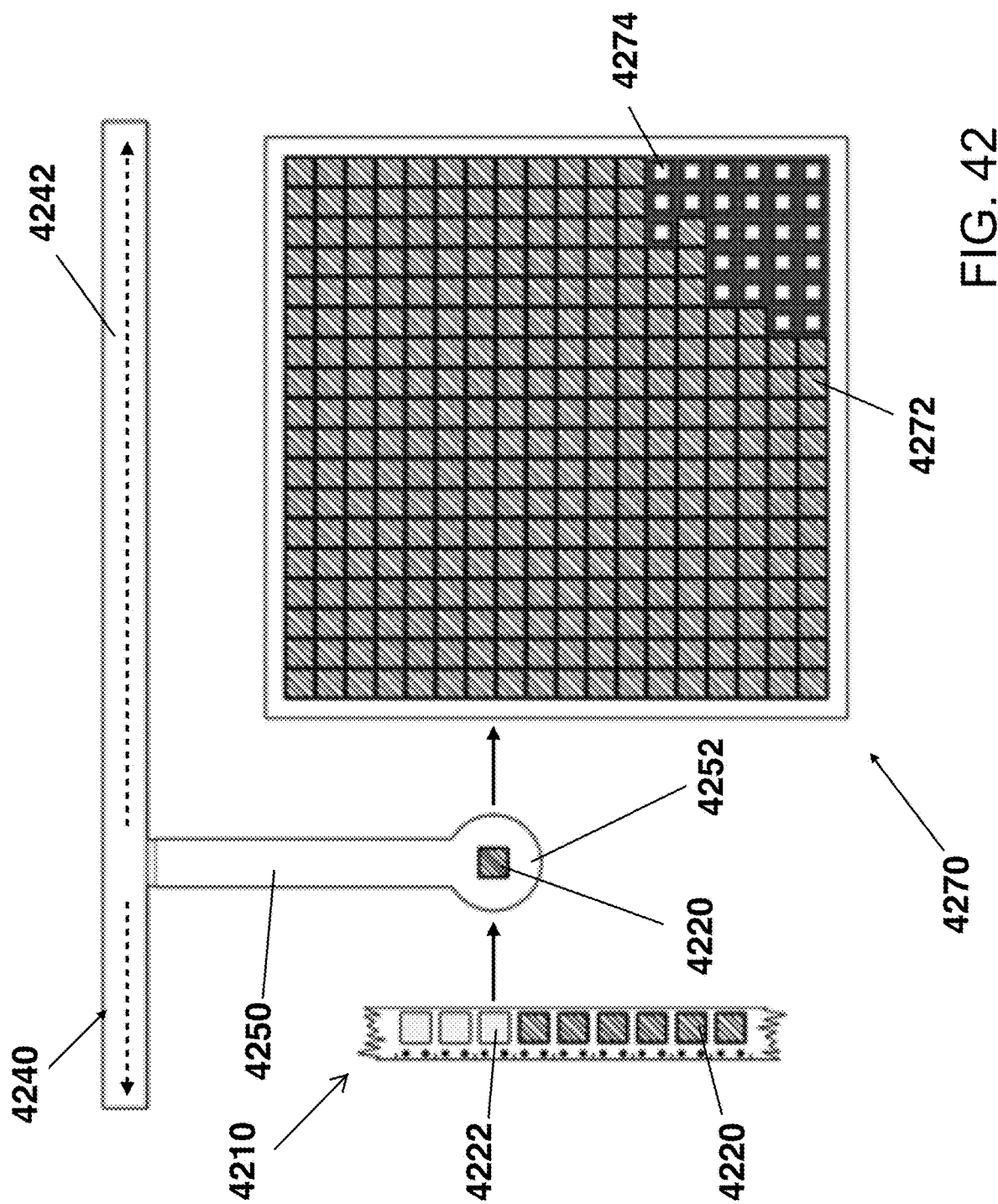
FIG. 42 shows a surface mount display assembly system.

FIG. 42 shows a surface mount display assembly system. In the system, there may be a tape reel 4210 with optical multiplexing packages 4220 thereon. A placement system 4240 includes a placement arm 4250 with a head 4252 that picks up OMPs 4220 from the reel 4210 and places them on a PCB 4270 as it moves along a track 4242. After removing an OMP 4220 from the reel 4210, there is an empty space 4222 where the OMP 4220 was. After removal, the reel 4210 advances so the placement system 4240 can retrieve the next OMP 4220. The arm 4250 moves the OMP towards the PCB 4270, and in particular an empty space 4274 that may include solder ball pads for attachment to the OMP 4220, which may include a bonding area in the middle for bonding and thermal management.

The advantage of the system of FIG. 42 is that it can create a display using conventional pick-and-place technology, which is well known but not used in this way in assembly technology.

An optical multiplexing device can also be achieved with the use of a package where the scanning element is constantly moving. The flat package 4301 in FIG. 43 contains an optical stack mounted on a substrate with a centrally mounted MEMS light engine.

Figure 43:
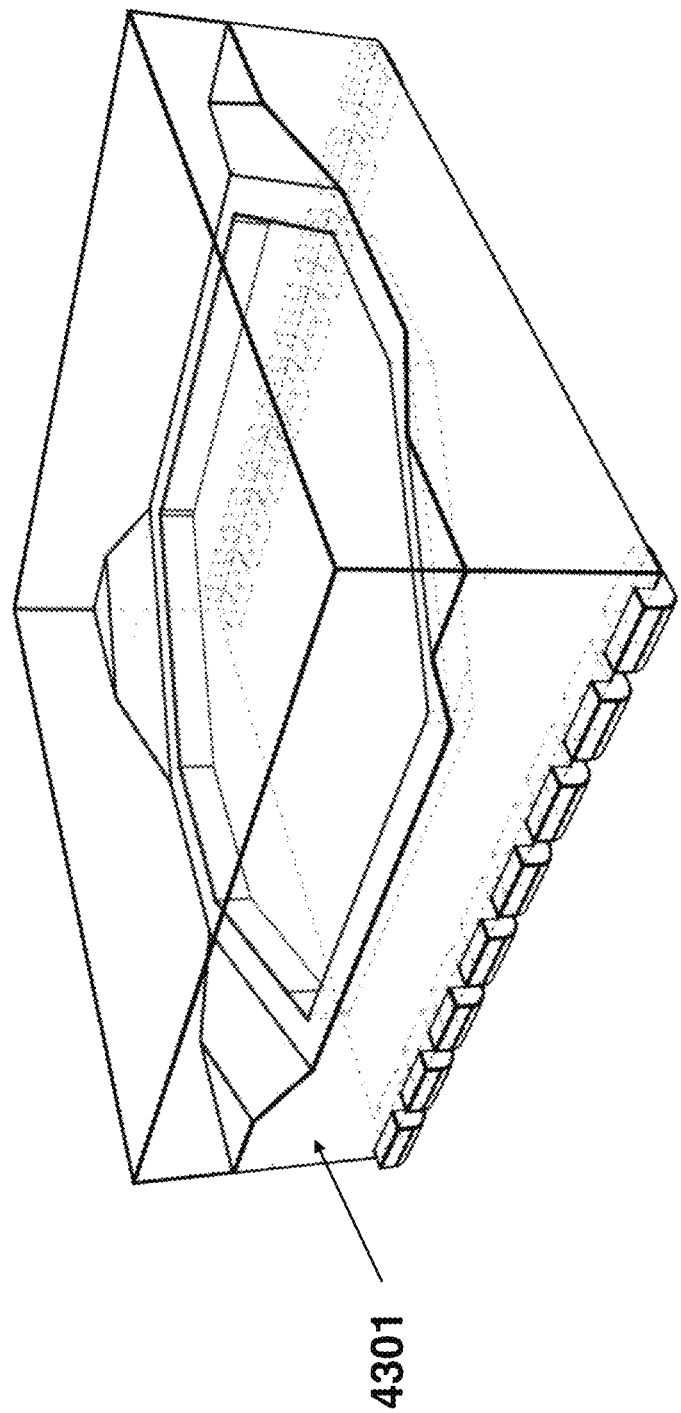
FIG. 43 shows a scanning optical multiplexing package.
Figure 44:
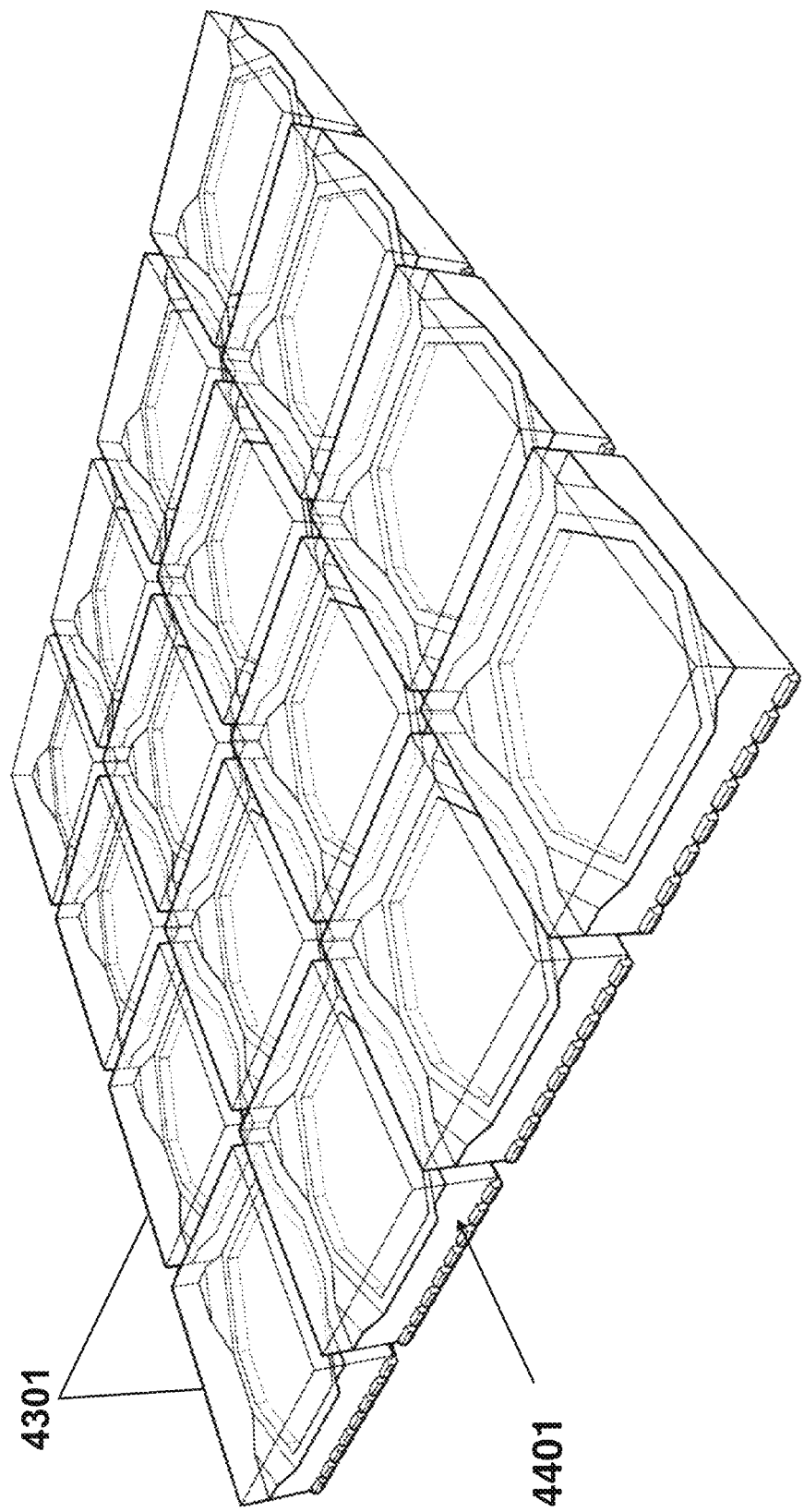
FIG. 44 shows an array of scanning optical multiplexing packages.

The optical multiplexing package from FIG. 43 can be used in an array 4401 as illustrated in FIG. 44.

Figure 45:
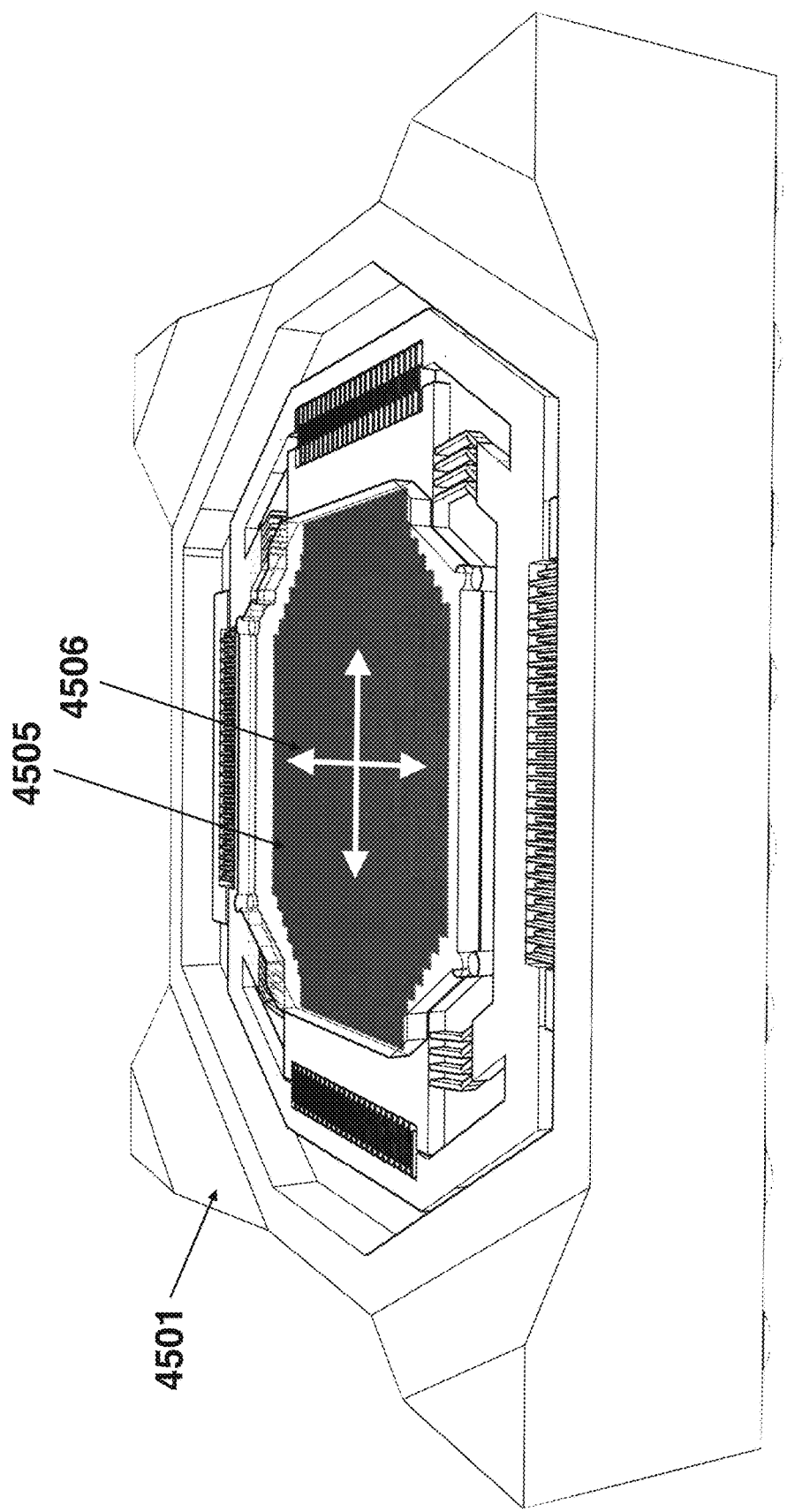
FIG. 45 shows an optical multiplexing package with scanning in two axes.

An optical multiplexing package 4501 illustrated in FIG. 45 is centered around a MEMS system capable of moving an array of light emitting pixels 4505 in one or more axes 4506.

Figure 46:
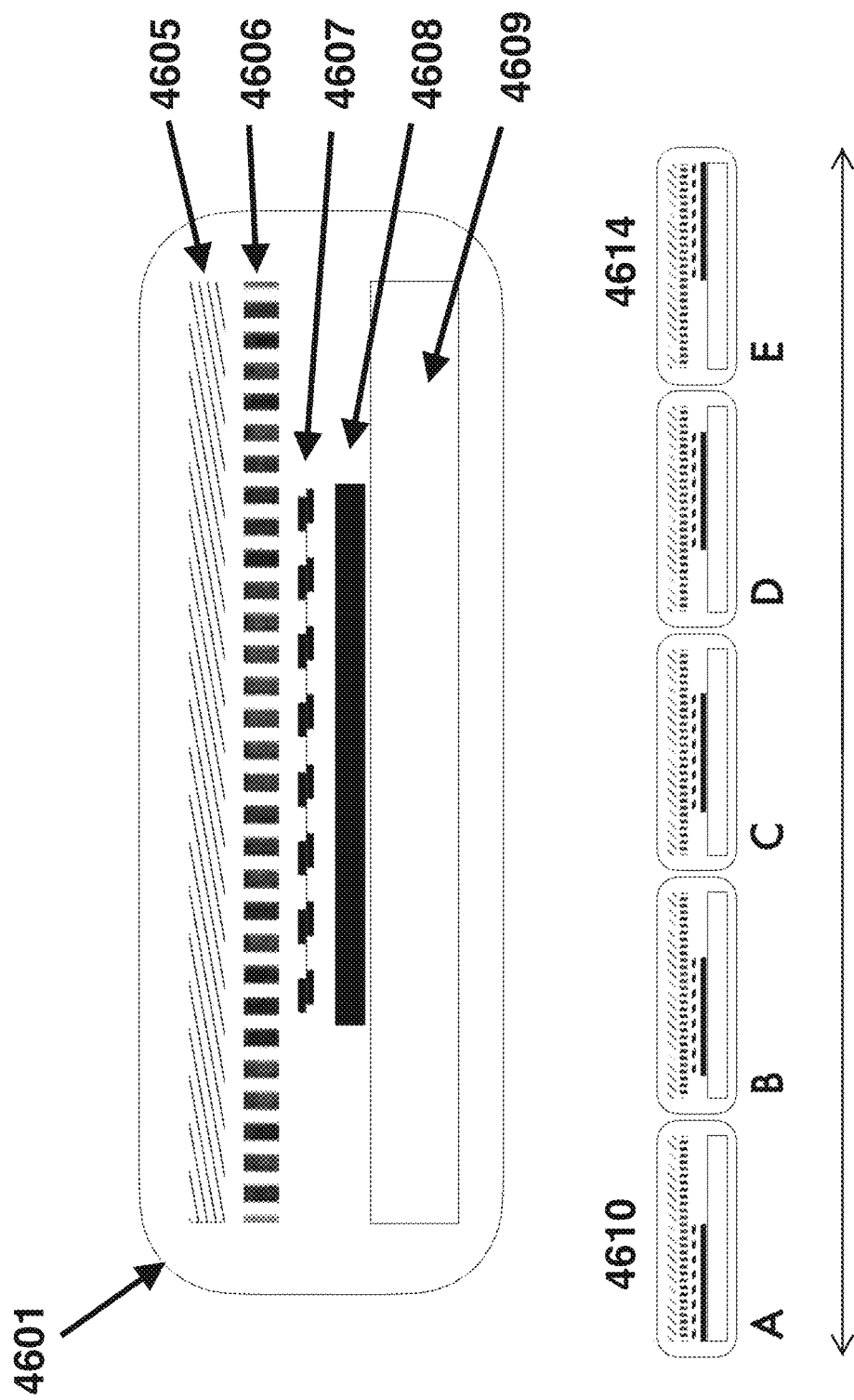
FIG. 46 illustrates the display stack in a scanning optical multiplexing system.

FIG. 46 illustrates a simplified scanning multiplexing system 4601 with a first optical system 4605 on the surface integrating anti-reflective filters and the angular control of emitted light. The second layer 4606 of the optical stack integrates a mask and a microarray of optical elements 4607 collimating light out of the scanning MEMS based light engine 4608. Light from the display elements mounted on the MEMS stage 4608 is projected onto the back of the collimating elements 4607. The package also includes driver electronics 4609. One advantage of this system is that the light source in the MEMS array may be larger than the optical elements on the back of the front optical stack. The movement of the MEMS is persistent (does not stop at a point but is constantly in motion). This may draw light in an interesting way such as what is shown in FIG. 38 where there is optimal coupling and poor coupling. For example, a designer may desire poor coupling for a certain visual effect: Light from the properly coupled light source and light from the sub optimally coupled light source will travel through the system in a different way. This might appear as things being in focus and out of focus.

The stage in the OMP moves from position A 4610 through position E 4614 and back again constantly scanning the back of the optical stack.

Figure 47:
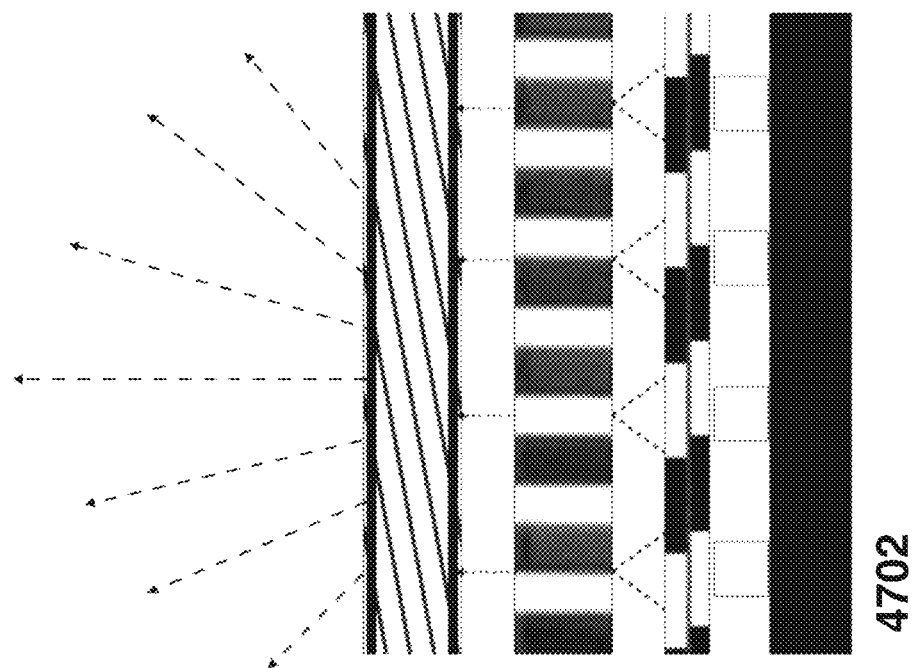
FIG. 47 shows two possible optical arrangements of an optical multiplexing pixel.
Figure 47:
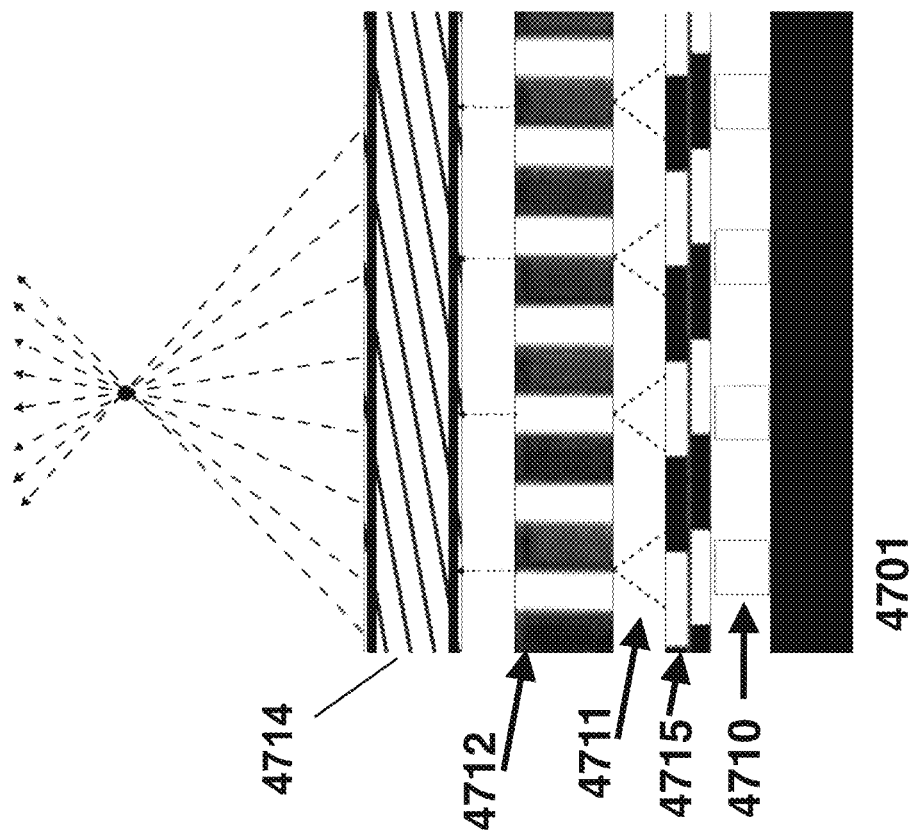

The output of the front of the OMP can be shaped to optimize for different applications. FIG. 47 illustrates one pattern where the rays of light exiting the OMP converge in front of the display 4701 and another illustration where the rays of light diverge 4702 from a fixed point behind the front surface 4714 of the display.

The output of the light source 4710 can be focused 4711 on the back of the optical stack 4712 with a metalens 4715.

Figure 48:
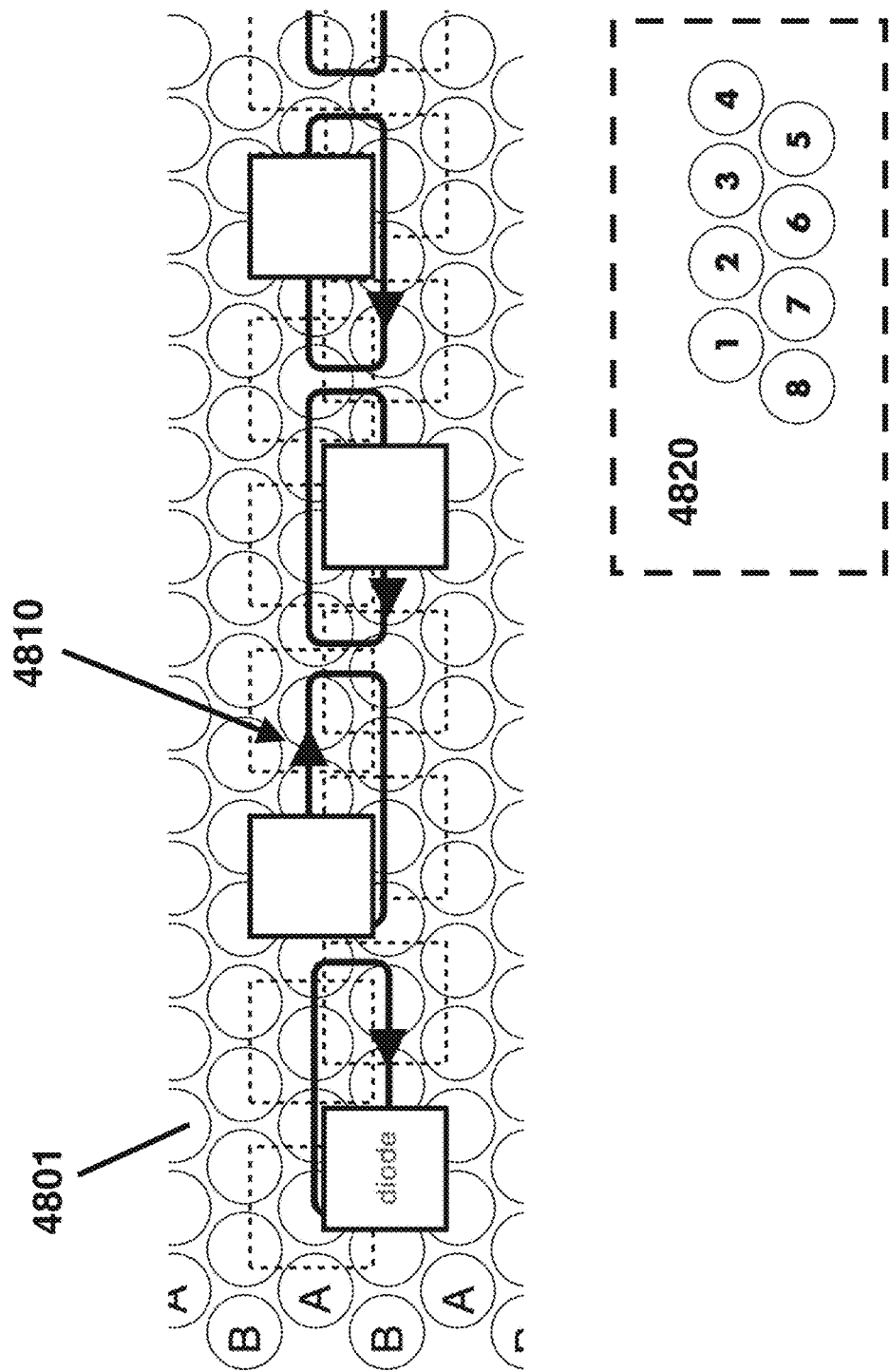
FIG. 48 shows an optical multiplexing system scanning in two axes with a honeycomb pixel arrangement.

In FIG. 48 a system with a honeycomb optical layout 4801 the MEMs array may move in two axes 4810 so that a single group of LED dies can address multiple output windows on the back of the optical stack. Such a scanning pattern may be illustrated as a small loop where a number of light sources address eight output pixels 4820. The movement of the MEMS system and the layout of the light sources may mean that light sources are addressing different output pixels as noted in FIG. 36.

Figure 49:
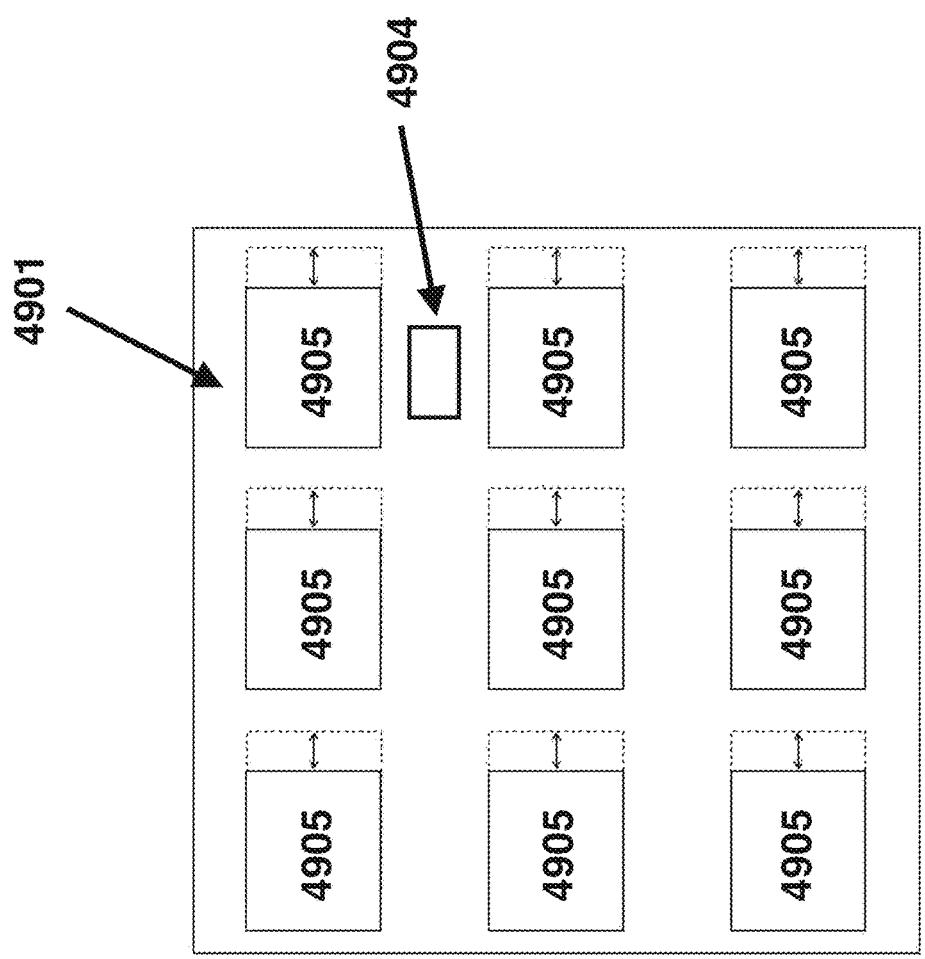
FIG. 49 shows a single optical multiplexing component integrating multiple stages.

FIG. 49 illustrates an embodiment with multiple MEMS are packaged on a single substrate 4901 that would integrate a single driver 4904 for all nine segments 4905 of the device. In this way it might be possible to use larger front optics with arrays of MEMS devices and a spacer system to support the front optics and isolate separate optical cavities for the different MEMS groups.

Figure 50:
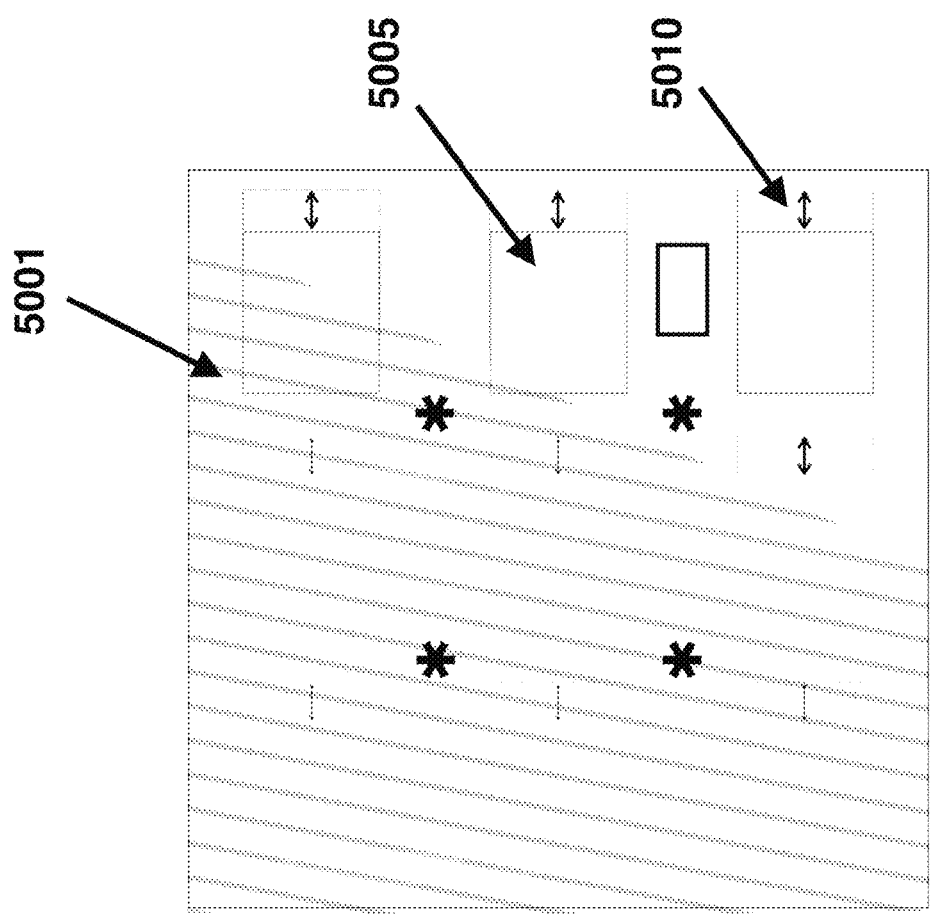
FIG. 50 shows a component with multiple stages integrated behind a secondary optical surface.

FIG. 50 shows an optical plate 5001 over the front of the nine MEMS groups 5005. The optical plate could be a second imaging system such as a liquid crystal display. The nine individual MEMS groups can move independently 5010 so that each can be optimized for the local display requirements. The MEMS group integrates spacers that maintain a constant distance between the MEMS light engines and the secondary surface.

Figure 51:
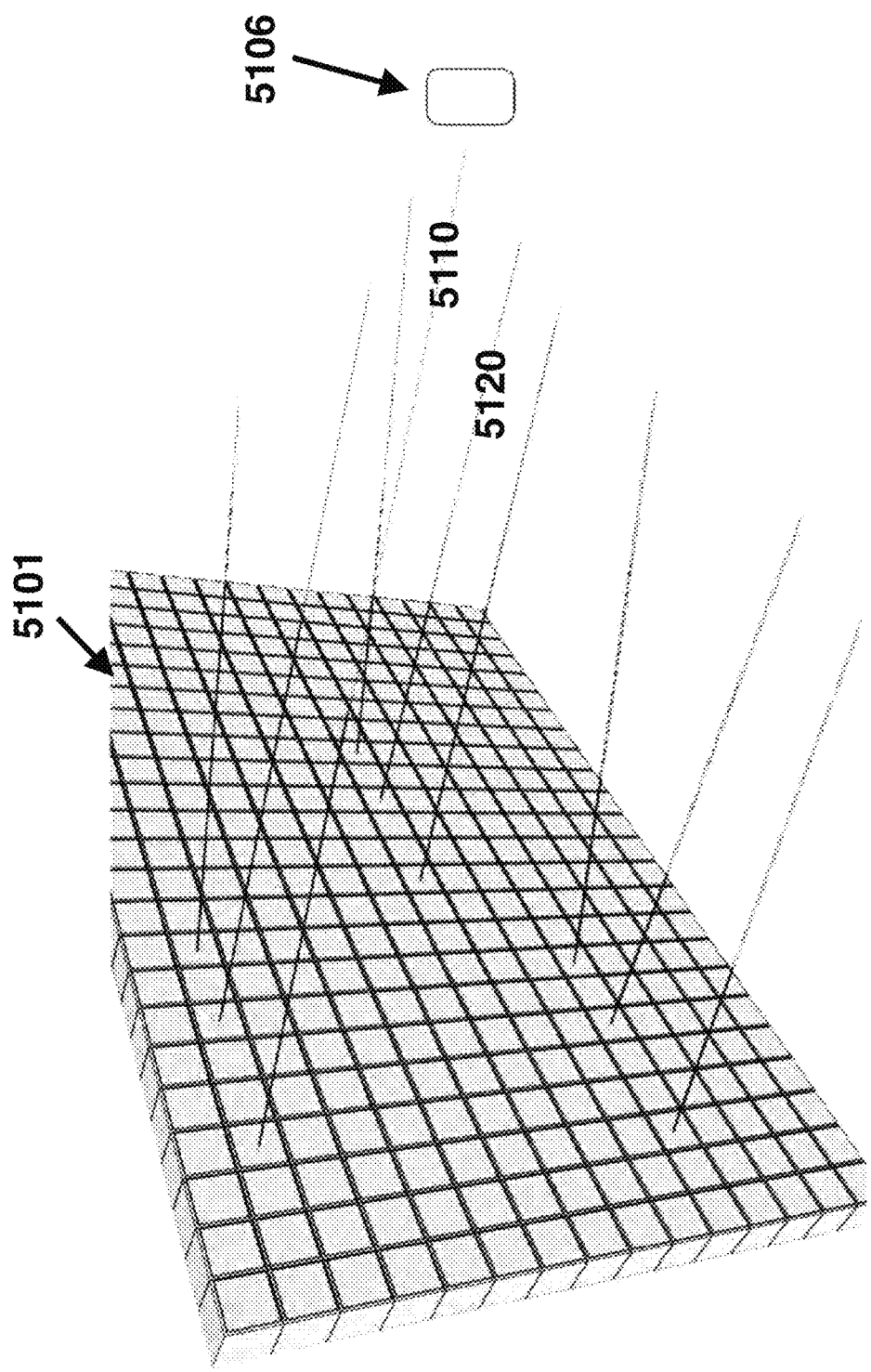
FIG. 51 shows an array of optical multiplexing pixels where the output is used to transmit data as a distributed point to point LIFI system.

FIG. 51 shows an array of optical multiplexing pixels 5101 where the output of the screen is used as a LIFI system to communicate with sensors in the room. Individual rays of light 5105 are only visible from defined points in the room. A sensor 5106 will pick up one ray of light 5110 but not another ray of light 5120. This can be used as part of a calibration process and to time in other systems in the room when the system is used as part of a larger immersive environment. The high angular resolution of the display allows for the system to localize information so that data may be delivered to a single point in a room. Such a system could be integrated with accessories worn by viewers of the display.

The angular resolution of the display creates a data transmission system where a ray of light may only be sensed from a single location in a space and that by illuminating a one pixel that is only visible by one sensor a closed communication channel may be created. This channel can be used for calibration of the display allowing for a simplified sensor array to be used for calibration. This would be an alternative to a camera sensor for example. And since it is possible to construct a closed loop calibration system a sensor in a known position would see only one pixel and to know it is the right pixel or the wrong pixel. Using this information adjustments can be made to the content so that it is viewed correctly in the space.

While the invention has been described with reference to the embodiments above, a person of ordinary skill in the art would understand that various changes or modifications may be made thereto without departing from the scope of the claims.

We claim:

1. An optical multiplexing package having an expanded color gamut comprising:
   an optical lens;
   an array of light emitting elements (LEEs), arrayed on a movable stage that is mounted on a MEMS array, wherein the array of LEEs form pixels, wherein the LEEs project light through the optical lens, wherein the pixels include red, green, blue, and at least one other color pixel, and wherein the array of LEEs is visible to different viewers located at different locations in space;
   a driver that controls movement of the stage such that the light passing through the lens changes with movement of the stage;
   a sensor that provides information to the driver about location and timing of the movable stage; and
   wherein the movable stage is constantly in motion during operation of the multiplexing package.

2. The optical multiplexing package of claim 1, wherein the at least one additional color is selected from the group consisting of cyan, amber, deep green, dark blue or royal blue, or a cool 10,000 kelvin white.

3. The optical multiplexing package of claim 1, wherein the movable stage is a linear comb-based device.

4. The optical multiplexing package of claim 1, wherein the movable stage moves linearly along two axes.

5. The optical multiplexing package of claim 1, wherein the movable stage moves in more than one axis.

6. The optical multiplexing system of claim 1, wherein an angular resolution of the package creates a data transmission system where a ray of light may only be sensed from a single location in a space and that by illuminating one pixel that is only visible by one sensor, a closed communication channel is created, wherein the communication channel is used for calibration of the package.

7. The optical multiplexing package of claim 1, wherein the optical multiplexing package has an expanded color gamut comprising OLEDs.

8. A substrate comprising multiple optical multiplexing packages controlled by a driver, wherein the optical multiplexing packages comprise:
   an optical lens;
   an array of light emitting elements (LEEs), arrayed on a movable stage that is mounted on a MEMS array, wherein the array of LEEs form pixels, wherein the LEDs project light through the optical lens, wherein the pixels include red, green, blue, and at least one other color pixel, and wherein the array of LEEs is visible to different viewers located at different locations in space;
   wherein the driver controls movement of the stage such that the light passing through the lens changes with movement of the stage, wherein the driver uses input from at least one sensor that provides information to the driver about location and timing of the movable stage and/or substrate; and
   wherein the movable stage is constantly in motion during operation of the multiplexing package.

9. The substrate of claim 8, wherein the at least one additional color is selected from the group consisting of cyan, amber, deep green, dark blue or royal blue, or a cool 10,000 kelvin white.

10. The substrate of claim 8, wherein the movable stage is a linear comb-based device.

11. The substrate of claim 8, wherein the movable stage moves linearly along two axes.

12. The substrate of claim 8, wherein the movable stage moves in more than one axis.

13. The substrate of claim 8, wherein an angular resolution of the package creates a data transmission system where a ray of light may only be sensed from a single location in a space and that by illuminating one pixel that is only visible by one sensor, a closed communication channel is created, wherein the communication channel is used for calibration of the package.

14. An array of optical multiplexing packages, wherein each of the optical multiplexing packages has an expanded color gamut comprising:
   an optical lens;
   an array of light emitting elements (LEEs), arrayed on a movable stage that is mounted on a MEMS array, wherein the array of LEEs form pixels, wherein the LEEs project light through the optical lens, wherein the pixels include red, green, blue, and at least one other color pixel, and wherein the array of LEEs is visible to different viewers located at different locations in space;
   a driver that controls movement of the stage such that the light passing through the lens changes with movement of the stage;
   a sensor that provides information to the driver about location and timing of the movable stage; and
   wherein the movable stage is constantly in motion during operation of the multiplexing package.

* * * * *